(12) United States Patent
Ogihara et al.

(10) Patent No.: US 11,480,879 B2
(45) Date of Patent: Oct. 25, 2022

(54) COMPOSITION FOR FORMING SILICON-CONTAINING RESIST UNDERLAYER FILM AND PATTERNING PROCESS

(71) Applicant: SHIN-ETSU CHEMICAL CO., LTD., Tokyo (JP)

(72) Inventors: Tsutomu Ogihara, Joetsu (JP); Tsukasa Watanabe, Joetsu (JP); Yusuke Biyajima, Joetsu (JP); Masahiro Kanayama, Joetsu (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 282 days.

(21) Appl. No.: 16/808,664

(22) Filed: Mar. 4, 2020

(65) Prior Publication Data

US 2020/0341377 A1 Oct. 29, 2020

(30) Foreign Application Priority Data

Apr. 26, 2019 (JP) ............... JP2019-86446

(51) Int. Cl.
*G03F 7/11* (2006.01)
*C09D 183/06* (2006.01)
*C09D 183/08* (2006.01)
*G03F 7/16* (2006.01)
*G03F 7/20* (2006.01)
(Continued)

(52) U.S. Cl.
CPC ............ *G03F 7/11* (2013.01); *C09D 183/06* (2013.01); *C09D 183/08* (2013.01); *G03F 7/168* (2013.01);
(Continued)

(58) Field of Classification Search
CPC ........ G03F 7/004; G03F 7/0757; G03F 7/094; G03F 7/2004; G03F 7/11; G03F 7/168;
(Continued)

(56) References Cited

U.S. PATENT DOCUMENTS 8,835,013 B2 * 9/2014 Matsushima ........ C08G 18/792
427/407.1
8,877,425 B2 * 11/2014 Kanno ................. C09D 183/06
430/311
(Continued)

FOREIGN PATENT DOCUMENTS

EP 3 686 256 A1 7/2020
JP 2007-302873 A 11/2007
(Continued)

OTHER PUBLICATIONS

Sep. 11, 2020 Extended European Search Report issued in European Patent Application No. 20166909.0.
(Continued)

*Primary Examiner* — Caleen O Sullivan
(74) *Attorney, Agent, or Firm* — Oliff PLC

(57) ABSTRACT

The present invention provides a resist underlayer film capable of improving LWR and CDU in a fine pattern formed by a chemically-amplified resist which uses an acid as a catalyst. A composition for forming a silicon-containing resist underlayer film, including a thermosetting silicon-containing material (Sx), a curing catalyst (Xc), and a solvent, in which a distance of diffusion of the curing catalyst (Xc) from a resist underlayer film formed from the composition for forming a silicon-containing resist underlayer film to a resist upper layer film to be formed on the resist underlayer film is 5 nm or less.

12 Claims, 1 Drawing Sheet

(51) Int. Cl.
  *G03F 7/38* (2006.01)
  *G03F 7/32* (2006.01)
  *H01L 21/027* (2006.01)
  *H01L 21/311* (2006.01)

(52) U.S. Cl.
  CPC ............ *G03F 7/2006* (2013.01); *G03F 7/322* (2013.01); *G03F 7/38* (2013.01); *H01L 21/0275* (2013.01); *H01L 21/31138* (2013.01); *H01L 21/31144* (2013.01)

(58) Field of Classification Search
  CPC .......... G03F 7/2006; G03F 7/322; G03F 7/38; G03F 7/09; G03F 7/0752; G03F 7/0755; G03F 1/56; G03F 1/76; H01L 21/0337; H01L 21/3065; H01L 21/3086; H01L 21/31116; H01L 21/32135; H01L 21/32139; H01L 21/0275; H01L 21/31138; H01L 21/31144; C09D 183/06; C09D 183/08
  USPC ................ 430/270.1, 271.1, 272.1; 438/700
  See application file for complete search history.

(56) References Cited

U.S. PATENT DOCUMENTS

| | | | |
|---|---|---|---|
| 9,023,588 B2 * | 5/2015 | Nakajima | ............ G03F 7/0751 430/313 |
| 2007/0238300 A1 | 10/2007 | Ogihara et al. | |
| 2009/0136869 A1 | 5/2009 | Ogihara et al. | |
| 2010/0291487 A1 | 11/2010 | Nakajima et al. | |
| 2012/0052685 A1 | 3/2012 | Ogihara et al. | |
| 2013/0210236 A1 | 8/2013 | Ogihara et al. | |
| 2013/0280912 A1 * | 10/2013 | Ogihara | ................ C07F 7/1804 438/694 |
| 2015/0079792 A1 | 3/2015 | Shigaki et al. | |
| 2015/0316849 A1 * | 11/2015 | Kanno | ...................... G03F 7/36 438/694 |
| 2020/0233303 A1 | 7/2020 | Ogihara et al. | |

FOREIGN PATENT DOCUMENTS

| | | |
|---|---|---|
| JP | 2009-126940 A | 6/2009 |
| JP | 2012-053253 A | 3/2012 |
| JP | 2013-167669 A | 8/2013 |
| JP | 2013-224279 A | 10/2013 |
| KR | 10-2013-0093549 A | 8/2013 |
| WO | 2013/161372 A1 | 10/2013 |

OTHER PUBLICATIONS

Jan. 21, 2022 Office Action issued in Korean Patent Application No. 10-2020-0050121.

May 17, 2022 Office Action issued in Korean Patent Application No. 10-2020-0050121.

\* cited by examiner

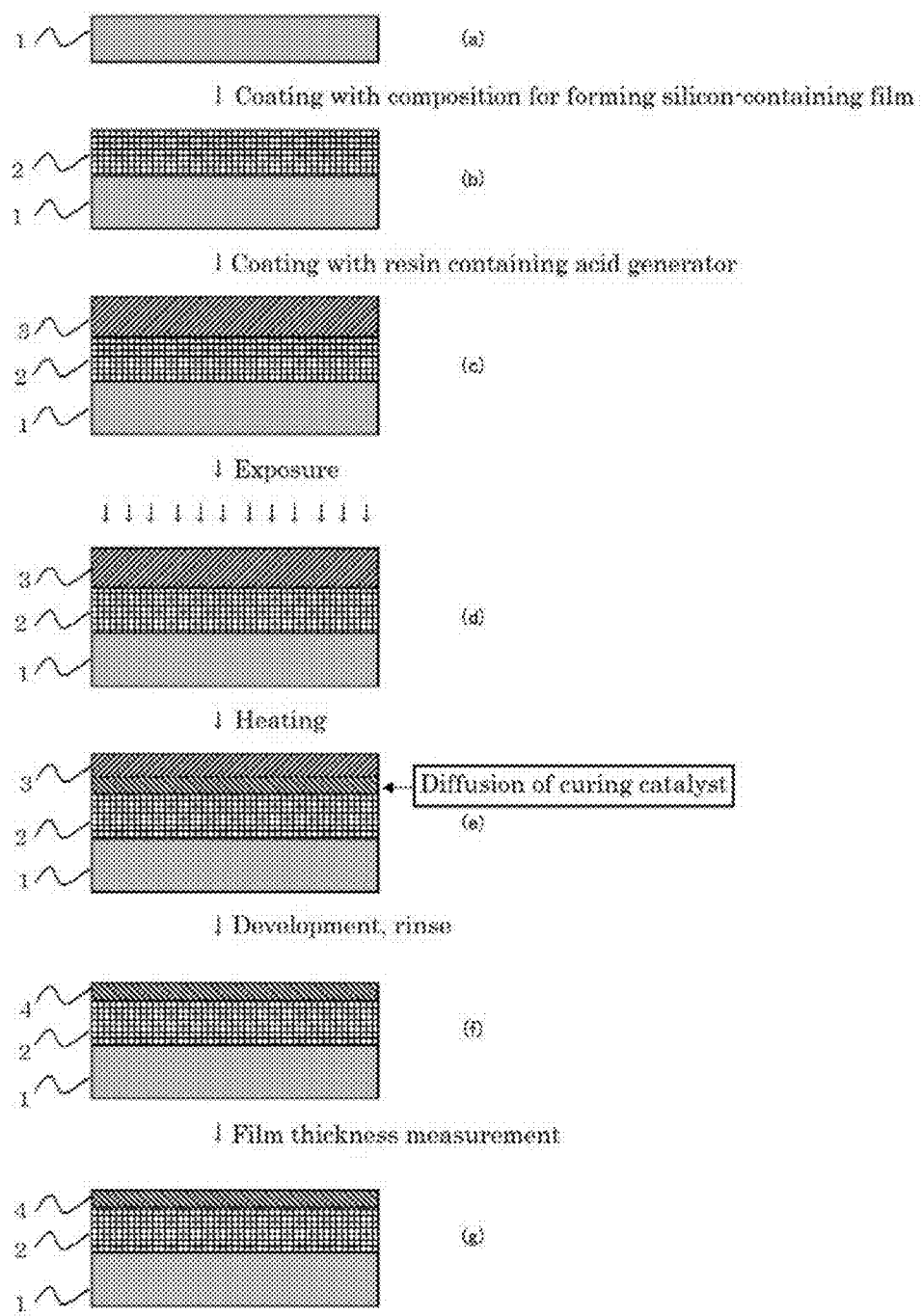

COMPOSITION FOR FORMING SILICON-CONTAINING RESIST UNDERLAYER FILM AND PATTERNING PROCESS

TECHNICAL FIELD

The present invention relates to a composition for forming a coating-type silicon-containing resist underlayer film used in lithography in processes of manufacturing semiconductor devices and the like, and a patterning process using this composition.

BACKGROUND ART

As Large-Scale Integrated circuits (LSIs) advance toward higher integration and higher processing speed, miniaturization of a pattern rule has been required. In such a trend, in photolithography using a chemically amplified resist which is now used as an ordinary technology, various technologies have been developed on how to process a finer pattern more precisely depending on the light source used.

On the one hand, as miniaturization advances, the diffraction phenomenon of light is approaching a physical limit, and accordingly, contrast of the exposure light applied to patterning has become lowered. This physical limit is causing the lowering of dissolution contrast in a positive-type resist film, which causes degradation in focus margin and the resolution of a hole pattern or a trench pattern. As a technology for preventing the degradation of patterning performance in such a limit state, it is necessary to raise the dissolution contrast of the resist film. With a chemically amplified resist, as a method for raising the dissolution contrast, an attempt is being made to increase the sensitivity by using the growth mechanism of the acid generated from a photo-acid generator to minimize the influence of the contrast of the exposure light being lowered.

One the other hand, the influence of this acid growth mechanism causes degradation of edge roughness (LWR) and hole pattern critical dimension uniformity (CDU). This can be considered to be the influence of localization and agglomeration of a base polymer and an acid generator, but the influence of the diffusion of the grown acid cannot be ignored. Further, in order to prevent pattern collapse in a fine pattern, thinning of the resist film is progressing, but on the other hand, LWR and CDU tend to degrade as the resist film is thinned. Thus, with the progress of the miniaturization of a resist pattern, the combination of the acid growth for improving contrast and the thinning for preventing a pattern collapse is causing degradation of LWR and CDU, which has become a serious problem.

With a resist pattern in which such a thinning has progressed, a problem occurs that dry etching selectivity for transferring the pattern to the substrate cannot be ensured. Accordingly, a pattern-transferring process using a multi-layer resist method in which a silicon-containing film is used as a resist underlayer film is generally applied. In ArF lithography, formation from a composition for forming a silicon-containing resist underlayer film containing a curing catalyst is known (Patent Document 1). The application of a curing catalyst to a composition for forming a silicon-containing resist underlayer film in EUV lithography is also being suggested (Patent Document 2). This curing catalyst has a suitable structure for the formation of a siloxane bond through condensation of silanol, and has a structure similar to that of a sensitivity modifier in an upper layer resist. Therefore, when the curing catalyst is diffused to the upper layer resist at the time of exposure or after the exposure, pattern formability in the interface between the resist upper layer film and the silicon-containing underlayer film, in particular, the properties of LWR and CDU are affected, and improvement in the performance of the resist underlayer film is required.

CITATION LIST

Patent Literature

Patent Document 1: JP 2007-302873 A
Patent Document 2: WO 2013/161372 A1

SUMMARY OF INVENTION

Technical Problem

An object of the present invention is to provide a resist underlayer film capable of improving LWR and CDU in a fine pattern formed from a chemically-amplified resist which uses an acid as a catalyst.

Solution to Problem

To achieve the object, the present invention provides a composition for forming a silicon-containing resist underlayer film, including
a thermosetting silicon-containing material (Sx), a curing catalyst (Xc), and a solvent, wherein
a distance of diffusion of the curing catalyst (Xc) from a resist underlayer film formed from the composition for forming a silicon-containing resist underlayer film to a resist upper layer film to be formed on the resist underlayer film is 5 nm or less.

As described below, the curing catalyst (Xc) diffused from the silicon-containing resist underlayer film to the resist upper layer film neutralizes an acid which is to be generated on exposure, in the upper layer resist. Therefore, leaving from the acid-leaving group in the resist upper layer film is inhibited, and a resin that constitutes the resist upper layer film and does not dissolve in a developer remains in the interface between the resist upper layer film and the silicon-containing resist underlayer film, which is the cause of the degradation of LWR and CDU of a resist pattern. The composition for forming a silicon-containing resist underlayer film according to the present invention has a distance of diffusion of the curing catalyst (Xc) of 5 nm or less, and therefore, can form a silicon-containing resist underlayer film where the intrinsic performance of the resist upper layer film can be exhibited without causing such degradation of LWR and CDU.

The curing catalyst (Xc) is preferably a sulfonium salt (Xc-1), an iodonium salt (Xc-2), a phosphonium salt (Xc-3), an ammonium salt (Xc-4), a polysiloxane (Xc-10) having a structure containing one of these salts as a part, or an alkaline metal salt.

When the curing catalyst (Xc) is the specific kind described above, this composition for forming a silicon-containing resist underlayer film can form a silicon-containing resist underlayer film which allows the intrinsic performance of the resist upper layer film to be exhibited further.

A total number of carbon atoms included in an organic group forming a cation moiety of the curing catalyst (Xc) is preferably 9 or more.

When the cation moiety of the curing catalyst (Xc) is as described above, this composition for forming a silicon-containing resist underlayer film can form a silicon-containing resist underlayer film which allows the intrinsic performance of the resist upper layer film to be exhibited further.

Moreover, the present invention provides a patterning process including the steps of:

forming an organic film by using a coating-type organic film material on a body to be processed;

forming a resist underlayer film on the organic film by using the composition for forming a silicon-containing resist underlayer film;

forming a resist upper layer film on the resist underlayer film by using a composition for a resist upper layer film including a photoresist composition;

forming a circuit pattern on the resist upper layer film;

transferring the pattern to the resist underlayer film by etching using the resist upper layer film having the formed circuit pattern as a mask;

transferring the pattern to the organic film by etching using the resist underlayer film having the transferred pattern as a mask; and transferring the pattern to the body to be processed by etching using the organic film having the transferred pattern as a mask.

Further, the present invention provides a patterning process including the steps of:

forming a hard mask comprising carbon as a main component by a CVD method on a body to be processed;

forming a resist underlayer film on the hard mask by using the composition for forming a silicon-containing resist underlayer film;

forming a resist upper layer film on the resist underlayer film by using a composition for a resist upper layer film including a photoresist composition;

forming a circuit pattern on the resist upper layer film;

transferring the pattern to the resist underlayer film by etching using the resist upper layer film having the formed circuit pattern as a mask;

transferring the pattern to the hard mask by dry etching using the resist underlayer film having the transferred pattern as a mask; and transferring the pattern to the body to be processed by dry etching using the hard mask having the transferred pattern as a mask.

With these patterning processes, solubility of the resist upper layer film near the interface between the resist upper layer film and the silicon-containing resist underlayer film can be improved, residue of the resin which constitutes the resist upper layer film remaining near the interface can be dissolved, and a pattern in which LWR and CDU of the resist pattern are improved can be formed.

The formation of the pattern on the resist upper layer film is preferably performed by a photolithography with a wavelength of 10 nm or more and 300 nm or less, direct lithography with electron beam, nanoimprinting, or a combination thereof.

When the formation of the pattern on the resist upper layer film is the specific kind described above, the effects of the present invention are more sufficiently exhibited.

The body to be processed is preferably a substrate for a semiconductor device, a metal film, a metal carbide film, a metal oxide film, a metal nitride film, a metal oxycarbide film, or a metal oxynitride film.

When the body to be processed is the specific kind described above, the effects of the present invention are more sufficiently exhibited.

A metal of the body to be processed is preferably silicon, gallium, titanium, tungsten, hafnium, zirconium, chromium, germanium, copper, silver, gold, indium, arsenic, palladium, tantalum, iridium, aluminum, iron, molybdenum, cobalt, or an alloy thereof.

When a metal of the body to be processed is the specific metal described above, the effects of the present invention are more sufficiently exhibited.

Advantageous Effects of Invention

The composition for forming a silicon-containing resist underlayer film according to the present invention including a curing catalyst (Xc) whose distance of diffusion from a resist underlayer film to a resist upper layer film is 5 nm or less not only can form an upper layer resist pattern with favorable LWR and CDU, but can also provide an excellent selectivity in dry etching with the resist upper layer film and an organic film or a hard mask, and therefore, can form a pattern for a semiconductor device on a substrate with a good yield. Moreover, the composition for forming a silicon-containing resist underlayer film according to the present invention can provide high etching selectivity relative to an organic material, so that a formed photoresist pattern can be successively transferred from the silicon-containing resist underlayer film to an organic film or a hard mask by dry etching process. Particularly, in the semiconductor-device manufacturing process in recent years which is progressing toward miniaturization, multiple exposure process is frequently used, and LWR and CDU in a pattern after development has a great influence on device performance. Therefore, improvement of LWR and CDU properties is important. Moreover, since the composition for forming a silicon-containing resist underlayer film according to the present invention has a favorable dry etching selectivity ratio, deformation of a resist upper layer film pattern during dry etching can be suppressed and the pattern can be transferred to the substrate with high precision while maintaining excellent LWR and CDU is possible, even when the silicon-containing resist underlayer film is used as a dry-etching mask.

BRIEF DESCRIPTION OF DRAWINGS

FIG. 1 is a schematic diagram showing an example of a method for measuring the distance of diffusion of the curing catalyst (Xc) in the present invention.

DESCRIPTION OF EMBODIMENTS

As described above, development of a resist underlayer film capable of improving LWR and CDU in a fine pattern formed by a chemically-amplified resist which uses an acid as a catalyst has been required.

The present inventors have earnestly studied the above problem, measured the distance of diffusion of a curing catalyst (Xc) in a silicon-containing resist underlayer film to a resist upper layer film conveniently without using an expensive EUV exposure apparatus, and found a curing catalyst (Xc) which does not influence LWR and CDU in EUV lithography, and completed a composition for forming a silicon-containing underlayer film to which this is applied.

That is, the present invention is a composition for forming a silicon-containing resist underlayer film, including a thermosetting silicon-containing material (Sx), a curing catalyst (Xc), and a solvent, wherein a distance of diffusion of the curing catalyst (Xc) from a resist underlayer film formed from the composition for forming a silicon-containing resist underlayer film to a resist upper layer film to be formed on the resist underlayer film is 5 nm or less.

Hereinafter, the present invention will be described in detail, but the present invention is not limited thereto.

[Thermosetting Silicon-Containing Material (Sx)]

The thermosetting silicon-containing material (Sx) in the present invention may be a thermosetting polysiloxane containing one or more of a repeating unit represented by the following general formula (Sx-1), a repeating unit represented by the following general formula (Sx-2), and a partial structure represented by the following general formula (Sx-3):

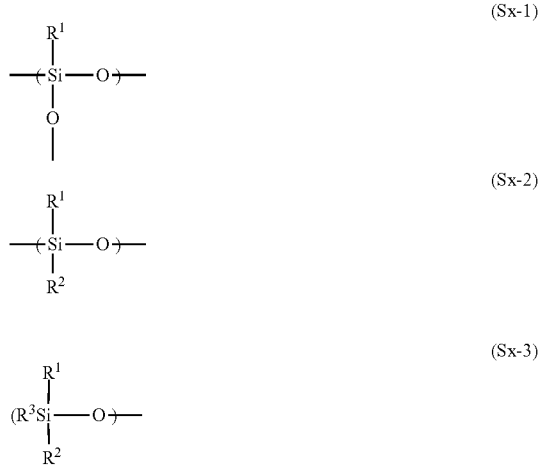

wherein, in the formulae, $R^1$, $R^2$, and $R^3$ are each a monovalent organic group, which may be identical to or different from each other, having 1 to 30 carbon atoms.

The thermosetting silicon-containing material (Sx) can be produced by hydrolysis condensation of the following hydrolysable monomer (Sm).

Specifically, examples of the hydrolysable monomer (Sm) include tetramethoxysilane, tetraethoxysilane, tetrapropoxysilane, tetraisopropoxysilane, trimethoxysilane, triethoxysilane, tripropoxysilane, triisopropoxysilane, methyltrimethoxysilane, methyltriethoxysilane, methyltripropoxysilane, methyltriisopropoxysilane, ethyltrimethoxysilane, ethyltriethoxysilane, ethyltripropoxysilane, ethyltriisopropoxysilane, vinyltrimethoxysilane, vinyltriethoxysilane, vinyltripropoxysilane, vinyltriisopropoxysilane, propyltrimethoxysilane, propyltriethoxysilane, propyltripropoxysilane, propyltriisopropoxysilane, isopropyltrimethoxysilane, isopropyltriethoxysilane, isopropyltripropoxysilane, isopropyltriisopropoxysilane, butyltrimethoxysilane, butyltriethoxysilane, butyltripropoxysilane, butyltriisopropoxysilane, sec-butyltrimethoxysilane, sec-butyltriethoxysilane, sec-butyltripropoxysilane, sec-butyltriisopropoxysilane, t-butyltrimethoxysilane, t-butyltriethoxysilane, t-butyltripropoxysilane, t-butyltriisopropoxysilane, cyclopropyltrimethoxysilane, cyclopropyltriethoxysilane, cyclopropyltripropoxysilane, cyclopropyltriisopropoxysilane, cyclobutyltrimethoxysilane, cyclobutyltriethoxysilane, cyclobutyltripropoxysilane, cyclobutyltriisopropoxysilane, cyclopentyltrimethoxysilane, cyclopentyltriethoxysilane, cyclopentyltripropoxysilane, cyclopentyltriisopropoxysilane, cyclohexyltrimethoxysilane, cyclohexyltriethoxysilane, cyclohexyltripropoxysilane, cyclohexyltriisopropoxysilane, cyclohexenyltrimethoxysilane, cyclohexenyltriethoxysilane, cyclohexenyltripropoxysilane, cyclohexenyltriisopropoxysilane, cyclohexenylethyltrimethoxysilane, cyclohexenylethyltriethoxysilane, cyclohexenylethyltripropoxysilane, cyclohexenylethyltriisopropoxysilane, cyclooctyltrimethoxysilane, cyclooctyltriethoxysilane, cyclooctyltripropoxysilane, cyclooctyltriisopropoxysilane, cyclopentadienylpropyltrimethoxysilane, cyclopentadienylpropyltriethoxysilane, cyclopentadienylpropyltripropoxysilane, cyclopentadienylpropyltriisopropoxysilane, bicycloheptenyltrimethoxysilane, bicycloheptenyltriethoxysilane, bicycloheptenyltripropoxysilane, bicycloheptenyltriisopropoxysilane, bicycloheptyltrimethoxysilane, bicycloheptyltriethoxysilane, bicycloheptyltripropoxysilane, bicycloheptyltriisopropoxysilane, adamantyltrimethoxysilane, adamantyltriethoxysilane, adamantyltripropoxysilane, adamantyltriisopropoxysilane, phenyltrimethoxysilane, phenyltriethoxysilane, phenyltripropoxysilane, phenyltriisopropoxysilane, benzyltrimethoxysilane, benzyltriethoxysilane, benzyltripropoxysilane, benzyltriisopropoxysilane, anisyltrimethoxysilane, anisyltriethoxysilane, anisyltripropoxysilane, anisyltriisopropoxysilane, tolyltrimethoxysilane, tolyltriethoxysilane, tolyltripropoxysilane, tolyltriisopropoxysilane, phenethyltrimethoxysilane, phenethyltriethoxysilane, phenethyltripropoxysilane, phenethyltriisopropoxysilane, naphthyltrimethoxysilane, naphthyltriethoxysilane, naphthyltripropoxysilane, naphthyltriisopropoxysilane, dimethyldimethoxysilane, dimethyldiethoxysilane, methylethyldimethoxysilane, methylethyldiethoxysilane, dimethyldipropoxysilane, dimethyldiisopropoxysilane, diethyldimethoxysilane, diethyldiethoxysilane, diethyldipropoxysilane, diethyldiisopropoxysilane, dipropyldimethoxysilane, dipropyldiethoxysilane, dipropyldipropoxysilane, dipropyldiisopropoxysilane, diisopropyldimethoxysilane, diisopropyldiethoxysilane, diisopropyldipropoxysilane, diisopropyldiisopropoxysilane, dibutyldimethoxysilane, dibutyldiethoxysilane, dibutyldipropoxysilane, dibutyldiisopropoxysilane, di-sec-butyldimethoxysilane, di-sec-butyldiethoxysilane, di-sec-butyldipropoxysilane, di-sec-butyldiisopropoxysilane, di-t-butyldimethoxysilane, di-t-butyldiethoxysilane, di-t-butyldipropoxysilane, di-t-butyldiisopropoxysilane, dicyclopropyldimethoxysilane, dicyclopropyldiethoxysilane, dicyclopropyldipropoxysilane, dicyclopropyldiisopropoxysilane, dicyclobutyldimethoxysilane, dicyclobutyldiethoxysilane, dicyclobutyldipropoxysilane, dicyclobutyldiisopropoxysilane, dicyclopentyldimethoxysilane, dicyclopentyldiethoxysilane, dicyclopentyldipropoxysilane, dicyclopentyldiisopropoxysilane, dicyclohexyldimethoxysilane, dicyclohexyldiethoxysilane, dicyclohexyldipropoxysilane, dicyclohexyldiisopropoxysilane, dicyclohexenyldimethoxysilane, dicyclohexenyldiethoxysilane, dicyclohexenyldipropoxysilane, dicyclohexenyldiisopropoxysilane, dicyclohexenylethyldimethoxysilane, dicyclohexenylethyldiethoxysilane, dicyclohexenylethyldipropoxysilane, dicyclohexenylethyldiisopropoxysilane, dicyclooctyldimethoxysilane, dicyclooctyldiethoxysilane, dicyclooctyldipropoxysilane, dicyclooctyldiisopropoxysilane, dicyclopentadienylpropyldimethoxysilane, dicyclopentadienylpropyldiethoxysilane, dicyclopentadienylpropyldipropoxysilane, dicyclopentadienylpropyldiisopropoxysilane, bis(bicycloheptenyl)dimethoxysilane, bis(bicycloheptenyl)diethoxysilane, bis(bicycloheptenyl)dipropoxysilane, bis(bicycloheptenyl)diisopropoxysilane, bis(bicycloheptyl)dimethoxysilane, bis(bicycloheptyl)diethoxysilane, bis(bicycloheptyl)dipropoxysilane, bis(bicycloheptyl)diisopropoxysilane, diadamantyldimethoxysilane, diadamantyldiethoxysilane, diadamantyldipropoxysilane, diadamantyldiisopropoxysilane, diphenyldimethoxysilane, diphenyldiethoxysilane, methylphenyldimethoxysilane, methylphenyldiethoxysilane, diphenyldipropoxysilane, diphenyldiisopropoxysilane, trimethylmethoxysilane, trimethylethoxysilane, dimethylethylmethoxysilane, dimethylethylethoxysilane, dimethylphenylmethoxysilane, dimethylphenylethoxysilane, dimethylbenzylmethoxysilane, dimethylbenzylethoxysilane, dimethylphenethylmethoxysilane, dimethylphenethylethoxysilane, and the like.

Preferable examples of the compound include tetramethoxysilane, tetraethoxysilane, methyltrimethoxysilane, methyltriethoxysilane, ethyltrimethoxysilane, ethyltriethoxysilane, vinyltrimethoxysilane, vinyltriethoxysilane, propyltrimethoxysilane, propyltriethoxysilane, isopropyltrimethoxysilane, isopropyltriethoxysilane, butyltrimethoxysilane, butyltriethoxysilane, isobutyltrimethoxysilane, isobutyltriethoxysilane, allyltrimethoxysilane, allyltriethoxysilane, cyclopentyltrimethoxysilane, cyclopentyltriethoxysilane, cyclohexyltrimethoxysilane, cyclohexyltriethoxysilane, cyclohexenyltrimethoxysilane, cyclohexenyltriethoxysilane, phenyltrimethoxysilane, phenyltriethoxysilane, benzyltrimethoxysilane, benzyltriethoxysilane, phenethyltrimethoxysilane, phenethyltriethoxysilane, dimethyldimethoxysilane, dimethyldiethoxysilane, diethyldimethoxysilane, diethyldiethoxysilane, methylethyldimethoxysilane, methylethyldiethoxysilane, dipropyldimethoxysilane, dibutyldimethoxysilane, methylphenyldimethoxysilane, methylphenyldiethoxysilane, trimethylmethoxysilane, dimethylethylmethoxysilane, dimethylphenylmethoxysilane, dimethylbenzylmethoxysilane, dimethylphenethylmethoxysilane, and the like.

Other examples of the organic group represented by $R^1$, $R^2$, and $R^3$ include organic groups having one or more carbon-oxygen single bonds or carbon-oxygen double bonds, specifically organic groups having one or more groups selected from the group consisting of an ether bond, an ester bond, alkoxy group, and a hydroxy group and the like. Examples of the organic groups include ones represented by the following general formula (Sm-R).

$$(P-Q_1-(S_1)_{v1}-Q_2-)_u-(T)_{v2}-Q_3-(S_2)_{v3}-Q_4-\quad\text{(Sm-R)}$$

In the general formula (Sm-R), P represents a hydrogen atom, a cyclic ether group, a hydroxyl group, an alkoxy group having 1 to 4 carbon atoms, an alkylcarbonyloxy group having 1 to 6 carbon atoms, or an alkylcarbonyl group having 1 to 6 carbon atoms; $Q_1$, $Q_2$, $Q_3$, and $Q_4$ each independently represent $-C_qH_{(2q-p)}P_p-$, where P is as defined above, "p" represents an integer of 0 to 3, and "q" represents an integer of 0 to 10, provided that q=0 means a single bond; "u" represents an integer of 0 to 3; $S_1$ and $S_2$ each independently represent $-O-$, $-CO-$, $-OCO-$, $-COO-$, or $-OCOO-$. v1, v2, and v3 each independently represent 0 or 1. In addition to these, T represents a divalent atom other than carbon, or a divalent group of an alicyclic, aromatic, or heterocyclic ring. As T, examples of the alicyclic, aromatic, or heterocyclic ring optionally containing a hetero atom such as an oxygen atom are shown below. In T, positions bonded to $Q_2$ and $Q_3$ are not particularly limited, and can be selected appropriately in consideration of reactivity dependent on steric factors, availability of commercial reagents used in the reaction, and so on.

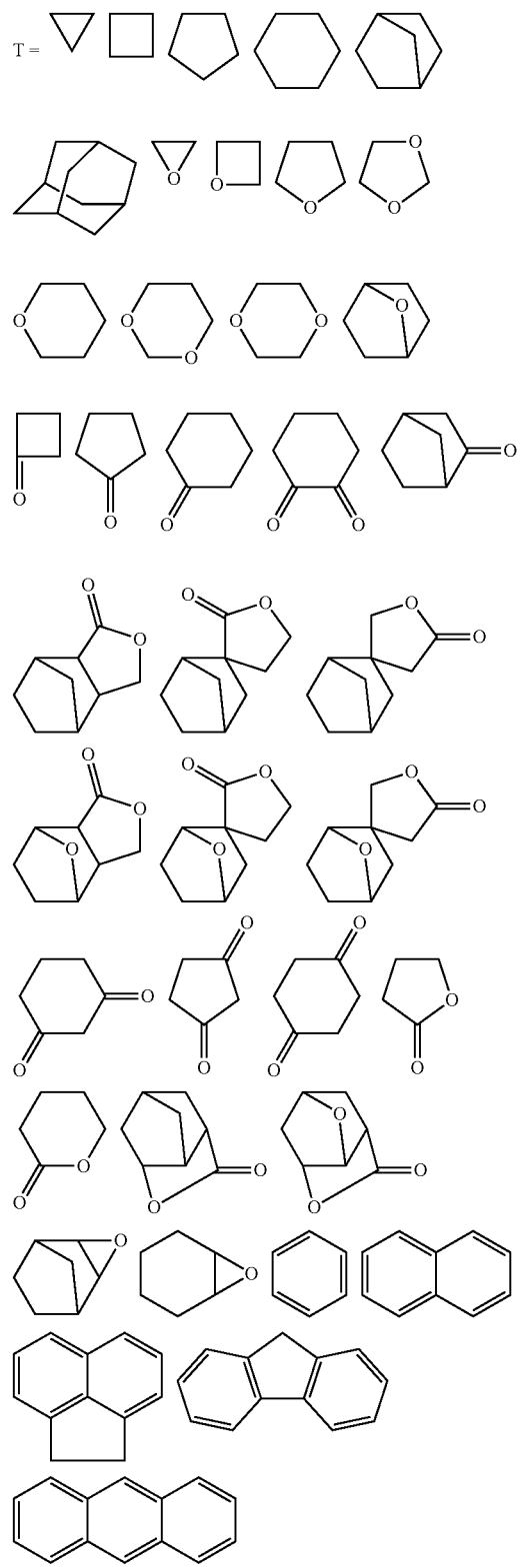

Preferable examples of the organic groups having one or more carbon-oxygen single bonds or carbon-oxygen double bonds in the general formula (Sm-R) include the followings. Should be noted that, in the following formulae, (Si) is depicted to show a bonding site to Si.

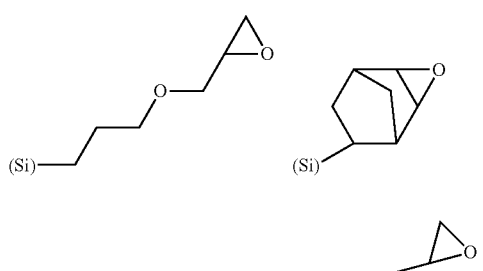
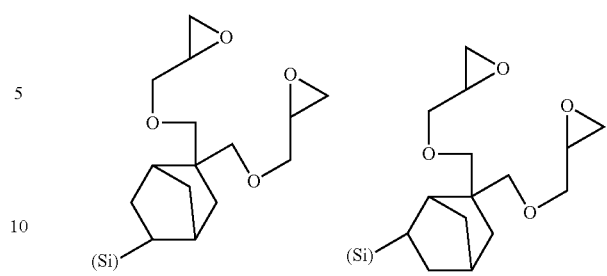
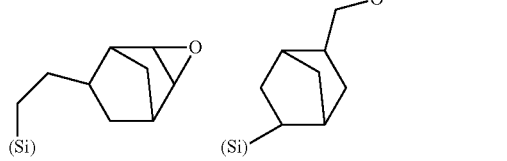
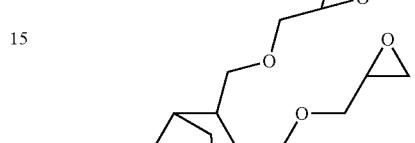
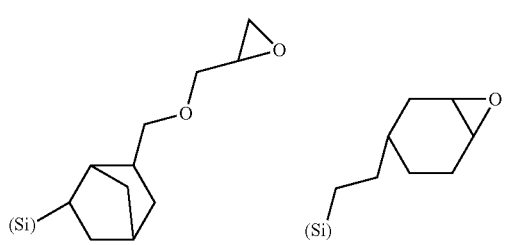
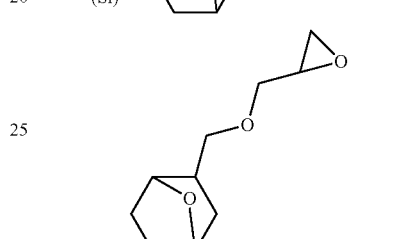
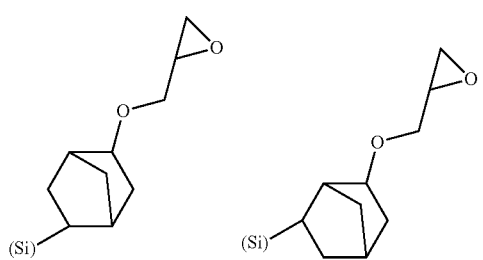
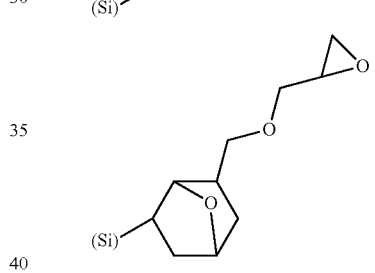
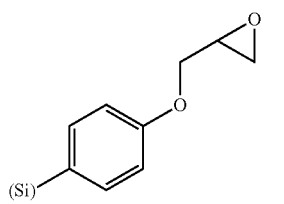
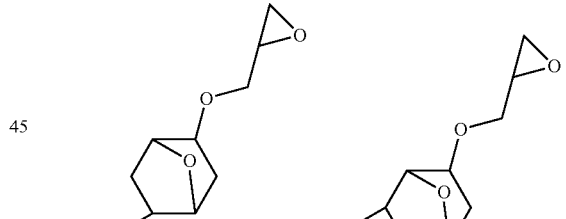
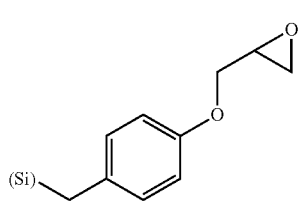
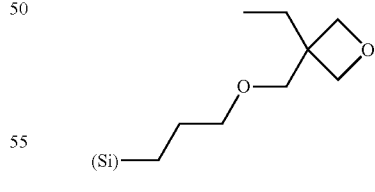
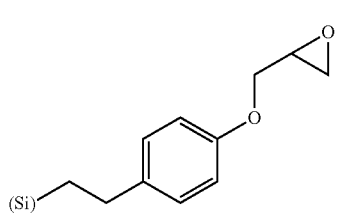
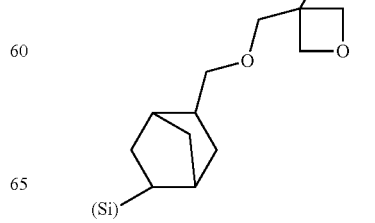

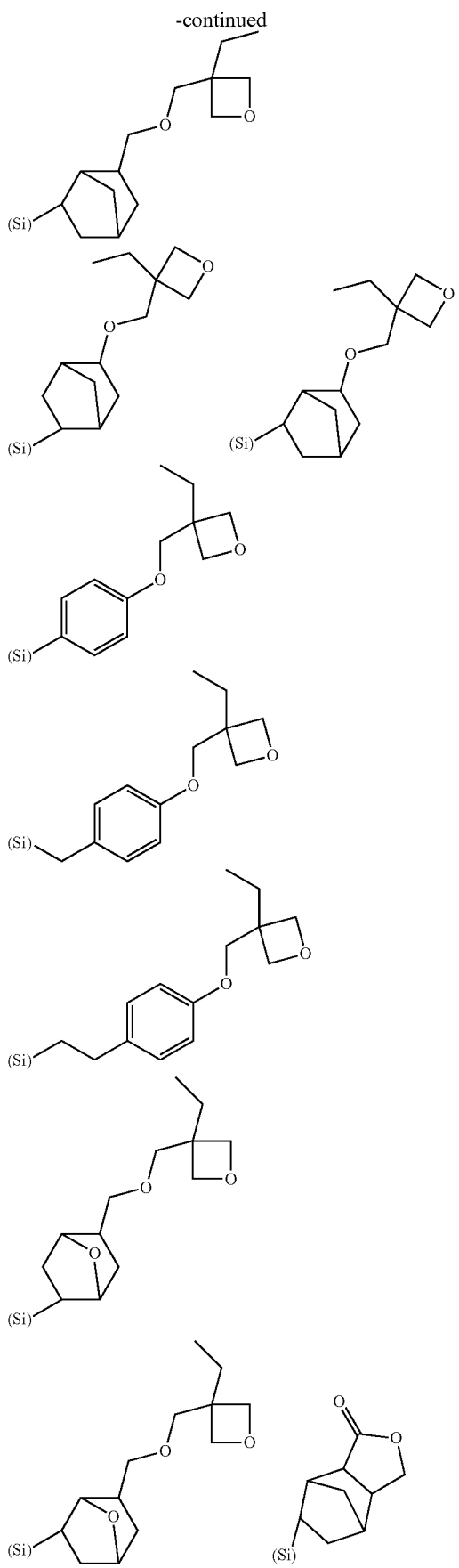
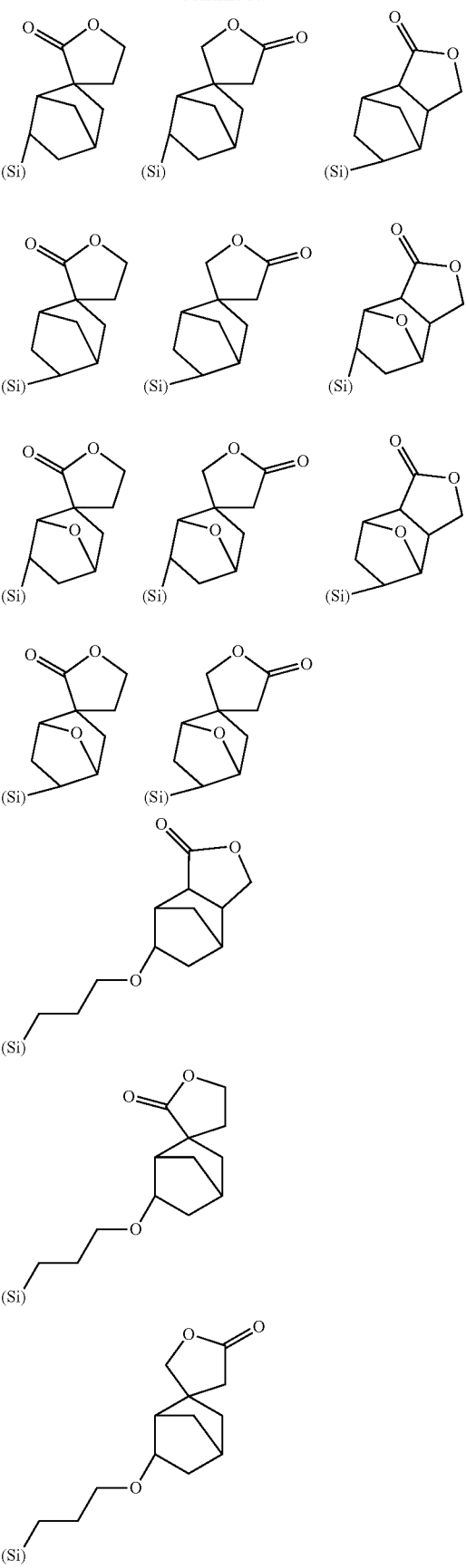

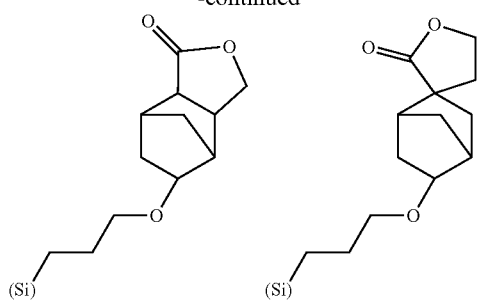
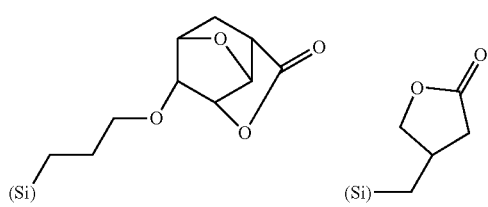
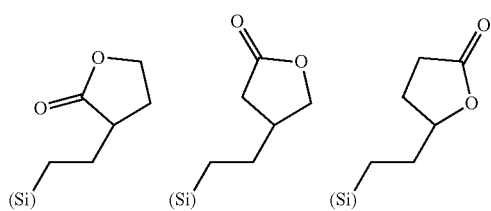
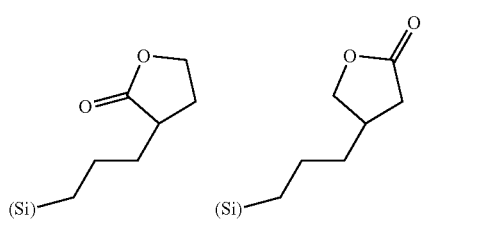
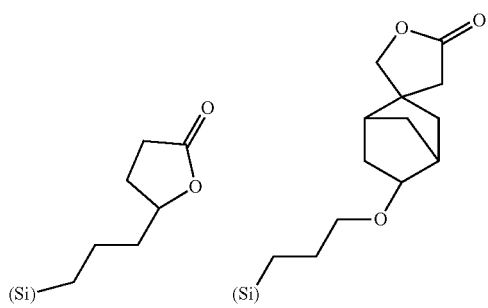
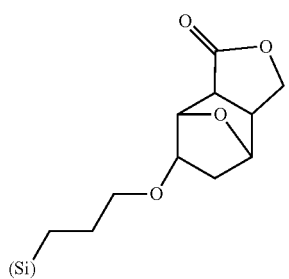
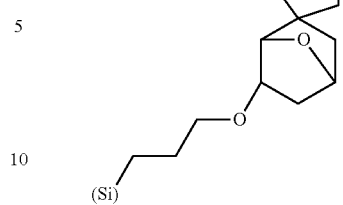
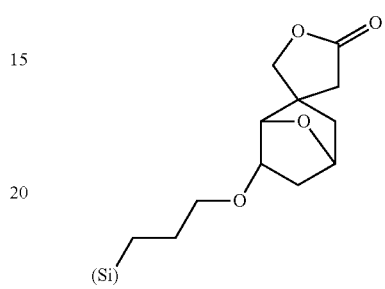
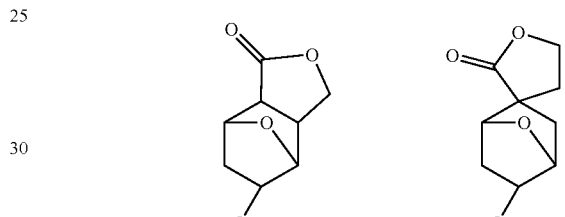
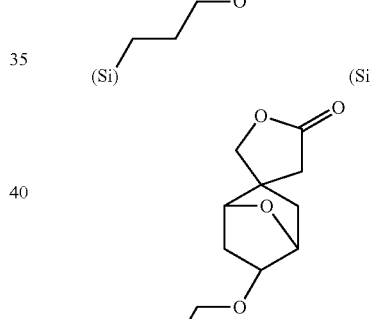
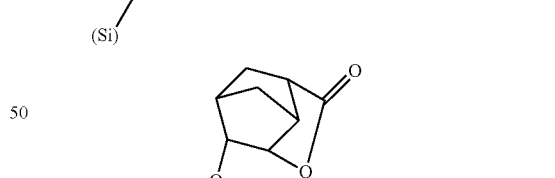
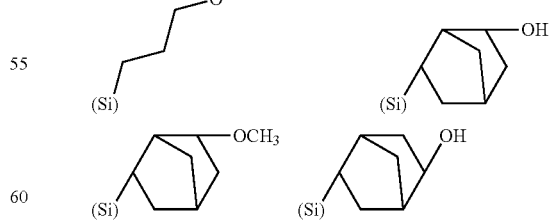
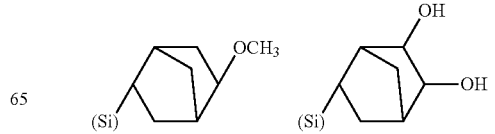

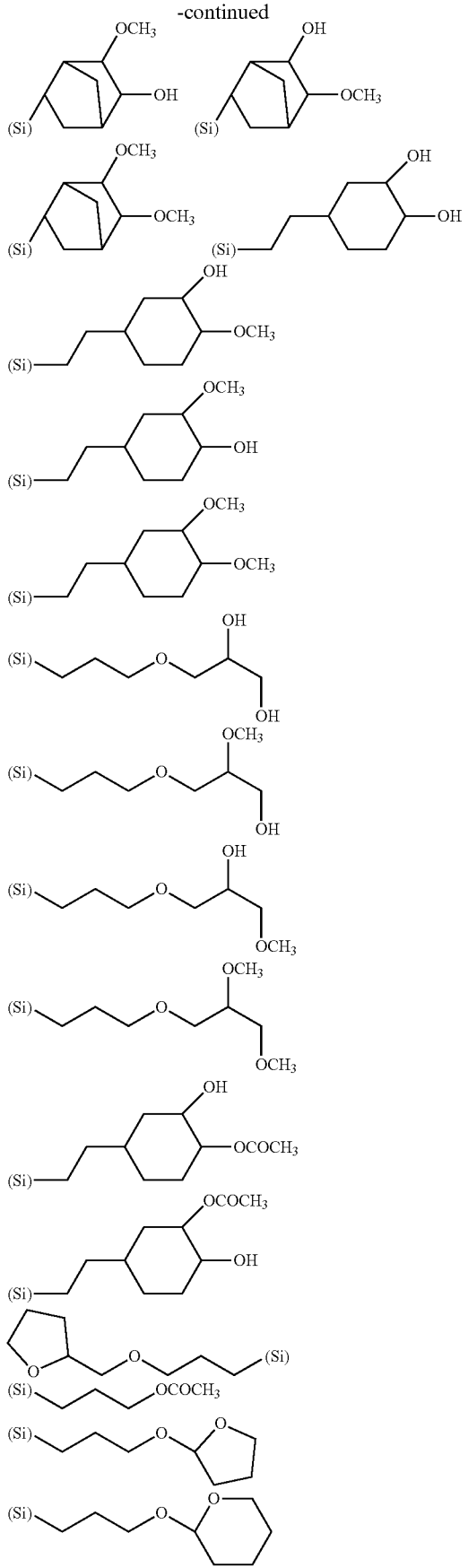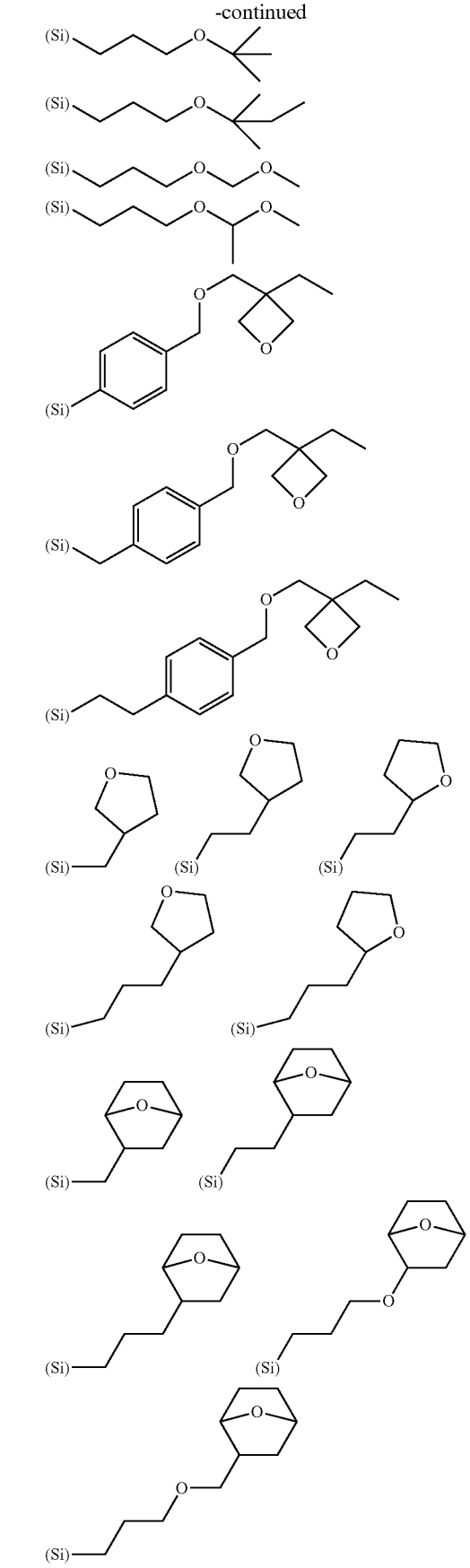

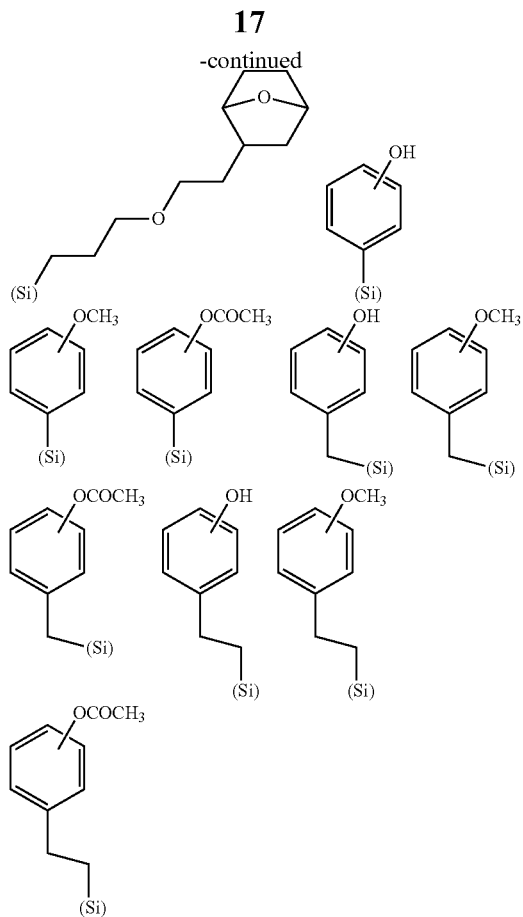

Moreover, as an example of the organic group of $R^1$, $R^2$, and $R^3$, an organic group containing a silicon-silicon bond can also be used. Specific examples thereof include the followings.

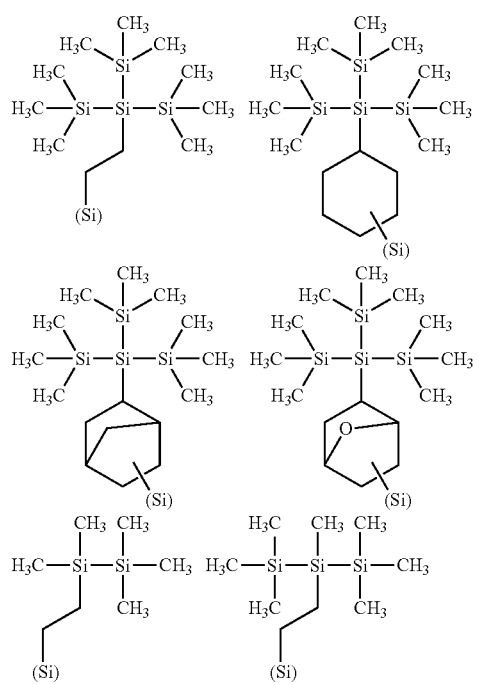

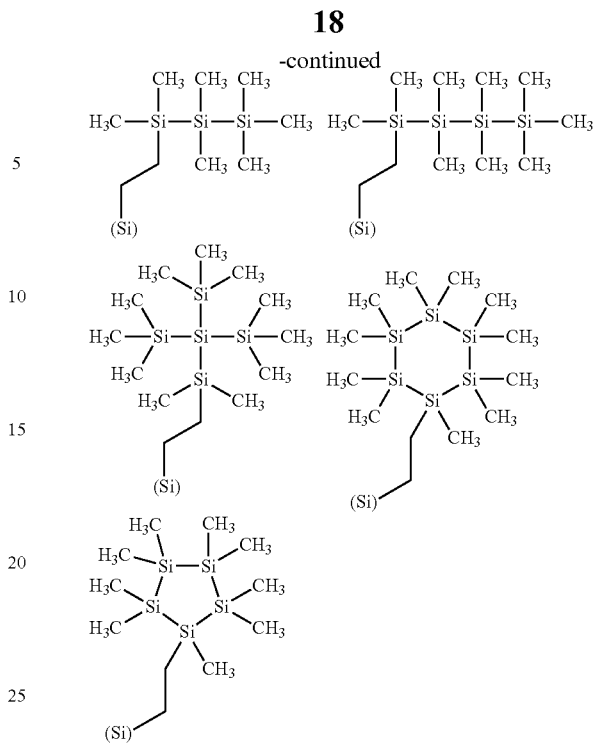

Moreover, as an example of the organic group of $R^1$, $R^2$, and $R^3$, an organic group having a protective group that is decomposed with an acid can also be used. Specific examples thereof include organic groups shown from paragraphs (0043) to (0048) of JP 2013-167669 A, and organic groups obtained from silicon compounds shown in paragraph (0056) of JP 2013-224279 A.

Further, as an example of the organic group of $R^1$, $R^2$, and $R^3$, an organic group having a fluorine atom can also be used. Specific examples thereof include organic groups obtained from silicon compounds shown from paragraphs (0059) to (0065) of JP 2012-53253 A. Furthermore, as an example of the organic group of $R^1$, $R^2$, and $R^3$, an organic group having a nitrogen atom or a sulfur atom can also be used.

The hydrolysable monomer (Sm) has, on a silicon atom shown as (Si) in each of the partial structures, as a hydrolysable group, one, two, or three of chlorine, bromine, iodine, an acetoxy group, a methoxy group, an ethoxy group, a propoxy group, or a butoxy group and the like bonded.

[Synthesizing Method 1 of Thermosetting Silicon-Containing Material (Sx): Acid Catalyst]

The thermosetting silicon-containing material (Sx) in the present invention can be produced by hydrolysis condensation of the hydrolysable monomer (Sm) or a mixture of one or more of the hydrolysable monomers (Sm) in the presence of an acid catalyst.

Examples of the acid catalyst used in this event include organic acids such as formic acid, acetic acid, oxalic acid, and maleic acid; and hydrofluoric acid, hydrochloric acid, hydrobromic acid, sulfuric acid, nitric acid, perchloric acid, phosphoric acid, methanesulfonic acid, benzenesulfonic acid, and toluenesulfonic acid, and the like. The catalyst can be used in an amount of $1 \times 10^{-6}$ to 10 mol, preferably, and more preferably, $1 \times 10^{-5}$ to 5 mol, and further preferably, $1 \times 10^{-4}$ to 1 mol, relative to 1 mol of the hydrolysable monomer (Sm).

When the thermosetting silicon-containing material (Sx) is obtained from these monomers by the hydrolysis condensation, water is preferably added in an amount of 0.01 to 100 mol, more preferably 0.05 to 50 mol, and further preferably 0.1 to 30 mol, per mol of the hydrolysable substituent bonded to the hydrolysable monomer (Sm). When the amount of the water is 100 mol or less, a device for the reaction can be made small and economical.

As the operation method, the hydrolysable monomer (Sm) is added to an aqueous catalyst solution to initiate the hydrolysis condensation reaction. In this event, an organic solvent may be added to the aqueous catalyst solution, or the hydrolysable monomer (Sm) may be diluted with an organic solvent, or both of these operations may be performed. The reaction temperature is preferably 0 to 100° C., and more preferably 5 to 80° C. As a preferable method, when the monomer is added dropwise, the temperature is maintained at 5 to 80° C., and then the mixture is aged at 20 to 80° C.

The organic solvent which can be added to the aqueous catalyst solution or with which the hydrolysable monomer (Sm) can be diluted is preferably methanol, ethanol, 1-propanol, 2-propanol, 1-butanol, 2-butanol, 2-methyl-1-propanol, acetone, acetonitrile, tetrahydrofuran, toluene, hexane, ethyl acetate, methyl ethyl ketone, methyl isobutyl ketone, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, t-butyl propionate, propylene glycol mono-t-butyl ether acetate, γ-butyrolactone, mixtures thereof, and the like.

Among these solvents, water-soluble solvents are preferable. Examples thereof include alcohols such as methanol, ethanol, 1-propanol, and 2-propanol; polyhydric alcohols such as ethylene glycol and propylene glycol; polyhydric alcohol condensate derivatives such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, and ethylene glycol monopropyl ether; acetone, acetonitrile, tetrahydrofuran, and the like. Among these, particularly preferable is one having a boiling point of 100° C. or less.

Should be noted that the organic solvent is used in an amount of preferably 0 to 1,000 ml, and more preferably 0 to 500 ml, relative to 1 mol of the hydrolysable monomer (Sm). When the amount of organic solvent used is the above-described upper limit or less, only a small reaction vessel is required, which is economical.

Then, if necessary, neutralization reaction of the catalyst is carried out to obtain an aqueous solution of a reaction mixture. In this event, the amount of an alkaline substance usable for the neutralization is preferably 0.1 to 2 equivalents relative to the acid used as the catalyst. This alkaline substance may be any substance as long as it exhibits alkalinity in water.

Subsequently, by-products such as alcohol produced by the hydrolysis condensation reaction are preferably removed from the reaction mixture by a procedure such as removal under reduced pressure. In this event, the reaction mixture is heated at a temperature of preferably 0 to 100° C., more preferably 10 to 90° C., further preferably 15 to 80° C., although the temperature depends on the kinds of the added organic solvent, the alcohol produced in the reaction, and so forth. Additionally, in this event, the degree of vacuum is preferably atmospheric pressure or less, more preferably 80 kPa or less in absolute pressure, further preferably 50 kPa or less in absolute pressure, although the degree of vacuum varies depending on the kinds of the organic solvent, alcohol, etc. to be removed, as well as exhausting equipment, condensation equipment, and heating temperature. It is difficult to accurately know the amount of alcohol to be removed in the procedure, but it is desirable to remove about 80 mass % or more of the produced alcohol, etc.

Next, the acid catalyst used in the hydrolysis condensation may be removed from the reaction mixture. As a method for removing the acid catalyst, the solution of the thermosetting silicon-containing material (Sx) is mixed with water, and the thermosetting silicon-containing material (Sx) is extracted with an organic solvent. Preferably, the organic solvent used in this event is capable of dissolving the thermosetting silicon-containing material (Sx) and achieves two-layer separation when mixed with water. Examples of the organic solvent include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, cyclopentyl methyl ether, mixtures thereof, and the like.

Further, it is also possible to use a mixture of a water-soluble organic solvent and a slightly-water-soluble organic solvent. Preferable examples of the mixture include methanol-ethyl acetate mixture, ethanol-ethyl acetate mixture, 1-propanol-ethyl acetate mixture, 2-propanol-ethyl acetate mixture, butanediol monomethyl ether-ethyl acetate mixture, propylene glycol monomethyl ether-ethyl acetate mixture, ethylene glycol monomethyl ether-ethyl acetate mixture, butanediol monoethyl ether-ethyl acetate mixture, propylene glycol monoethyl ether-ethyl acetate mixture, ethylene glycol monoethyl ether-ethyl acetate mixture, butanediol monopropyl ether-ethyl acetate mixture, propylene glycol monopropyl ether-ethyl acetate mixture, ethylene glycol monopropyl ether-ethyl acetate mixture, methanol-methyl isobutyl ketone mixture, ethanol-methyl isobutyl ketone mixture, 1-propanol-methyl isobutyl ketone mixture, 2-propanol-methyl isobutyl ketone mixture, propylene glycol monomethyl ether-methyl isobutyl ketone mixture, ethylene glycol monomethyl ether-methyl isobutyl ketone mixture, propylene glycol monoethyl ether-methyl isobutyl ketone mixture, ethylene glycol monoethyl ether-methyl isobutyl ketone mixture, propylene glycol monopropyl ether-methyl isobutyl ketone mixture, ethylene glycol monopropyl ether-methyl isobutyl ketone mixture, methanol-cyclopentyl methyl ether mixture, ethanol-cyclopentyl methyl ether mixture, 1-propanol-cyclopentyl methyl ether mixture, 2-propanol-cyclopentyl methyl ether mixture, propylene glycol monomethyl ether-cyclopentyl methyl ether mixture, ethylene glycol monomethyl ether-cyclopentyl methyl ether mixture, propylene glycol monoethyl ether-cyclopentyl methyl ether mixture, ethylene glycol monoethyl ether-cyclopentyl methyl ether mixture, propylene glycol monopropyl ether-cyclopentyl methyl ether mixture, ethylene glycol monopropyl ether-cyclopentyl methyl ether mixture, methanol-propylene glycol methyl ether acetate mixture, ethanol-propylene glycol methyl ether acetate mixture, 1-propanol-propylene glycol methyl ether acetate mixture, 2-propanol-propylene glycol methyl ether acetate mixture, propylene glycol monomethyl ether-propylene glycol methyl ether acetate mixture, ethylene glycol monomethyl ether-propylene glycol methyl ether acetate mixture, propylene glycol monoethyl ether-propylene glycol methyl ether acetate mixture, ethylene glycol monoethyl ether-propylene glycol methyl ether acetate mixture, propylene glycol monopropyl ether-propylene glycol methyl ether acetate mixture, ethylene glycol monopropyl ether-propylene glycol methyl ether acetate mixture, and the like. However, the combination is not limited thereto.

Although the mixing ratio of the water-soluble organic solvent and the slightly-water-soluble organic solvent is appropriately selected, the amount of the water-soluble organic solvent is preferably 0.1 to 1,000 parts by mass, and more preferably 1 to 500 parts by mass, further preferably 2 to 100 parts by mass, based on 100 parts by mass of the slightly-water-soluble organic solvent.

Subsequently, the thermosetting silicon-containing material (Sx) may be cleaned with neutral water. As the water, what is commonly called deionized water or ultrapure water may be used. The amount of the water is preferably 0.01 to 100 L, more preferably 0.05 to 50 L, and further preferably 0.1 to 5 L, relative to 1 L of the solution of the thermosetting silicon-containing material (Sx). This cleaning procedure may be performed by putting both the thermosetting silicon-containing material (Sx) and water into the same container, followed by stirring and then leaving to stand to separate the aqueous layer. The cleaning may be performed once or more, preferably once to approximately five times, since even if the cleaning is performed 10 times or more, the effect of all the cleaning cannot be obtained.

Other methods for removing the acid catalyst include a method using an ion-exchange resin, and a method in which the acid catalyst is removed after neutralization with an epoxy compound such as ethylene oxide and propylene oxide. These methods can be appropriately selected in accordance with the acid catalyst used in the reaction.

In this water-cleaning operation, a part of the thermosetting silicon-containing material (Sx) escapes into the aqueous layer, so that substantially the same effect as fractionation operation is obtained in some cases. Hence, the number of water-cleaning operations and the amount of cleaning water may be appropriately determined in view of the catalyst removal effect and the fractionation effect.

To a solution of either the thermosetting silicon-containing material (Sx) with the acid catalyst still remaining or the thermosetting silicon-containing material (Sx) with the acid catalyst having been removed, a final solvent may be added for solvent exchange under reduced pressure. Thus, a desired solution of the thermosetting silicon-containing material (Sx) is obtained. The temperature during this solvent exchange is preferably 0 to 100° C., more preferably 10 to 90° C., further preferably 15 to 80° C., depending on the kinds of the reaction solvent and the extraction solvent to be removed. Moreover, the degree of vacuum in this event is preferably atmospheric pressure or less, more preferably 80 kPa or less in absolute pressure, further preferably 50 kPa or less in absolute pressure, although the degree of vacuum varies depending on the kinds of the extraction solvent to be removed, exhausting equipment, condensation equipment, and heating temperature.

In this event, the thermosetting silicon-containing material (Sx) may become unstable by the solvent exchange. This occurs due to incompatibility of the thermosetting silicon-containing material (Sx) with the final solvent. Thus, in order to prevent this phenomenon, a monohydric, dihydric, or polyhydric alcohol having cyclic ether as substituent as shown in paragraphs (0181) to (0182) of JP 2009-126940 A may be added as a stabilizer. The alcohol may be added in an amount of preferably 0 to 25 parts by mass, more preferably 0 to 15 parts by mass, further preferably 0 to 5 parts by mass, based on 100 parts by mass of the thermosetting silicon-containing material (Sx) in the solution before the solvent exchange, and it is particularly preferable to add 0.5 parts by mass or more. If necessary, the monohydric, dihydric, or polyhydric alcohol having cyclic ether as substituent may be added to the solution before the solvent exchange operation.

If the thermosetting silicon-containing material (Sx) is concentrated above a certain concentration level, the condensation reaction may further progress, so that the thermosetting silicon-containing material (Sx) becomes no longer soluble in an organic solvent. Thus, it is preferable to maintain the solution state with a proper concentration. Meanwhile, if the concentration is too low, the amount of solvent is excessive. Hence, the solution state with a proper concentration is economical and preferable. The concentration in this state is preferably 0.1 to 20 mass %.

The final solvent added to the thermosetting silicon-containing material (Sx) solution is preferably an alcohol-based solvent, particularly preferably monoalkyl ether derivatives of ethylene glycol, diethylene glycol, triethylene glycol, propylene glycol, dipropylene glycol, butanediol, or the like. Specifically, preferable examples thereof include butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, diacetone alcohol and the like.

When these solvents are used as the main component, a non-alcohol-based solvent can also be added as an auxiliary solvent. Examples of the auxiliary solvent include acetone, tetrahydrofuran, toluene, hexane, ethyl acetate, cyclohexanone, methyl amyl ketone, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, cyclopentyl methyl ether, and the like.

In an alternative reaction operation using an acid catalyst, water or a water-containing organic solvent is added to the hydrolysable monomer (Sm) or an organic solution of the hydrolysable monomer (Sm) to initiate the hydrolysis reaction. In this event, the catalyst may be added to the hydrolysable monomer (Sm) or the organic solution of the hydrolysable monomer (Sm), or may be added to the water or the water-containing organic solvent. The reaction temperature is preferably 0 to 100° C., more preferably 10 to 80° C. As a preferable method, when the water is added dropwise, the mixture is heated to 10 to 50° C., and then further heated to 20 to 80° C. for the aging.

When the organic solvent is used, a water-soluble solvent is preferable. Examples thereof include methanol, ethanol, 1-propanol, 2-propanol, 1-butanol, 2-butanol, 2-methyl-1-propanol, acetone, tetrahydrofuran, acetonitrile; polyhydric alcohol condensate derivatives such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether; mixtures thereof, and the like.

The organic solvent is used in an amount of preferably 0 to 1,000 ml, more preferably 0 to 500 ml, relative to 1 mol of the hydrolysable monomer (Sm). When the amount of organic solvent used is the above-described upper limit or less, only a small reaction vessel is required, which is economical. The obtained reaction mixture may be subjected to post-treatment by the same procedure as mentioned above to obtain a thermosetting silicon-containing material (Sx).

[Synthesizing Method 2 of Thermosetting Silicon-Containing Material (Sx) 2: Alkali Catalyst]

Alternatively, the thermosetting silicon-containing material (Sx) can be produced by hydrolysis condensation of the hydrolysable monomer (Sm) or a mixture of one or more of the hydrolysable monomers (Sm) in the presence of an alkali catalyst. Examples of the alkali catalyst used in this event include methylamine, ethylamine, propylamine, butylamine, ethylenediamine, hexamethylenediamine, dimethylamine, diethylamine, ethylmethylamine, trimethylamine, triethylamine, tripropylamine, tributylamine, cyclohexylamine, dicyclohexylamine, monoethanolamine, diethanolamine, dimethyl monoethanolamine, monomethyl diethanolamine, triethanolamine, diazabicyclooctane, diazabicyclocyclononene, diazabicycloundecene, hexamethylenetetramine, aniline, N,N-dimethylaniline, pyridine, N,N-dimethylaminopyridine, pyrrole, piperazine, pyrrolidine, piperidine, picoline, tetramethylammonium hydroxide, choline hydroxide, tetrapropylammonium hydroxide, tetrabutylammonium hydroxide, ammonia, lithium hydroxide, sodium hydroxide, potassium hydroxide, barium hydroxide, calcium hydroxide, and the like. The catalyst is used in an amount of preferably $1\times10^{-6}$ mol to 10 mol, more preferably $1\times10^{-5}$ mol to 5 mol, further preferably $1\times10^{-4}$ mol to 1 mol, relative to 1 mol of the hydrolysable monomer (Sm).

When the thermosetting silicon-containing material (Sx) is obtained from the hydrolysable monomer (Sm) by the hydrolysis condensation, water is preferably added in an amount of 0.1 to 50 mol per mol of the hydrolysable substituent bonded to the hydrolysable monomer (Sm). When the amount of the water is 50 mol or less, a reaction device can be made small, which is economical.

As the operation method, the hydrolysable monomer (Sm) is added to an aqueous catalyst solution to initiate the hydrolysis condensation reaction. In this event, an organic solvent may be added to the aqueous catalyst solution, or the hydrolysable monomer (Sm) may be diluted with an organic solvent, or both of these operations may be performed. The reaction temperature is preferably 0 to 100° C., more preferably 5 to 80° C. As a preferable method, when the hydrolysable monomer (Sm) is added dropwise, the temperature is maintained at 5 to 80° C., and then the mixture is aged at 20 to 80° C.

As the organic solvent which can be added to the aqueous solution of the alkali catalyst aqueous solution or with which the hydrolysable monomer (Sm) can be diluted, the same organic solvents exemplified as the organic solvents which can be added to the aqueous solution of the acid catalyst are preferably used. Should be noted that the organic solvent is used in an amount of preferably 0 to 1,000 ml relative to 1 mol of the hydrolysable monomer (Sm) because the reaction can be performed economically.

Then, if necessary, neutralization reaction of the catalyst is carried out to obtain an aqueous solution of a reaction mixture. In this event, the amount of an acidic substance usable for the neutralization is preferably 0.1 to 2 equivalents relative to the alkaline substance used as the catalyst. This acidic substance may be any substance as long as it exhibits acidity in water.

Subsequently, by-products such as alcohol produced by the hydrolysis condensation reaction are desirably removed from the reaction mixture by a procedure such as removal under reduced pressure. In this event, the reaction mixture is heated at a temperature of preferably 0 to 100° C., more preferably 10 to 90° C., further preferably 15 to 80° C., although the temperature depends on the kinds of the added organic solvent and alcohol produced in the reaction. Moreover, the degree of vacuum in this event is preferably atmospheric pressure or less, more preferably 80 kPa or less in absolute pressure, further preferably 50 kPa or less in absolute pressure, although the degree of vacuum varies depending on the kinds of the organic solvent and alcohol to be removed, as well as exhausting equipment, condensation equipment, and heating temperature. In It is difficult to accurately know the amount of alcohol to be removed in the procedure, but it is desirable to remove about 80 mass % or more of the produced alcohol.

Next, to remove the catalyst used in the hydrolysis condensation, the thermosetting silicon-containing material (Sx) may be extracted with an organic solvent. Preferably, the organic solvent used in this event is capable of dissolving the thermosetting silicon-containing material (Sx) and achieves two-layer separation when mixed with water. Examples of the organic solvent include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl amyl ketone, propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, cyclopentyl methyl ether, mixtures thereof, and the like.

Next, to remove the alkali catalyst used in the hydrolysis condensation, the thermosetting silicon-containing material (Sx) may be extracted with an organic solvent. Preferably, the organic solvent used in this event is capable of dissolving the thermosetting silicon-containing material (Sx) and achieves two-layer separation when mixed with water. Further, it is also possible to use a mixture of a water-soluble organic solvent and a slightly-water-soluble organic solvent.

As concrete examples of the organic solvent used for removing the alkali catalyst, it is possible to use the same organic solvents or the same mixture of the water-soluble organic solvent and the slightly-water-soluble organic solvent as the specifically-aforementioned examples thereof.

Although the mixing ratio of the water-soluble organic solvent and the slightly-water-soluble organic solvent is appropriately selected, the amount of the water-soluble organic solvent is preferably 0.1 to 1,000 parts by mass, more preferably 1 to 500 parts by mass, further preferably 2 to 100 parts by mass, based on 100 parts by mass of the slightly-water-soluble organic solvent.

Subsequently, the thermosetting silicon-containing material may be cleaned with neutral water. As the water, what is commonly called deionized water or ultrapure water may be used. The amount of the water is preferably 0.01 to 100 L, more preferably 0.05 to 50 L, further preferably 0.1 to 5 L, relative to 1 L of the thermosetting silicon-containing material (Sx) solution. This cleaning procedure may be performed by putting both the thermosetting silicon-containing material (Sx) and water into the same container, followed by stirring and then leaving to stand to separate the aqueous layer. The cleaning may be performed once or more, preferably once to approximately five times, since even is the cleaning is performed 10 times or more, the effect of all the cleaning cannot be obtained.

To the solution of the cleaned thermosetting silicon-containing material (Sx), a final solvent may be added for solvent exchange under reduced pressure. Thus, a desired solution of thermosetting silicon-containing material (Sx) is obtained. The temperature during this solvent exchange is preferably 0 to 100° C., more preferably 10 to 90° C., further preferably 15 to 80° C., depending on the kind of the extraction solvent to be removed. Moreover, the degree of vacuum in this event is preferably atmospheric pressure or less, more preferably 80 kPa or less in absolute pressure, further preferably 50 kPa or less in absolute pressure, although the degree of vacuum varies depending on the kinds of the extraction solvent to be removed, exhausting equipment, condensation equipment, and heating temperature.

The final solvent added to the solution of the thermosetting silicon-containing material (Sx) is preferably an alcohol-based solvent, more preferably a monoalkyl ether of ethylene glycol, diethylene glycol, triethylene glycol, etc. and a monoalkyl ether of propylene glycol, and dipropylene glycol, etc. Specifically, preferable examples thereof include propylene glycol monomethyl ether, ethylene glycol monomethyl ether, propylene glycol monoethyl ether, ethylene glycol monoethyl ether, propylene glycol monopropyl ether, ethylene glycol monopropyl ether, diacetone alcohol, and the like.

In an alternative reaction operation using an alkali catalyst, water or a water-containing organic solvent is added to the hydrolysable monomer (Sm) or an organic solution of the hydrolysable monomer (Sm) to initiate the hydrolysis reaction. In this event, the catalyst may be added to the hydrolysable monomer (Sm) or the organic solution of the hydrolysable monomer (Sm), or may be added to the water or the water-containing organic solvent. The reaction temperature is preferably 0 to 100° C., more preferably 10 to 80° C. As a preferable method, when the water is added dropwise, the mixture is heated to 10 to 50° C., and then further heated to 20 to 80° C. for the aging.

The organic solvent usable for the organic solution of the hydrolysable monomer (Sm) or the water-containing organic solvent is preferably a water-soluble solvent. Examples thereof include methanol, ethanol, 1-propanol, 2-propanol, 1-butanol, 2-butanol, 2-methyl-1-propanol, acetone, tetrahydrofuran, acetonitrile; polyhydric alcohol condensate derivatives such as propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether; mixtures thereof, and the like.

The molecular weight of the thermosetting silicon-containing material (Sx) obtained by the above synthesis method 1 or 2 can be adjusted not only through the selection of the hydrolysable monomer (Sm) but also by controlling the reaction conditions during the polymerization. Since generation of foreign matters and coating spots is suppressed when the weight average molecular weight is 100,000 or less, it is preferable to use the thermosetting silicon-containing material (Sx) having a molecular weight of 100,000 or less, more preferably 200 to 50,000, further preferably 300 to 30,000. Data on the weight average molecular weight is the molecular weight which is expressed in terms of polystyrene which is obtained by gel-permeation chromatography (GPC) using a refractive index (RI) detector, tetrahydrofuran as an eluent, and polystyrene as a reference substance.

The physical properties of the thermosetting silicon-containing material (Sx) used in the present invention vary depending on the kind of acid or alkali catalyst used during hydrolysis condensation and reaction conditions. Therefore, it is possible to select appropriately depending on the desired properties of the resist underlayer film.

Furthermore, a silicon-containing material derivative produced from a mixture of the hydrolysable monomer (Sm) with a hydrolysable metal compound shown by the following general formula (Mm) under the conditions using the acid or alkali catalyst can also be used as a component of a composition for forming a resist underlayer film.

$$U(OR^7)_{m7}(OR^8)_{m8}(Mm)$$

In the formula, $R^7$ and $R^8$ each represent an organic group having 1 to 30 carbon atoms; m7+m8 represents the same number as that of a valence determined by the kind of U; m7 and m8 each represent an integer of 0 or more; and U represents an element belonging to the group III, IV, or V in the periodic table, except for carbon and silicon.

Examples of the hydrolysable metal compound (Mm) used in this procedure include the followings.

When U is boron, examples of the compound shown by the general formula (Mm) include, as monomers, boron methoxide, boron ethoxide, boron propoxide, boron butoxide, boron amyloxide, boron hexyloxide, boron cyclopentoxide, boron cyclohexyloxide, boron allyloxide, boron phenoxide, boron methoxyethoxide, boric acid, boron oxide, and the like.

When U is aluminum, examples of the compound shown by the general formula (Mm) include, as monomers, aluminum methoxide, aluminum ethoxide, aluminum propoxide, aluminum butoxide, aluminum amyloxide, aluminum hexyloxide, aluminum cyclopentoxide, aluminum cyclohexyloxide, aluminum allyloxide, aluminum phenoxide, aluminum methoxyethoxide, aluminum ethoxyethoxide, aluminum dipropoxy (ethyl acetoacetate), aluminum dibutoxy (ethyl acetoacetate), aluminum propoxy bis(ethyl acetoacetate), aluminum butoxy bis(ethyl acetoacetate), aluminum 2,4-pentanedionate, aluminum 2,2,6,6-tetramethyl-3,5-heptanedionate, and the like.

When U is gallium, examples of the compound shown by the general formula (Mm) include, as monomers, gallium methoxide, gallium ethoxide, gallium propoxide, gallium butoxide, gallium amyloxide, gallium hexyloxide, gallium cyclopentoxide, gallium cyclohexyloxide, gallium allyloxide, gallium phenoxide, gallium methoxyethoxide, gallium ethoxyethoxide, gallium dipropoxy (ethyl acetoacetate), gallium dibutoxy (ethyl acetoacetate), gallium propoxy bis (ethyl acetoacetate), gallium butoxy bis(ethyl acetoacetate), gallium 2,4-pentanedionate, gallium 2,2,6,6-tetramethyl-3,5-heptanedionate, and the like.

When U is yttrium, examples of the compound shown by the general formula (Mm) include, as monomers, yttrium methoxide, yttrium ethoxide, yttrium propoxide, yttrium butoxide, yttrium amyloxide, yttrium hexyloxide, yttrium cyclopentoxide, yttrium cyclohexyloxide, yttrium allyloxide, yttrium phenoxide, yttrium methoxyethoxide, yttrium ethoxyethoxide, yttrium dipropoxy (ethyl acetoacetate), yttrium dibutoxy (ethyl acetoacetate), yttrium propoxy bis (ethyl acetoacetate), yttrium butoxy bis(ethyl acetoacetate), yttrium 2,4-pentanedionate, yttrium 2,2,6,6-tetramethyl-3,5-heptanedionate, and the like.

When U is germanium, examples of the compound shown by the general formula (Mm) include, as monomers, germanium methoxide, germanium ethoxide, germanium propoxide, germanium butoxide, germanium amyloxide, germanium hexyloxide, germanium cyclopentoxide, germanium cyclohexyloxide, germanium allyloxide, germanium phenoxide, germanium methoxyethoxide, germanium ethoxyethoxide, and the like.

When U is titanium, examples of the compound shown by the general formula (Mm) include, as monomers, titanium methoxide, titanium ethoxide, titanium propoxide, titanium butoxide, titanium amyloxide, titanium hexyloxide, titanium cyclopentoxide, titanium cyclohexyloxide, titanium allyloxide, titanium phenoxide, titanium methoxyethoxide, titanium ethoxyethoxide, titanium dipropoxy bis(ethyl acetoacetate), titanium dibutoxy bis(ethyl acetoacetate), titanium dipropoxy bis (2,4-pentanedionate), titanium dibutoxy bis (2,4-pentanedionate), and the like.

When U is hafnium, examples of the compound shown by the general formula (Mm) include, as monomers, hafnium methoxide, hafnium ethoxide, hafnium propoxide, hafnium butoxide, hafnium amyloxide, hafnium hexyloxide, hafnium cyclopentoxide, hafnium cyclohexyloxide, hafnium allyloxide, hafnium phenoxide, hafnium methoxyethoxide, hafnium ethoxyethoxide, hafnium dipropoxy bis(ethyl acetoacetate), hafnium dibutoxy bis(ethyl acetoacetate), hafnium dipropoxy bis (2,4-pentanedionate), hafnium dibutoxy bis (2,4-pentanedionate), and the like.

When U is tin, examples of the compound shown by the general formula (Mm) include, as monomers, methoxy tin, ethoxy tin, propoxy tin, butoxy tin, phenoxy tin, methoxyethoxy tin, ethoxyethoxy tin, tin 2,4-pentanedionate, tin 2,2,6,6-tetramethyl-3,5-heptanedionate, and the like.

When U is arsenic, examples of the compound shown by the general formula (Mm) include, as monomers, methoxy arsenic, ethoxy arsenic, propoxy arsenic, butoxy arsenic, phenoxy arsenic, and the like.

When U is antimony, examples of the compound shown by the general formula (Mm) include, as monomers, methoxy antimony, ethoxy antimony, propoxy antimony, butoxy antimony, phenoxy antimony, antimony acetate, antimony propionate, and the like.

When U is niobium, examples of the compound shown by the general formula (Mm) include, as monomers, methoxy niobium, ethoxy niobium, propoxy niobium, butoxy niobium, phenoxy niobium, and the like.

When U is tantalum, examples of the compound shown by the general formula (Mm) include, as monomers, methoxy tantalum, ethoxy tantalum, propoxy tantalum, butoxy tantalum, phenoxy tantalum, and the like.

When U is bismuth, examples of the compound shown by the general formula (Mm) include, as monomers, methoxy bismuth, ethoxy bismuth, propoxy bismuth, butoxy bismuth, phenoxy bismuth, and the like.

When U is phosphorus, examples of the compound shown by the general formula (Mm) include, as monomers, trimethyl phosphate, triethyl phosphate, tripropyl phosphate, trimethyl phosphite, triethyl phosphite, tripropyl phosphite, diphosphorous pentaoxide, and the like.

When U is vanadium, examples of the compound shown by the general formula (Mm) include, as monomers, vanadium oxide bis(2,4-pentanedionate), vanadium 2,4-pentanedionate, vanadium tributoxide oxide, vanadium tripropoxide oxide, and the like.

When U is zirconium, examples of the compound shown by the general formula (Mm) include, as monomers, methoxy zirconium, ethoxy zirconium, propoxy zirconium, butoxy zirconium, phenoxy zirconium, zirconium dibutoxide bis(2,4-pentanedionate), zirconium dipropoxide bis(2,2,6,6-tetramethyl-3,5-heptanedionate), and the like.

<Method for Measuring Distance of Diffusion of Curing Catalyst (Xc)>

The curing catalyst (Xc) in the present invention has a distance of diffusion of the curing catalyst (Xc) from a resist underlayer film formed from the composition for forming a silicon-containing resist underlayer film to a resist upper layer film to be formed on the resist underlayer film of 5 nm or less. Hereinafter, the distance of diffusion of the curing catalyst (Xc) will be described with reference to drawings.

FIG. 1 is a flow diagram which shows, for measuring the distance of diffusion of the curing catalyst (Xc) in the present invention, the process of the curing catalyst (Xc) diffusing from the silicon-containing resist underlayer film. Firstly, a composition for forming a silicon-containing resist underlayer film containing a curing catalyst (Xc) is spin-coated on a substrate 1 and heat-treated to form a silicon-containing resist underlayer film 2 (FIG. 1(b)). The reason for heating and curing the composition for forming a silicon-containing resist underlayer film is to avoid intermixing with the upper layer resist film 3 to be formed on the film. In this curing, dehydration reaction and/or dealcoholization reaction of a silanol group and an alkoxysilyl group of the thermosetting silicon-containing material (Sx) contained in the composition for forming a silicon-containing resist underlayer film occur, and a siloxane bond is newly formed. The curing catalyst (Xc) is added in order to promote this reaction. In this way, curing of the silicon-containing resist underlayer film 2 progresses sufficiently, and it is possible to obtain a silicon-containing resist underlayer film 2 insolubilized to solvents. On the cured silicon-containing resist underlayer film 2, a composition containing a resin used in what is called a photosensitive resist composition, for example a resin in which a functional group giving alkali-solubility to an alkali-soluble resin which has a hydroxyl group or a carboxyl group as a partial structure is protected by an acid leaving group, and an acid generator which generates acid by a high energy beam is spin-coated, and the composition is heated to form a resist upper layer film 3 which is an organic film. The heating temperature in this event is sufficient if the solvent in the composition for forming a resist upper layer film evaporates, and the temperature is preferably 50° C. or more and 300° C. or less, more preferably 70° C. or more and 200° C. or less (FIG.

1(c)). Subsequently, a high energy beam is irradiated in order to decompose the acid generator. For the high energy beam, high-pressure mercury lamp, KrF excimer laser, ArF excimer laser, or some other appropriate light source or energy beam source is selected to generate acid. The irradiation quantity of the high energy beam is preferably 1 mJ or more and 1000 mJ or less, more preferably 5 mJ or more and 100 mJ or less (FIG. 1(d)). Next, heat treatment is performed to eliminate the protective group of the alkali-soluble functional group so that the alkali solubility of the resin is exhibited. The heat treatment temperature is preferably 50° C. or more and 250° C. or less, more preferably 70° C. or more and 200° C. or less. In this event, when the curing catalyst (Xc) is diffused from the silicon-containing resist underlayer film 2, the generated acid is neutralized by the curing catalyst (Xc) and a portion where the alkali-solubility of the resin is inhibited appears near the silicon-containing resist underlayer film 2 (FIG. 1(e)). When this is developed by an alkaline developer, a part where the protective group was eliminated dissolves in the developer, and in a region near the silicon-containing resist underlayer film 2, a resist upper layer film 4, which is an organic film remains depending on the distance of diffusion of the curing catalyst (Xc) (FIG. 1(f)). The film thickness of the remaining resist upper layer film 4 measured by a film thickness meter can be regarded as the distance of diffusion of the curing catalyst (Xc) contained in the silicon-containing resist underlayer film 2. The curing catalyst (Xc) in the present invention has the distance of diffusion 5 nm or less.

[Curing Catalyst (Xc)]

A specific example of the curing catalyst (Xc) includes a compound represented by the following general formula (Xc0):

$$L_a H_b A \quad (Xc0)$$

where L represents lithium, sodium, potassium, rubidium, cesium, sulfonium, iodonium, phosphonium, or ammonium; A represents a non-nucleophilic counter ion; "a" represents an integer of 1 or more; "b" represents an integer of 0 or 1 or more; and a+b represents a valence of the non-nucleophilic counter ion.

Examples of the specific (Xc0) include a sulfonium salt of the following general formula (Xc-1), an iodonium salt of the following general formula (Xc-2), a phosphonium salt of the following general formula (Xc-3), an ammonium salt of the following general formula (Xc-4), an alkaline metal salt, and the like.

Examples of the sulfonium salt (Xc-1), the iodonium salt (Xc-2), and the phosphonium salt (Xc-3) are shown below.

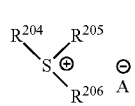

(Xc-1)

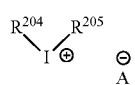

(Xc-2)

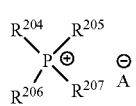

(Xc-3)

Moreover, an example of the ammonium salt (Xc-4) is shown below.

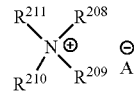

(Xc-4)

In the formulae, $R^{204}$, $R^{205}$, $R^{206}$, and $R^{207}$ each represent a linear, branched, or cyclic alkyl group, alkenyl group, oxoalkyl group, or oxoalkenyl group having 1 to 12 carbon atoms, a substituted or unsubstituted aryl group having 6 to 20 carbon atoms, or an aralkyl group or aryloxoalkyl group having 7 to 12 carbon atoms; some or all of hydrogen atoms of these groups are optionally substituted with an alkoxy group or the like. Additionally, $R^{205}$ and $R^{206}$ may form a ring; when a ring is formed, $R^{205}$ and $R^{206}$ each represent an alkylene group having 1 to 6 carbon atoms. $A^-$ represents a non-nucleophilic counter ion. $R^{208}$, $R^{209}$, $R^{210}$, and $R^{211}$ are the same as $R^{204}$, $R^{205}$, $R^{206}$, and $R^{207}$ and may be each a hydrogen atom. $R^{208}$ and $R^{209}$, or $R^{208}$, $R^{209}$, and $R^{210}$, may form a ring; when a ring is formed, $R^{208}$ and $R^{209}$, or $R^{208}$, $R^{209}$, and $R^{210}$, represent an alkylene group having 3 to 10 carbon atoms.

$R^{204}$, $R^{205}$, $R^{206}$, $R^{207}$, $R^{208}$, $R^{209}$, $R^{210}$, and $R^{211}$ may be identical to or different from one another. Specifically, examples of the alkyl group include a methyl group, an ethyl group, a propyl group, an isopropyl group, an n-butyl group, a sec-butyl group, a tert-butyl group, a pentyl group, a hexyl group, a heptyl group, an octyl group, a cyclopentyl group, a cyclohexyl group, a cycloheptyl group, a cyclopropylmethyl group, a 4-methylcyclohexyl group, a cyclohexylmethyl group, a norbornyl group, an adamantyl group, and the like. Examples of the alkenyl group include a vinyl group, an allyl group, a propenyl group, a butenyl group, a hexenyl group, a cyclohexenyl group, and the like. Examples of the oxoalkyl group include a 2-oxocyclopentyl group, a 2-oxocyclohexyl group, and the like, and also include a 2-oxopropyl group, a 2-cyclopentyl-2-oxoethyl group, a 2-cyclohexyl-2-oxoethyl group, a 2-(4-methylcyclohexyl)-2-oxoethyl group, and the like. Examples of the aryl group include a phenyl group, a naphthyl group, and the like; alkoxyphenyl groups such as a p-methoxyphenyl group, a m-methoxyphenyl group, an o-methoxyphenyl group, an ethoxyphenyl group, a p-tert-butoxyphenyl group, and a m-tert-butoxyphenyl group; alkylphenyl groups such as a 2-methylphenyl group, a 3-methylphenyl group, a 4-methylphenyl group, an ethylphenyl group, a 4-tert-butylphenyl group, a 4-butylphenyl group, and a dimethylphenyl group; alkylnaphthyl groups such as a methylnaphthyl group and an ethylnaphthyl group; alkoxynaphthyl groups such as a methoxynaphthyl group and an ethoxynaphthyl group; dialkylnaphthyl groups such as a dimethylnaphthyl group and a diethylnaphthyl group; dialkoxynaphthyl groups such as a dimethoxynaphthyl group and a diethoxynaphthyl group; and the like. Examples of the aralkyl group include a benzyl group, a phenylethyl group, a phenethyl group, and the like. Examples of the aryloxoalkyl group include 2-aryl-2-oxoethyl groups such as a 2-phenyl-2-oxoethyl group, a 2-(1-naphthyl)-2-oxoethyl group, and a 2-(2-naphthyl)-2-oxoethyl group; and the like.

Examples of the non-nucleophilic counter ion A include monovalent ions such as hydroxide ion, formate ion, acetate ion, propionate ion, butanoate ion, pentanoate ion, hexanoate ion, heptanoate ion, octanoate ion, nonanoate ion, decanoate ion, oleate ion, stearate ion, linoleate ion, linolenate ion, benzoate ion, phthalate ion, isophthalate ion, terephthalate ion, salicylate ion, trifluoroacetate ion, monochloroacetate ion, dichloroacetate ion, trichloroacetate ion, fluoride ion, chloride ion, bromide ion, iodide ion, nitrate ion, nitrite ion, chlorate ion, bromate ion, methanesulfonate ion, paratoluenesulfonate ion, and monomethylsulfate ion; monovalent or divalent ions such as oxalate ion, malonate ion, methylmalonate ion, ethylmalonate ion, propylmalonate ion, butylmalonate ion, dimethylmalonate ion, diethylmalonate ion, succinate ion, methylsuccinate ion, glutarate ion, adipate ion, itaconate ion, maleate ion, fumarate ion, citraconate ion, citrate ion, carbonate ion, sulfate ion, and the like.

Examples of the alkaline metal salt include the following salts of lithium, sodium, potassium, and cesium; monovalent salts such as hydroxide, formate, acetate, propionate, butanoate, pentanoate, hexanoate, heptanoate, octanoate, nonanoate, decanoate, oleate, stearate, linoleate, linolenate, benzoate, phthalate, isophthalate, terephthalate, salicylate, trifluoroacetate, monochloroacetate, dichloroacetate, and trichloroacetate; monovalent or divalent salts such as oxalate, malonate, methylmalonate, ethylmalonate, propylmalonate, butylmalonate, dimethylmalonate, diethylmalonate, succinate, methylsuccinate, glutarate, adipate, itaconate, maleate, fumarate, citraconate, citrate, carbonate, and the like.

Specific examples of the sulfonium salt (Xc-1) include triphenylsulfonium formate, triphenylsulfonium acetate, triphenylsulfonium propionate, triphenylsulfonium butanoate, triphenylsulfonium benzoate, triphenylsulfonium phthalate, triphenylsulfonium isophthalate, triphenylsulfonium terephthalate, triphenylsulfonium salicylate, triphenylsulfonium trifluoromethanesulfonate, triphenylsulfonium trifluoroacetate, triphenylsulfonium monochloroacetate, triphenylsulfonium dichloroacetate, triphenylsulfonium trichloroacetate, triphenylsulfonium hydroxide, triphenylsulfonium nitrate, triphenylsulfonium chloride, triphenylsulfonium bromide, triphenylsulfonium oxalate, triphenylsulfonium malonate, triphenylsulfonium methylmalonate, triphenylsulfonium ethylmalonate, triphenylsulfonium propylmalonate, triphenylsulfonium butylmalonate, triphenylsulfonium dimethylmalonate, triphenylsulfonium diethylmalonate, triphenylsulfonium succinate, triphenylsulfonium methyl succinate, triphenylsulfonium glutarate, triphenylsulfonium adipate, triphenylsulfonium itaconate, triphenylsulfonium maleate, triphenylsulfonium fumarate, triphenylsulfonium citraconate, triphenylsulfonium citrate, triphenylsulfonium carbonate, bistriphenylsulfonium oxalate, bistriphenylsulfonium maleate, bistriphenylsulfonium fumarate, bistriphenylsulfonium citraconate, bistriphenylsulfonium citrate, bistriphenylsulfonium carbonate, and the like.

Specific examples of the iodonium salt (Xc-2) include diphenyliodonium formate, diphenyliodonium acetate, diphenyliodonium propionate, diphenyliodonium butanoate, diphenyliodonium benzoate, diphenyliodonium phthalate, diphenyliodonium isophthalate, diphenyliodonium terephthalate, diphenyliodonium salicylate, diphenyliodonium trifluoromethanesulfonate, diphenyliodonium trifluoroacetate, diphenyliodonium monochloroacetate, diphenyliodonium dichloroacetate, diphenyliodonium trichloroacetate, diphenyliodonium hydroxide, diphenyliodonium nitrate, diphenyliodonium chloride, diphenyliodonium bromide, diphenyliodonium iodide, diphenyliodonium oxalate, diphenyliodonium maleate, diphenyliodonium fumarate, diphenyliodonium citraconate, diphenyliodonium citrate, diphenyliodonium carbonate, bisdiphenyliodonium oxalate, bisdiphenyliodonium maleate, bisdiphenyliodonium fumarate, bisdiphenyliodonium citraconate, bisdiphenyliodonium citrate, bisdiphenyliodonium carbonate, and the like.

Specific examples of the phosphonium salt (Xc-3) include tetraethylphosphonium formate, tetraethylphosphonium acetate, tetraethylphosphonium propionate, tetraethylphosphonium butanoate, tetraethylphosphonium benzoate, tetraethylphosphonium phthalate, tetraethylphosphonium isophthalate, tetraethylphosphonium terephthalate, tetraethylphosphonium salicylate, tetraethylphosphonium trifluoromethanesulfonate, tetraethylphosphonium trifluoroacetate, tetraethylphosphonium monochloroacetate, tetraethylphosphonium dichloroacetate, tetraethylphosphonium trichloroacetate, tetraethylphosphonium hydroxide, tetraethylphosphonium nitrate, tetraethylphosphonium chloride, tetraethylphosphonium bromide, tetraethylphosphonium iodide, tetraethylphosphonium oxalate, tetraethylphosphonium maleate, tetraethylphosphonium fumarate, tetraethylphosphonium citraconate, tetraethylphosphonium citrate, tetraethylphosphonium carbonate, bistetraethylphosphonium oxalate, bistetraethylphosphonium maleate, bistetraethylphosphonium fumarate, bistetraethylphosphonium citraconate, bistetraethylphosphonium citrate, bistetraethylphosphonium carbonate, tetraphenylphosphonium formate, tetraphenylphosphonium acetate, tetraphenylphosphonium propionate, tetraphenylphosphonium butanoate, tetraphenylphosphonium benzoate, tetraphenylphosphonium phthalate, tetraphenylphosphonium isophthalate, tetraphenylphosphonium terephthalate, tetraphenylphosphonium salicylate, tetraphenylphosphonium trifluoromethanesulfonate, tetraphenylphosphonium trifluoroacetate, tetraphenylphosphonium monochloroacetate, tetraphenylphosphonium dichloroacetate, tetraphenylphosphonium trichloroacetate, tetraphenylphosphonium hydroxide, tetraphenylphosphonium nitrate, tetraphenylphosphonium chloride, tetraphenylphosphonium bromide, tetraphenylphosphonium iodide, tetraphenylphosphonium oxalate, tetraphenylphosphonium maleate, tetraphenylphosphonium fumarate, tetraphenylphosphonium citraconate, tetraphenylphosphonium citrate, tetraphenylphosphonium carbonate, bistetraphenylphosphonium oxalate, bistetraphenylphosphonium maleate, bistetraphenylphosphonium fumarate, bistetraphenylphosphonium citraconate, bistetraphenylphosphonium citrate, bistetraphenylphosphonium carbonate, and the like.

Specific examples of the ammonium salt (Xc-4) include tetramethylammonium formate, tetramethylammonium acetate, tetramethylammonium propionate, tetramethylammonium butanoate, tetramethylammonium benzoate, tetramethylammonium phthalate, tetramethylammonium isophthalate, tetramethylammonium terephthalate, tetramethylammonium salicylate, tetramethylammonium trifluoromethanesulfonate, tetramethylammonium trifluoroacetate, tetramethylammonium monochloroacetate, tetramethylammonium dichloroacetate, tetramethylammonium trichloroacetate, tetramethylammonium hydroxide, tetramethylammonium nitrate, tetramethylammonium chloride, tetramethylammonium bromide, tetramethylammonium iodide, tetramethylammonium monomethylsulfate, tetramethylammonium oxalate, tetramethylammonium malonate, tetramethylammonium maleate, tetramethylammonium fumarate, tetramethylammonium citraconate, tetramethylammonium citrate, tetramethylammonium carbonate, bistetramethylammonium oxalate, bistetramethylammonium malonate, bistetramethylammonium maleate, bistetramethylammonium fumarate, bistetramethylammonium citraconate, bistetramethylammonium citrate, bistetramethylammonium carbonate, tetraethylammonium formate, tetraethylammonium acetate, tetraethylammonium propionate, tetraethylammonium butanoate, tetraethylammonium benzoate, tetraethylammonium phthalate, tetraethylammonium isophthalate, tetraethylammonium terephthalate, tetraethylammonium salicylate, tetraethylammonium trifluoromethanesulfonate, tetraethylammonium trifluoroacetate, tetraethylammonium monochloroacetate, tetraethylammonium dichloroacetate, tetraethylammonium trichloroacetate, tetraethylammonium hydroxide, tetraethylammonium nitrate, tetraethylammonium chloride, tetraethylammonium bromide, tetraethylammonium iodide, tetraethylammonium monomethylsulfate, tetraethylammonium oxalate, tetraethylammonium malonate, tetraethylammonium maleate, tetraethylammonium fumarate, tetraethylammonium citraconate, tetraethylammonium citrate, tetraethylammonium carbonate, bistetraethylammonium oxalate, bistetraethylammonium malonate, bistetraethylammonium maleate, bistetraethylammonium fumarate, bistetraethylammonium citraconate, bistetraethylammonium citrate, bistetraethylammonium carbonate, tetrapropylammonium formate, tetrapropylammonium acetate, tetrapropylammonium propionate, tetrapropylammonium butanoate, tetrapropylammonium benzoate, tetrapropylammonium phthalate, tetrapropylammonium isophthalate, tetrapropylammonium terephthalate, tetrapropylammonium salicylate, tetrapropylammonium trifluoromethanesulfonate, tetrapropylammonium trifluoroacetate, tetrapropylammonium monochloroacetate, tetrapropylammonium dichloroacetate, tetrapropylammonium trichloroacetate, tetrapropylammonium hydroxide, tetrapropylammonium nitrate, tetrapropylammonium chloride, tetrapropylammonium bromide, tetrapropylammonium iodide, tetrapropylammonium monomethylsulfate, tetrapropylammonium oxalate, tetrapropylammonium malonate, tetrapropylammonium maleate, tetrapropylammonium fumarate, tetrapropylammonium citraconate, tetrapropylammonium citrate, tetrapropylammonium carbonate, bistetrapropylammonium oxalate, bistetrapropylammonium malonate, bistetrapropylammonium maleate, bistetrapropylammonium fumarate, bistetrapropylammonium citraconate, bistetrapropylammonium citrate, bistetrapropylammonium carbonate, tetrabutylammonium formate, tetrabutylammonium acetate, tetrabutylammonium propionate, tetrabutylammonium butanoate, tetrabutylammonium benzoate, tetrabutylammonium phthalate, tetrabutylammonium isophthalate, tetrabutylammonium terephthalate, tetrabutylammonium salicylate, tetrabutylammonium trifluoromethanesulfonate, tetrabutylammonium trifluoroacetate, tetrabutylammonium monochloroacetate, tetrabutylammonium dichloroacetate, tetrabutylammonium trichloroacetate, tetrabutylammonium hydroxide, tetrabutylammonium nitrate, tetrabutylammonium chloride, tetrabutylammonium bromide, tetrabutylammonium iodide, tetrabutylammonium methanesulfonate, tetrabutylammonium monomethylsulfate, tetrabutylammonium oxalate, tetrabutylammonium malonate, tetrabutylammonium maleate, tetrabutylammonium fumarate, tetrabutylammonium citraconate, tetrabutylammonium citrate, tetrabutylammonium carbonate, bistetrabutylammonium oxalate, bistetrabutylammonium malonate, bistetrabutylammonium maleate, bistetrabutylammonium fumarate, bistetrabutylammonium citraconate, bistetrabutylammonium citrate, bistetrabutylammonium carbonate, trimethylphenylammonium formate, trimethylphenylammonium acetate, trimethylphenylammonium propionate, trimethylphenylammonium butanoate, trimethylphenylammonium benzoate, trimethylphenylammonium phthalate, trimethylphenylammonium isophthalate, trimethylphenylammonium terephthalate, trimethylphenylammonium salicylate, trimethylphenylammonium trifluoromethanesulfonate, trimethylphenylammonium trifluoroacetate, trimethylphenylammonium monochloroacetate, trimethylphenylammonium dichloroacetate, trimethylphenylammonium trichloroacetate, trimethylphenylammonium hydroxide, trimethylphenylammonium nitrate, trimethylphenylammonium chloride, trimethylphenylammonium bromide, trimethylphenylammonium iodide, trimethylphenylammonium methanesulfonate, trimethylphenylammonium monomethylsulfate, trimethylphenylammonium oxalate, trimethylphenylammonium malonate, trimethylphenylammonium maleate, trimethylphenylammonium fumarate, trimethylphenylammonium citraconate, trimethylphenylammonium citrate, trimethylphenylammonium carbonate, bistrimethylphenylammonium oxalate, bistrimethylphenylammonium malonate, bistrimethylphenylammonium maleate, bistrimethylphenylammonium fumarate, bistrimethylphenylammonium citraconate, bistrimethylphenylammonium citrate, bistrimethylphenylammonium carbonate, triethylphenylammonium formate, triethylphenylammonium acetate, triethylphenylammonium propionate, triethylphenylammonium butanoate, triethylphenylammonium benzoate, triethylphenylammonium phthalate, triethylphenylammonium isophthalate, triethylphenylammonium terephthalate, triethylphenylammonium salicylate, triethylphenylammonium trifluoromethanesulfonate, triethylphenylammonium trifluoroacetate, triethylphenylammonium monochloroacetate, triethylphenylammonium dichloroacetate, triethylphenylammonium trichloroacetate, triethylphenylammonium hydroxide, triethylphenylammonium nitrate, triethylphenylammonium chloride, triethylphenylammonium bromide, triethylphenylammonium iodide, triethylphenylammonium methanesulfonate, triethylphenylammonium monomethylsulfate, triethylphenylammonium oxalate, triethylphenylammonium malonate, triethylphenylammonium maleate, triethylphenylammonium fumarate, triethylphenylammonium citraconate, triethylphenylammonium citrate, triethylphenylammonium carbonate, bistriethylphenylammonium oxalate, bistriethylphenylammonium malonate, bistriethylphenylammonium maleate, bistriethylphenylammonium fumarate, bistriethylphenylammonium citraconate, bistriethylphenylammonium citrate, bistriethylphenylammonium carbonate, benzyldimethylphenylammonium formate, benzyldimethylphenylammonium acetate, benzyldimethylphenylammonium propionate, benzyldimethylphenylammonium butanoate, benzyldimethylphenylammonium benzoate, benzyldimethylphenylammonium phthalate, benzyldimethylphenylammonium isophthalate, benzyldimethylphenylammonium terephthalate, benzyldimethylphenylammonium salicylate, benzyldimethylphenylammonium trifluoromethanesulfonate, benzyldimethylphenylammonium trifluoroacetate, benzyldimethylphenylammonium monochloroacetate, benzyldimethylphenylammonium dichloroacetate, benzyldimethylphenylammonium trichloroacetate, benzyldimethylphenylammonium hydroxide, benzyldimethylphenylammonium nitrate, benzyldimethylphenylammonium chloride, benzyldimethylphenylammonium bromide, benzyldimethylphenylammonium iodide, benzyldimethylphenylammonium methanesulfonate, benzyldimethylphenylammonium monomethylsulfate, benzyldimethylphenylammonium oxalate, benzyldimethylphenylammonium malonate, benzyldimethylphenylammonium maleate, benzyldimethylphenylammonium fumarate, benzyldimethylphenylammonium citraconate, benzyldimethylphenylammonium citrate, benzyldimethylphenylammonium carbonate, bisbenzyldimethylphenylammonium oxalate, bisbenzyldimethylphenylammonium malonate, bisbenzyldimethylphenylammonium maleate, bisbenzyldimethylphenylammonium fumarate, bisbenzyldimethylphenylammonium citraconate, bisbenzyldimethylphenylammonium citrate, bisbenzyldimethylphenylammonium carbonate, and the like.

Examples of the alkaline metal salt include lithium formate, lithium acetate, lithium propionate, lithium butanoate, lithium benzoate, lithium phthalate, lithium isophthalate, lithium terephthalate, lithium salicylate, lithium trifluoromethanesulfonate, lithium trifluoroacetate, lithium monochloroacetate, lithium dichloroacetate, lithium trichloroacetate, lithium hydroxide, lithium nitrate, lithium chloride, lithium bromide, lithium iodide, lithium methanesulfonate, lithium hydrogen oxalate, lithium hydrogen malonate, lithium hydrogen maleate, lithium hydrogen fumarate, lithium hydrogen citraconate, lithium hydrogen citrate, lithium hydrogen carbonate, lithium oxalate, lithium malonate, lithium maleate, lithium fumarate, lithium citraconate, lithium citrate, lithium carbonate, sodium formate, sodium acetate, sodium propionate, sodium butanoate, sodium benzoate, sodium phthalate, sodium isophthalate, sodium terephthalate, sodium salicylate, sodium trifluoromethanesulfonate, sodium trifluoroacetate, sodium monochloroacetate, sodium dichloroacetate, sodium trichloroacetate, sodium hydroxide, sodium nitrate, sodium chloride, sodium bromide, sodium iodide, sodium methanesulfonate, sodium hydrogen oxalate, sodium hydrogen malonate, sodium hydrogen maleate, sodium hydrogen fumarate, sodium hydrogen citraconate, sodium hydrogen citrate, sodium hydrogen carbonate, sodium oxalate, sodium malonate, sodium maleate, sodium fumarate, sodium citraconate, sodium citrate, sodium carbonate, potassium formate, potassium acetate, potassium propionate, potassium butanoate, potassium benzoate, potassium phthalate, potassium isophthalate, potassium terephthalate, potassium salicylate, potassium trifluoromethanesulfonate, potassium trifluoroacetate, potassium monochloroacetate, potassium dichloroacetate, potassium trichloroacetate, potassium hydroxide, potassium nitrate, potassium chloride, potassium bromide, potassium iodide, potassium methanesulfonate, potassium hydrogen oxalate, potassium hydrogen malonate, potassium hydrogen maleate, potassium hydrogen fumarate, potassium hydrogen citraconate, potassium hydrogen citrate, potassium hydrogen carbonate, potassium oxalate, potassium malonate, potassium maleate, potassium fumarate, potassium citraconate, potassium citrate, potassium carbonate, and the like.

In the present invention, a thermosetting polysiloxane (Xc-10) having a structure containing one of the ammonium salt, the sulfonium salt, the phosphonium salt, and the iodonium salt as a part can be given as an example of a curing catalyst (Xc).

As a raw material for producing (Xc-10) used here, it is possible to employ a compound shown by the following general formula (Xm):

$$R^{1A}_{A1}R^{2A}_{A2}R^{3A}_{A3}Si(OR^{OA})_{(4-A1-A2-A3)} \quad \text{(Xm)}$$

where $R^{OA}$ represents a hydrocarbon group having 1 to 6 carbon atoms; at least one of $R^{1A}$, $R^{2A}$, and $R^{3A}$ represents an organic group having the ammonium salt, the sulfonium salt, the phosphonium salt, or the iodonium salt; the other(s) of $R^{1A}$, $R^{2A}$, and $R^{3A}$ represent a hydrogen atom or a monovalent organic group having 1 to 30 carbon atoms; and A1, A2, and A3 each represent 0 or 1, given that $1 \leq A1+A2+A3 \leq 3$.

An example of Xm includes the following general formula (Xm-1), which shows a hydrolysable silicon compound having a structure containing the sulfonium salt as a part:

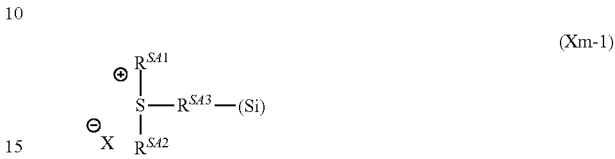

(Xm-1)

where $R^{SA1}$ and $R^{SA2}$ each represents a monovalent organic group such as a linear, branched, or cyclic alkyl group, alkenyl group, oxoalkyl group, or oxoalkenyl group having 1 to 20 carbon atoms, a substituted or unsubstituted aryl group having 6 to 20 carbon atoms, or an aralkyl group or aryloxyalkyl group having 7 to 20 carbon atoms; some or all of hydrogen atoms of these groups are optionally substituted with an alkoxy group, an amino group, an alkylamino group, a halogen atom, or the like. Moreover, $R^{SA1}$ and $R^{SA2}$ may form a ring together with a sulfur atom bonded to $R^{SA1}$ and $R^{SA2}$; when a ring is formed, $R^{SA1}$ and $R^{SA2}$ each represent an alkylene group having 1 to 6 carbon atoms. $R^{SA3}$ represents a divalent organic group such as a linear, branched, or cyclic alkylene group or alkenylene group having 1 to 20 carbon atoms, or a substituted or unsubstituted arylene group having 6 to 20 carbon atoms; some or all of hydrogen atoms of these groups are optionally substituted with an alkoxy group, an amino group, an alkylamino group, or the like.

Should be noted that in the general formula (Xm-1), (Si) shows the bonding portion with Si.

Examples of $X^-$ include hydroxide ion, fluoride ion, chloride ion, bromide ion, iodide ion, formate ion, acetate ion, propionate ion, butanoate ion, pentanoate ion, hexanoate ion, heptanoate ion, octanoate ion, nonanoate ion, decanoate ion, oleate ion, stearate ion, linoleate ion, linolenate ion, benzoate ion, p-methylbenzoate ion, p-t-butylbenzoate ion, phthalate ion, isophthalate ion, terephthalate ion, salicylate ion, trifluoroacetate ion, monochloroacetate ion, dichloroacetate ion, trichloroacetate ion, nitrate ion, chlorate ion, perchlorate ion, bromate ion, iodate ion, methanesulfonate ion, benzenesulfonate ion, toluenesulfonate ion, monomethylsulfate ion, hydrogen sulfate ion, oxalate ion, malonate ion, methylmalonate ion, ethylmalonate ion, propylmalonate ion, butylmalonate ion, dimethylmalonate ion, diethylmalonate ion, succinate ion, methylsuccinate ion, glutarate ion, adipate ion, itaconate ion, maleate ion, fumarate ion, citraconate ion, citrate ion, carbonate ion, and the like.

Specifically, the following ions can be given as examples of cation moieties of a compound shown by the general formula (Xm-1).

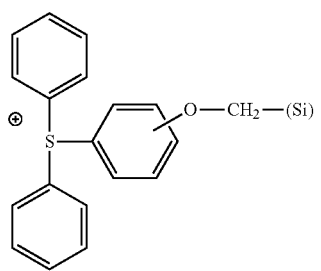
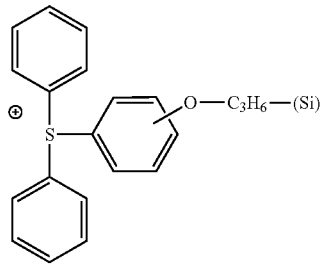
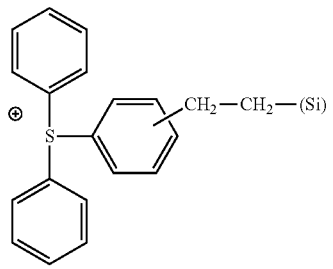
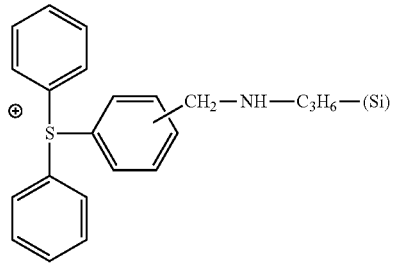
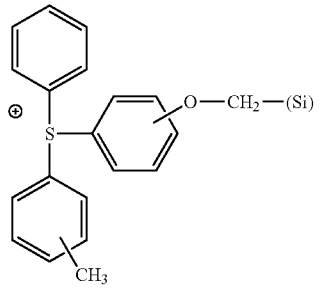
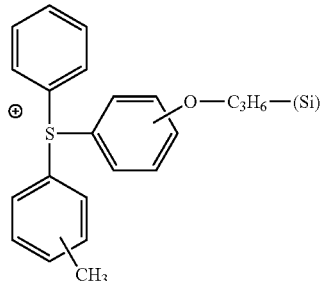
-continued
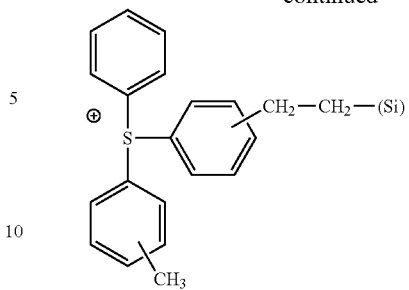
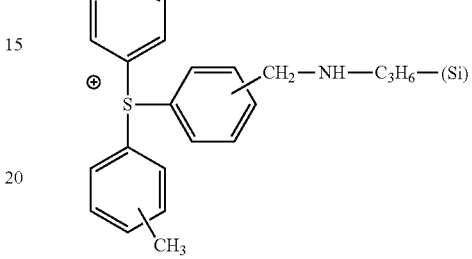
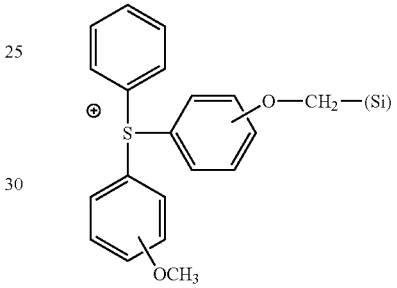
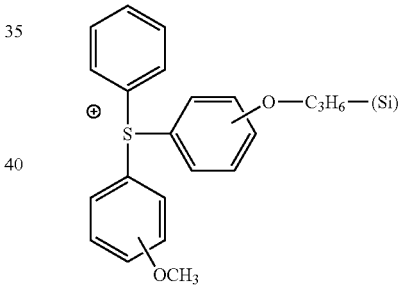
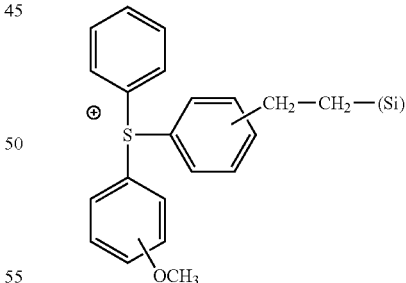
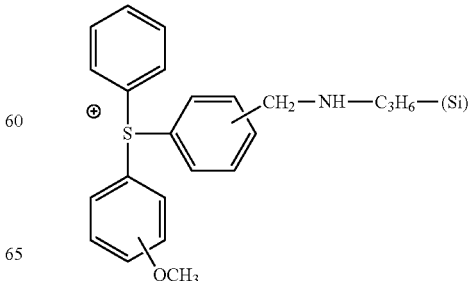

-continued

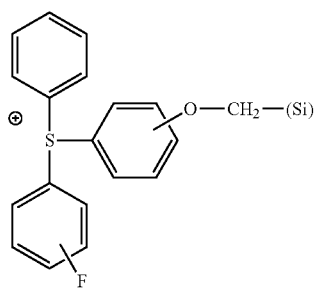

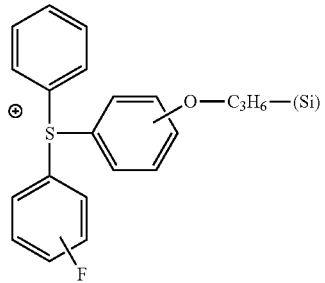

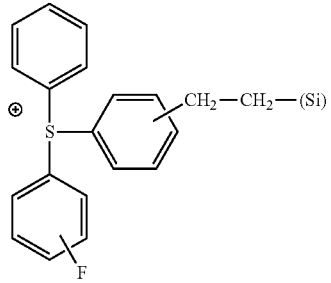

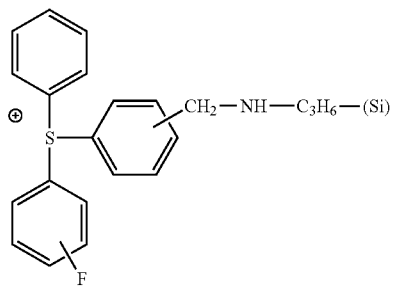

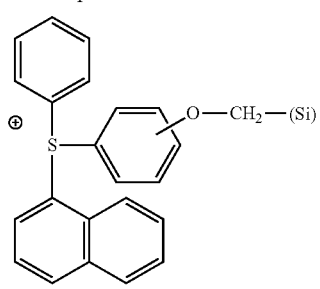

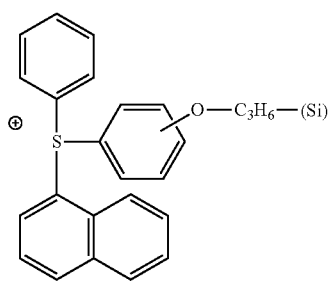

-continued

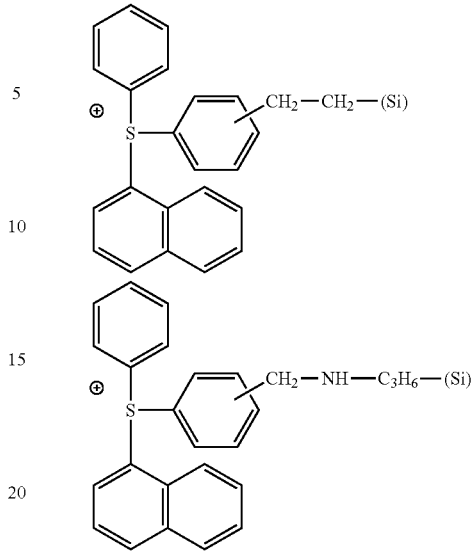

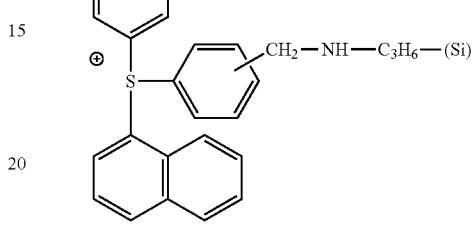

For example, a hydrolysable silicon compound having a structure containing the iodonium salt as a part can be shown by the following general formula (Xm-2):

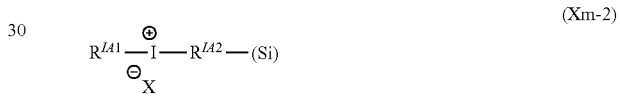

where $R^{IA1}$ represents a monovalent organic group such as a linear, branched, or cyclic alkyl group, alkenyl group, oxoalkyl group, or oxoalkenyl group having 1 to 20 carbon atoms, a substituted or unsubstituted aryl group having 6 to 20 carbon atoms, or an aralkyl group or aryloxoalkyl group having 7 to 20 carbon atoms; some or all of hydrogen atoms of this group are optionally substituted with an alkoxy group, an amino group, an alkylamino group, a halogen atom, or the like. $R^{IA2}$ represents a divalent organic group such as a linear, branched, or cyclic alkylene group or alkenylene group having 1 to 20 carbon atoms, or a substituted or unsubstituted arylene group having 6 to 20 carbon atoms; some or all of hydrogen atoms of these groups are optionally substituted with an alkoxy group, an amino group, an alkylamino group, or the like.

Should be noted that in the general formula (Xm-2), (Si) shows the bonding portion with Si. $X^-$ is as described above.

Specifically, the following ions can be given as examples of cation moiety of a compound shown by the general formula (Xm-2).

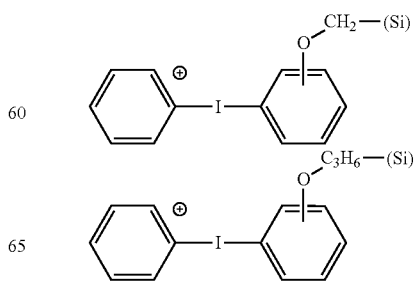

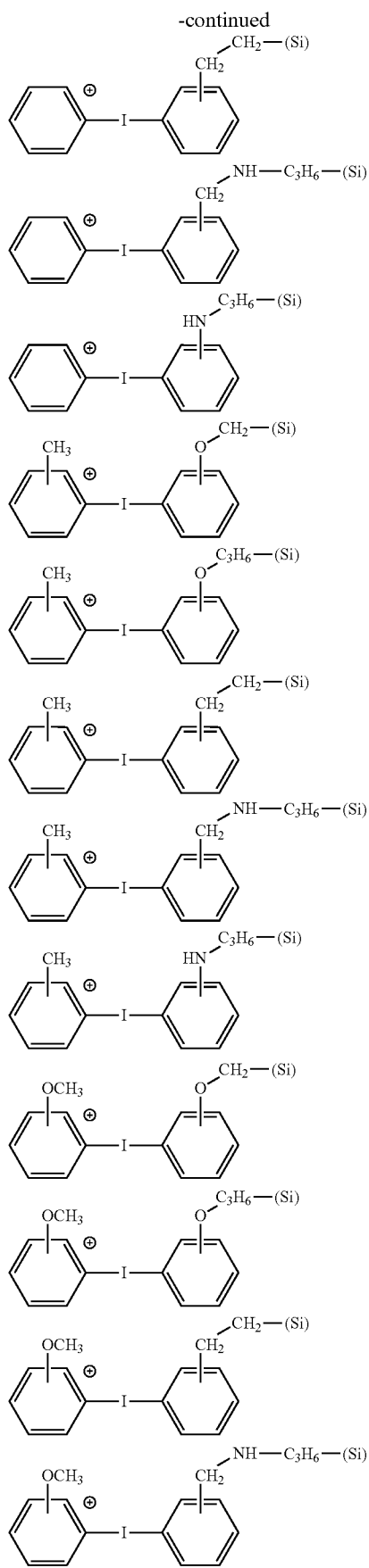
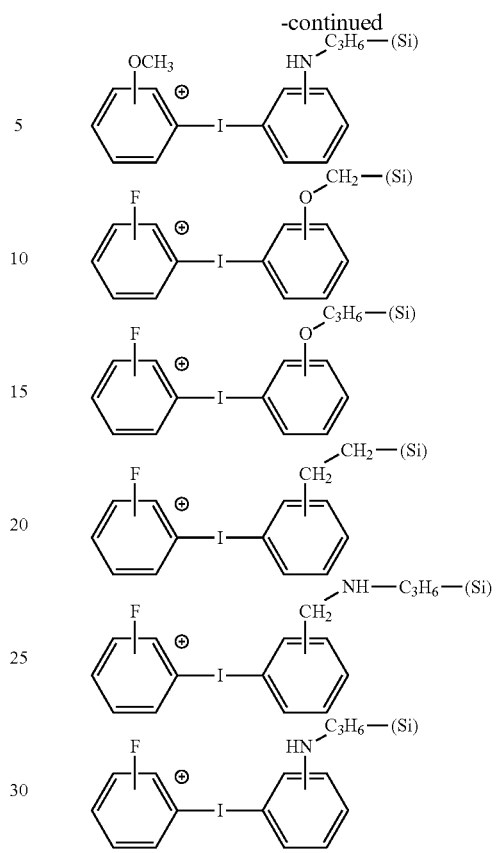

For example, a hydrolysable silicon compound having a structure containing the phosphonium salt as a part can be shown by the following general formula (Xm-3):

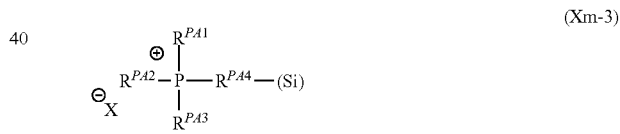

where $R^{PA1}$, $R^{PA2}$, and $R^{PA3}$ each represent a linear, branched, or cyclic alkyl group, alkenyl group, oxoalkyl group, or oxoalkenyl group having 1 to 20 carbon atoms, a substituted or unsubstituted aryl group having 6 to 20 carbon atoms, or an aralkyl group or aryloxoalkyl group having 7 to 20 carbon atoms; some or all of hydrogen atoms of these groups are optionally substituted with an alkoxy group, an amino group, an alkylamino group, a halogen atom, or the like. Moreover, $R^{PA1}$ and $R^{PA2}$ may form a ring together with a phosphorus atom bonded to $R^{PA1}$ and $R^{PA2}$; when a ring is formed, $R^{PA1}$ and $R^{PA2}$ each represent an alkylene group having 1 to 6 carbon atoms. $R^{PA4}$ represents a linear, branched, or cyclic alkylene group or alkenylene group having 1 to 20 carbon atoms, or a substituted or unsubstituted arylene group having 6 to 20 carbon atoms; some or all of hydrogen atoms of these groups are optionally substituted with an alkoxy group, an amino group, an alkylamino group, or the like.

Should be noted that in the general formula (Xm-3), (Si) shows the bonding portion with Si. $X^-$ is as described above.

Specifically, the following ions can be given as examples of cation moieties of a compound shown by the general formula (Xm-3).

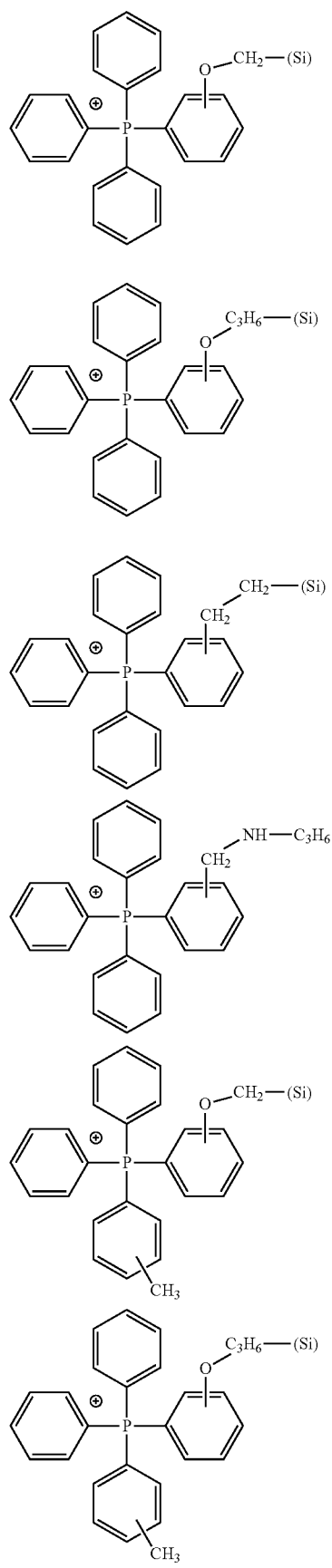
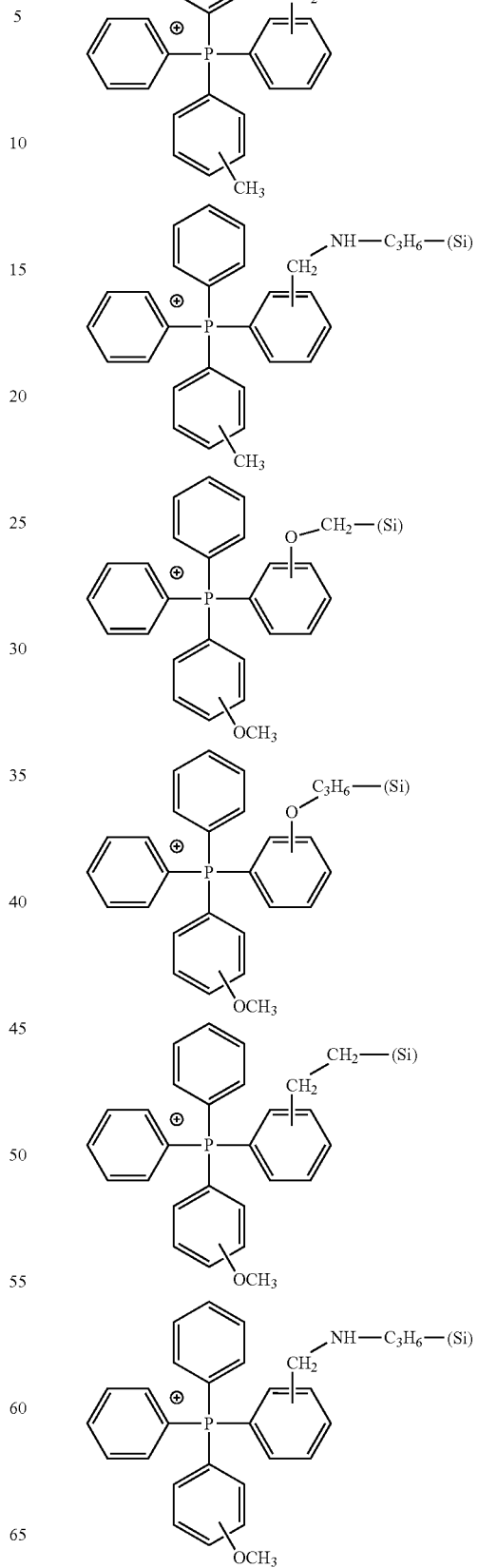

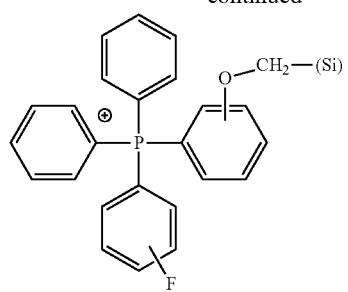
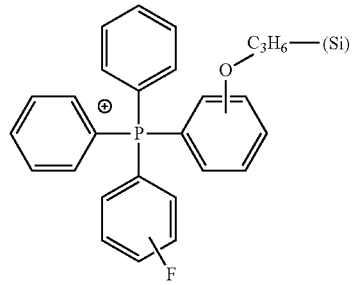
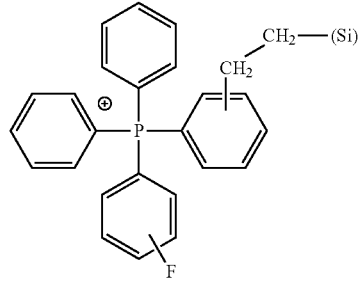
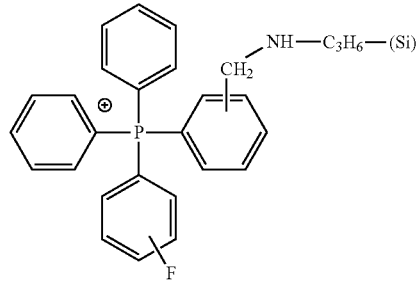
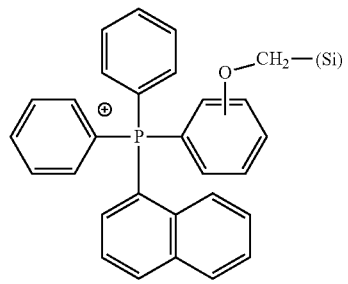
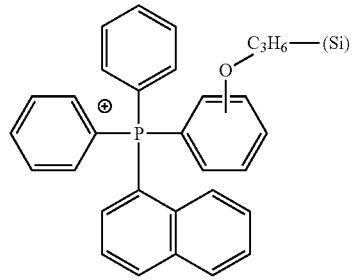
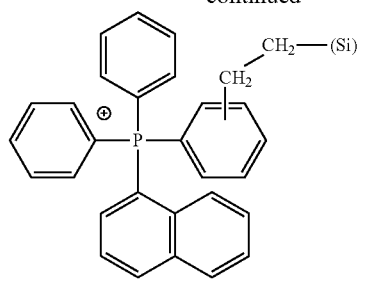
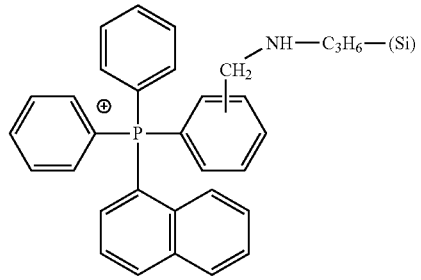
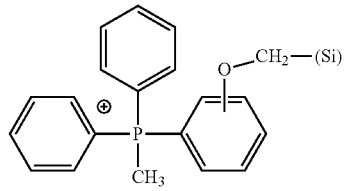
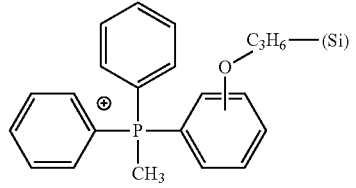
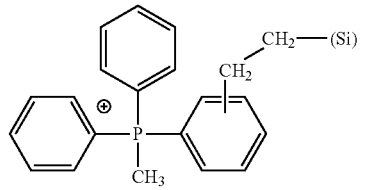
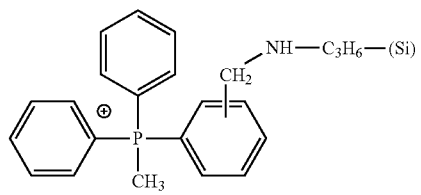
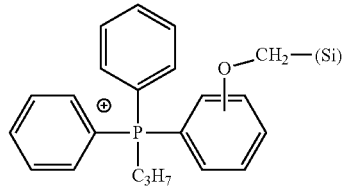
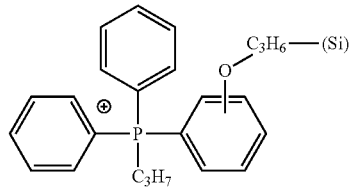

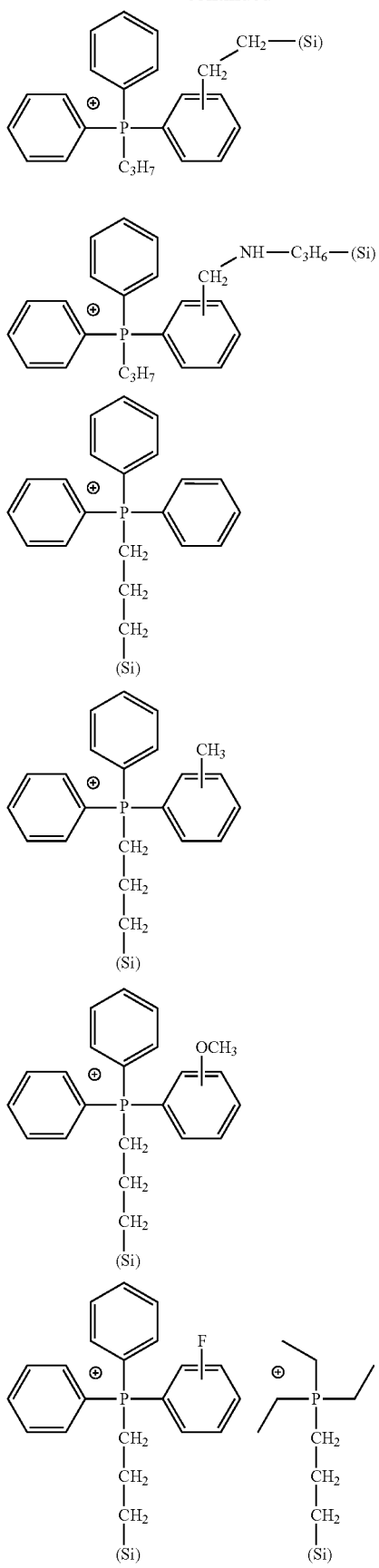
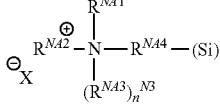

For example, a hydrolysable silicon compound having a structure containing the ammonium salt as a part can be shown by the following general formula (Xm-4):

$$\overset{\ominus}{X} \quad R^{NA2}-\overset{R^{NA1}}{\underset{(R^{NA3})_{n^{N3}}}{\overset{\oplus}{N}}}-R^{NA4}-(Si) \quad (\text{Xm-4})$$

where $R^{NA1}$, $R^{NA2}$, and $R^{NA3}$ each represent hydrogen, or a monovalent organic group such as a linear, branched, or cyclic alkyl group, alkenyl group, oxoalkyl group, or oxoalkenyl group having 1 to 20 carbon atoms, a substituted or unsubstituted aryl group having 6 to 20 carbon atoms, or an aralkyl group or aryloxyalkyl group having 7 to 20 carbon atoms; some or all of hydrogen atoms of these groups are optionally substituted with an alkoxy group, an amino group, an alkylamino group, or the like. Moreover, $R^{NA1}$ and $R^{NA2}$ may form a ring together with a nitrogen atom bonded to $R^{NA1}$ and $R^{NA2}$; when a ring is formed, $R^{NA1}$ and $R^{NA2}$ each represent an alkylene group having 1 to 6 carbon atoms or a heterocyclic ring or heteroaromatic ring containing nitrogen. $R^{NA4}$ represents a divalent organic group such as a linear, branched, or cyclic alkylene group or alkenylene group having 1 to 20 carbon atoms, or a substituted or unsubstituted arylene group having 6 to 20 carbon atoms; some or all of hydrogen atoms of these groups are optionally substituted with an alkoxy group, an amino group, an alkylamino group, or the like. In the case where $R^{NA1}$ and $R^{NA2}$, or $R^{NA1}$ and $R^{NA4}$, form a cyclic structure which further contains unsaturated nitrogen, $n^{N3}=0$; in the other cases, $n^{N3}=1$.

Should be noted that in the general formula (Xm-4), (Si) shows the bonding portion with Si. $X^-$ is as described above.

Specifically, the following ions can be given as examples of cation moieties of a compound shown by the general formula (Xm-4).

$(CH_3)_3N^{\oplus}-CH_2-(Si)$    $(CH_3)_2(C_2H_5)N^{\oplus}-CH_2-(Si)$ $(CH_3)_2(C_3H_7)N^{\oplus}-CH_2-(Si)$    $(CH_3)_2(C_4H_9)N^{\oplus}-CH_2-(Si)$ $(CH_3)_2(C_5H_{11})N^{\oplus}-CH_2-(Si)$    $(CH_3)_2(C_6H_{13})N^{\oplus}-CH_2-(Si)$ $(CH_3)_2(C_7H_{15})N^{\oplus}-CH_2-(Si)$    $(CH_3)_2(C_8H_{17})N^{\oplus}-CH_2-(Si)$ $(CH_3)_2(C_9H_{19})N^{\oplus}-CH_2-(Si)$    $(CH_3)_2(C_{10}H_{21})N^{\oplus}-CH_2-(Si)$ $(CH_3)_2(C_{11}H_{23})N^{\oplus}-CH_2-(Si)$    $(CH_3)_2(C_{12}H_{25})N^{\oplus}-CH_2-(Si)$ $(CH_3)_2(C_{13}H_{27})N^{\oplus}-CH_2-(Si)$    $(CH_3)_2(C_{14}H_{29})N^{\oplus}-CH_2-(Si)$ $(CH_3)_2(C_{15}H_{31})N^{\oplus}-CH_2-(Si)$    $(CH_3)_2(C_{16}H_{33})N^{\oplus}-CH_2-(Si)$ $(CH_3)_2(C_{17}H_{35})N^{\oplus}-CH_2-(Si)$    $(CH_3)_2(C_{18}H_{37})N^{\oplus}-CH_2-(Si)$ $(CH_3)_2(C_{19}H_{39})N^{\oplus}-CH_2-(Si)$    $(CH_3)_2(C_{20}H_{41})N^{\oplus}-CH_2-(Si)$ $(CH_3)_3N^{\oplus}-C_3H_6-(Si)$    $(CH_3)_2(C_2H_5)N^{\oplus}-C_3H_6-(Si)$ $(CH_3)_2(C_3H_7)N^{\oplus}-C_3H_6-(Si)$    $(CH_3)_2(C_4H_9)N^{\oplus}-C_3H_6-(Si)$ $(CH_3)_2(C_5H_{11})N^{\oplus}-C_3H_6-(Si)$    $(CH_3)_2(C_6H_{13})N^{\oplus}-C_3H_6-(Si)$ $(CH_3)_2(C_7H_{15})N^{\oplus}-C_3H_6-(Si)$    $(CH_3)_2(C_8H_{17})N^{\oplus}-C_3H_6-(Si)$ $(CH_3)_2(C_9H_{19})N^{\oplus}-C_3H_6-(Si)$    $(CH_3)_2(C_{10}H_{21})N^{\oplus}-C_3H_6-(Si)$ $(CH_3)_2(C_{11}H_{23})N^{\oplus}-C_3H_6-(Si)$    $(CH_3)_2(C_{12}H_{25})N^{\oplus}-C_3H_6-(Si)$ $(CH_3)_2(C_{13}H_{27})N^{\oplus}-C_3H_6-(Si)$    $(CH_3)_2(C_{14}H_{29})N^{\oplus}-C_3H_6-(Si)$ $(CH_3)_2(C_{15}H_{31})N^{\oplus}-C_3H_6-(Si)$    $(CH_3)_2(C_{16}H_{33})N^{\oplus}-C_3H_6-(Si)$ $(CH_3)_2(C_{17}H_{35})N^{\oplus}-C_3H_6-(Si)$    $(CH_3)_2(C_{18}H_{37})N^{\oplus}-C_3H_6-(Si)$ $(CH_3)_2(C_{19}H_{39})N^{\oplus}-C_3H_6-(Si)$    $(CH_3)_2(C_{20}H_{41})N^{\oplus}-C_3H_6-(Si)$ $(CH_3)(C_2H_5)_2N^{\oplus}-CH_2-(Si)$    $(CH_3)(C_3H_7)_2N^{\oplus}-CH_2-(Si)$ $(CH_3)(C_4H_9)_2N^{\oplus}-CH_2-(Si)$    $(CH_3)(C_5H_{11})_2N^{\oplus}-CH_2-(Si)$ $(CH_3)(C_6H_{13})_2N^{\oplus}-CH_2-(Si)$    $(CH_3)(C_7H_{15})_2N^{\oplus}-CH_2-(Si)$ $(CH_3)(C_8H_{17})_2N^{\oplus}-CH_2-(Si)$    $(CH_3)(C_9H_{19})_2N^{\oplus}-CH_2-(Si)$ $(CH_3)(C_{10}H_{21})_2N^{\oplus}-CH_2-(Si)$    $(CH_3)(C_{11}H_{23})_2N^{\oplus}-CH_2-(Si)$ $(CH_3)(C_{12}H_{25})_2N^{\oplus}-CH_2-(Si)$    $(CH_3)(C_{13}H_{27})_2N^{\oplus}-CH_2-(Si)$ $(CH_3)(C_{14}H_{29})_2N^{\oplus}-CH_2-(Si)$    $(CH_3)(C_{15}H_{31})_2N^{\oplus}-CH_2-(Si)$ $(CH_3)(C_{16}H_{33})_2N^{\oplus}-CH_2-(Si)$    $(CH_3)(C_{17}H_{35})_2N^{\oplus}-CH_2-(Si)$ $(CH_3)(C_{18}H_{37})_2N^{\oplus}-CH_2-(Si)$    $(CH_3)(C_{19}H_{39})_2N^{\oplus}-CH_2-(Si)$ $(CH_3)(C_{20}H_{41})_2N^{\oplus}-CH_2-(Si)$    $(CH_3)_2N^{\oplus}-C_4H_8-(Si)$

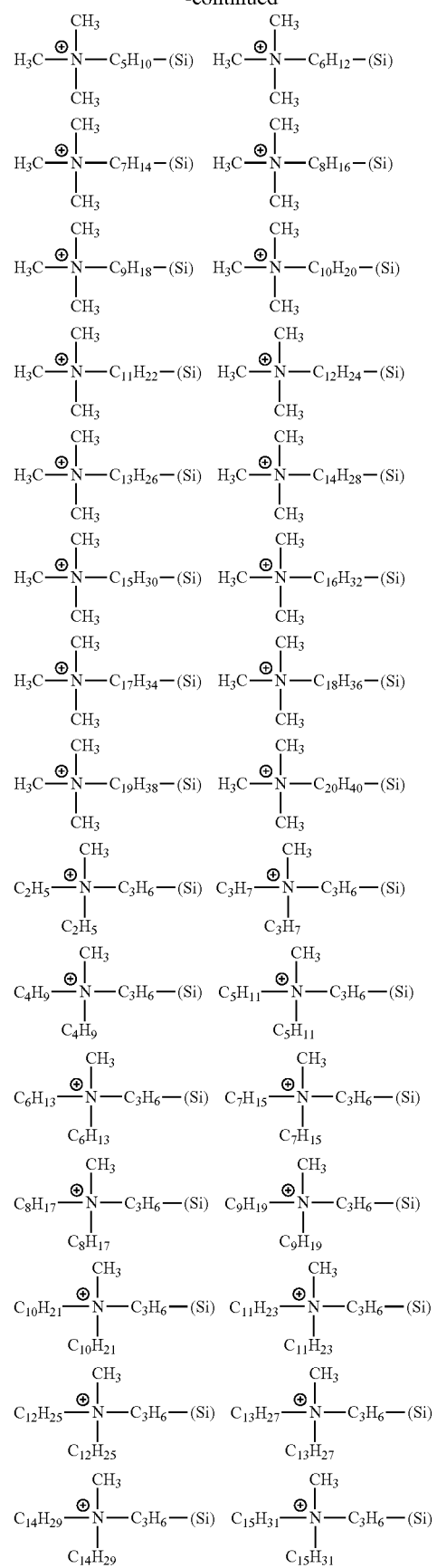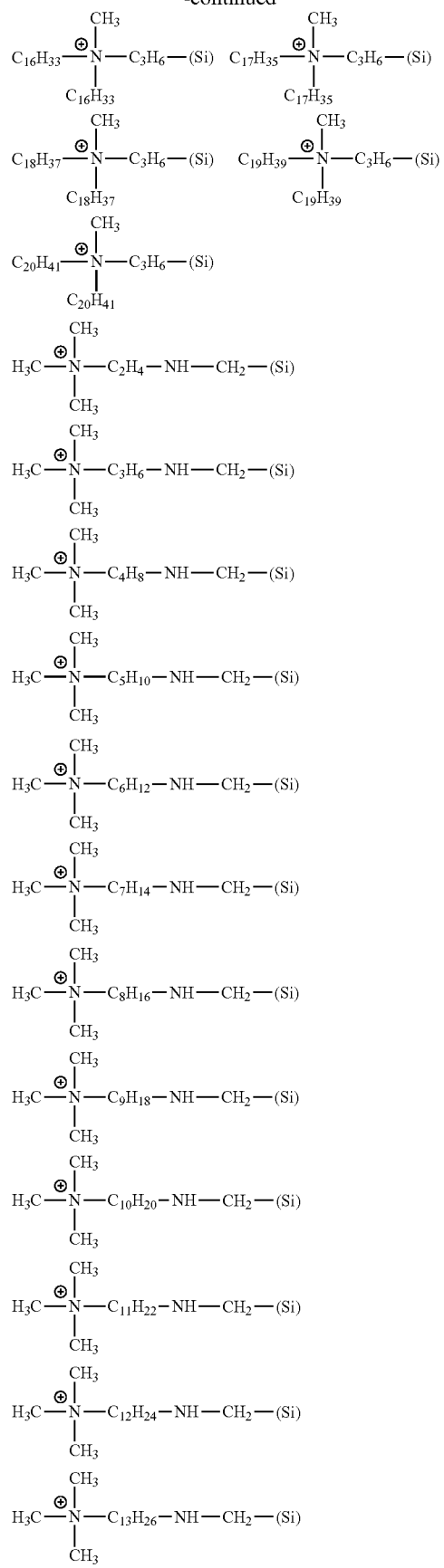

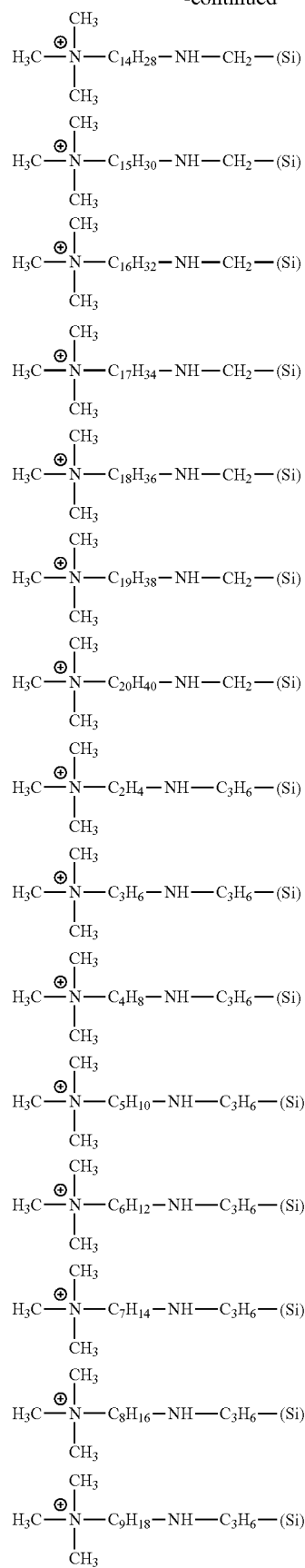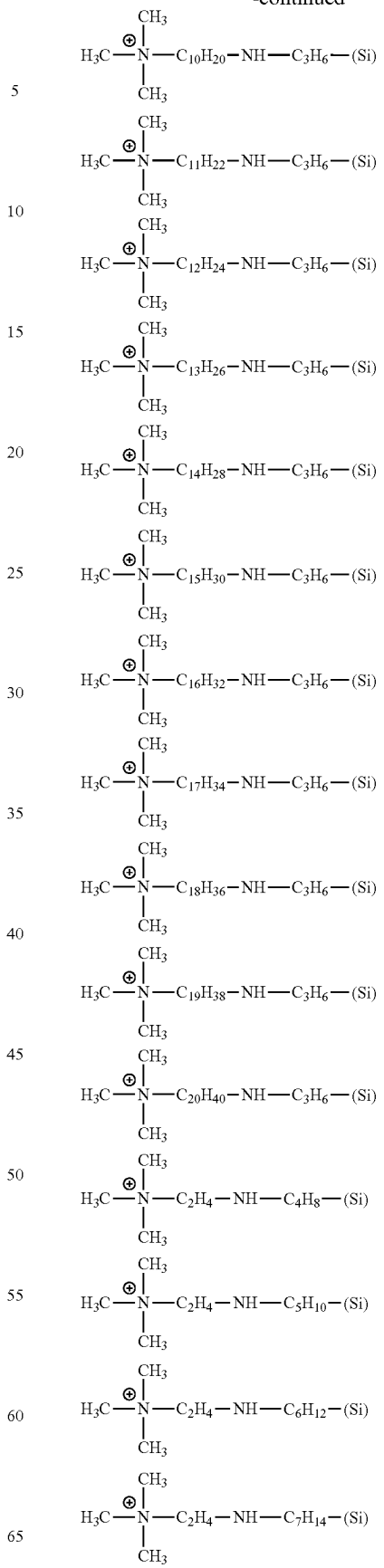

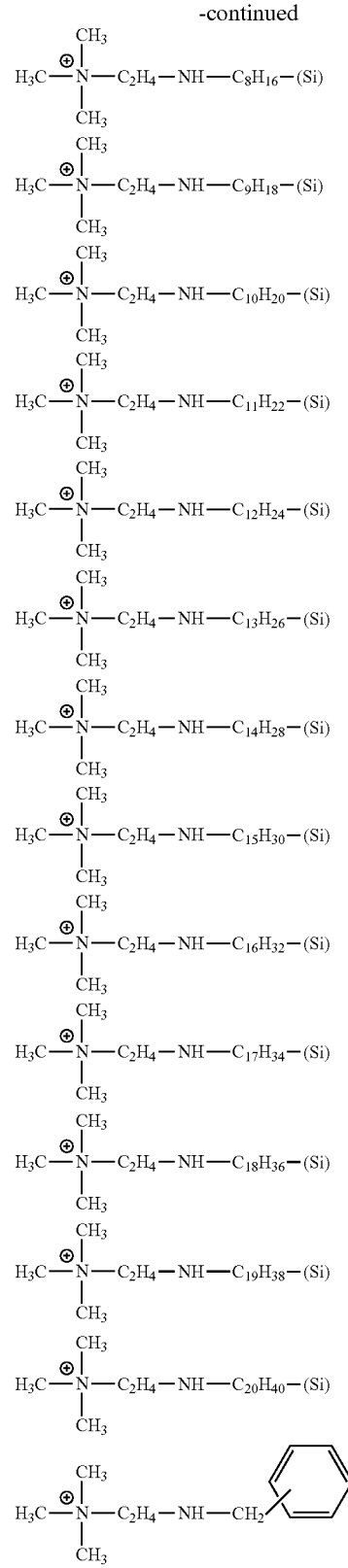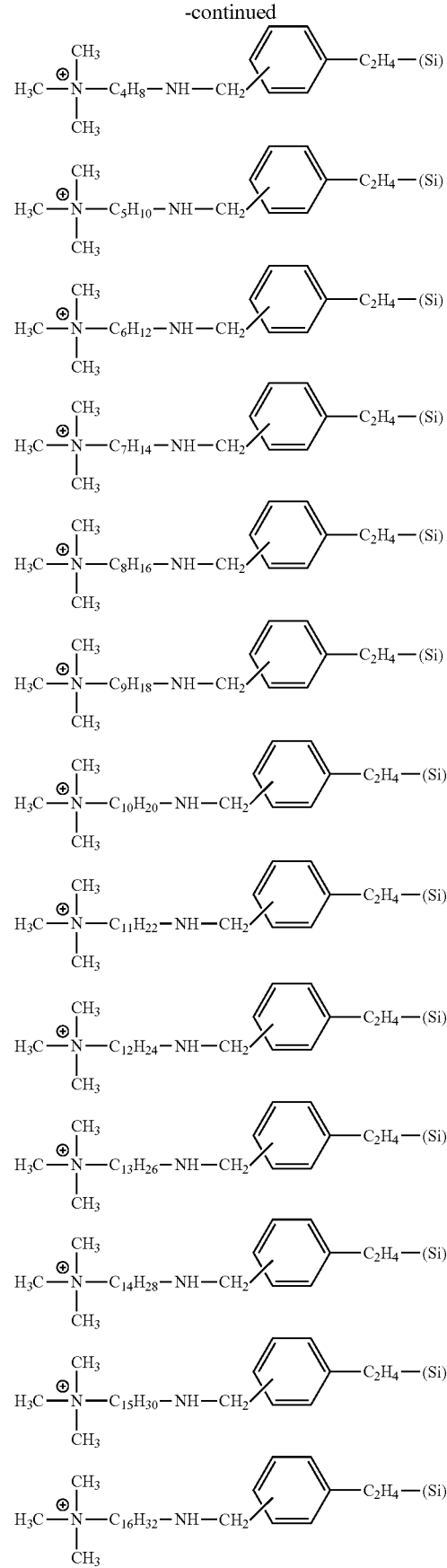

-continued

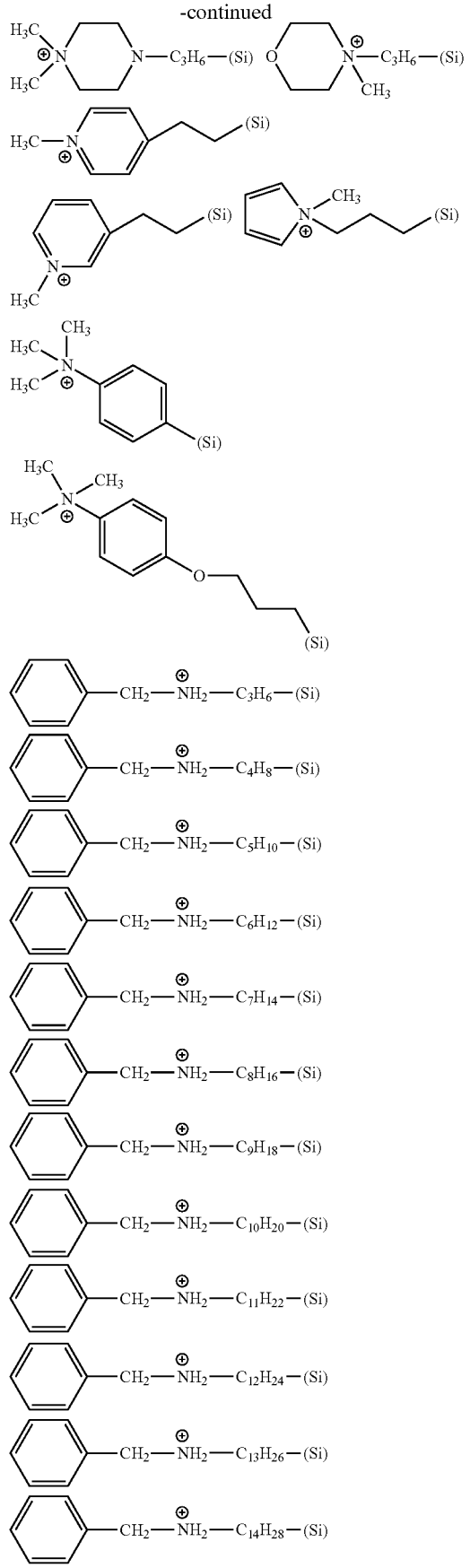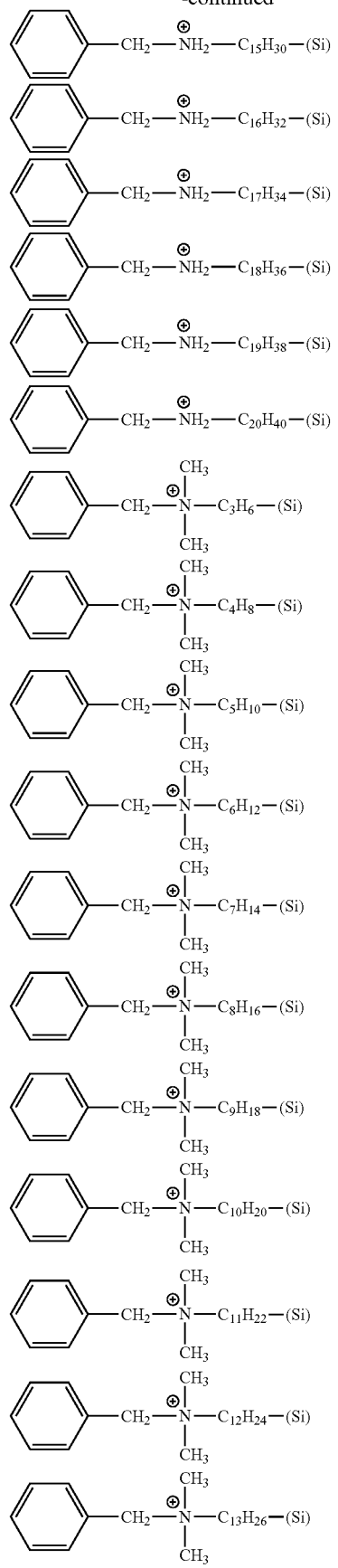

-continued
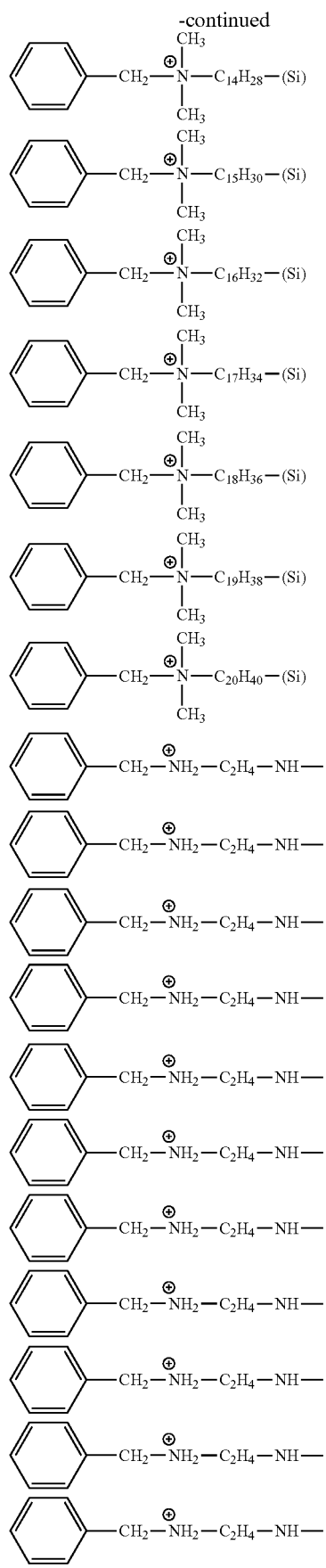
-continued
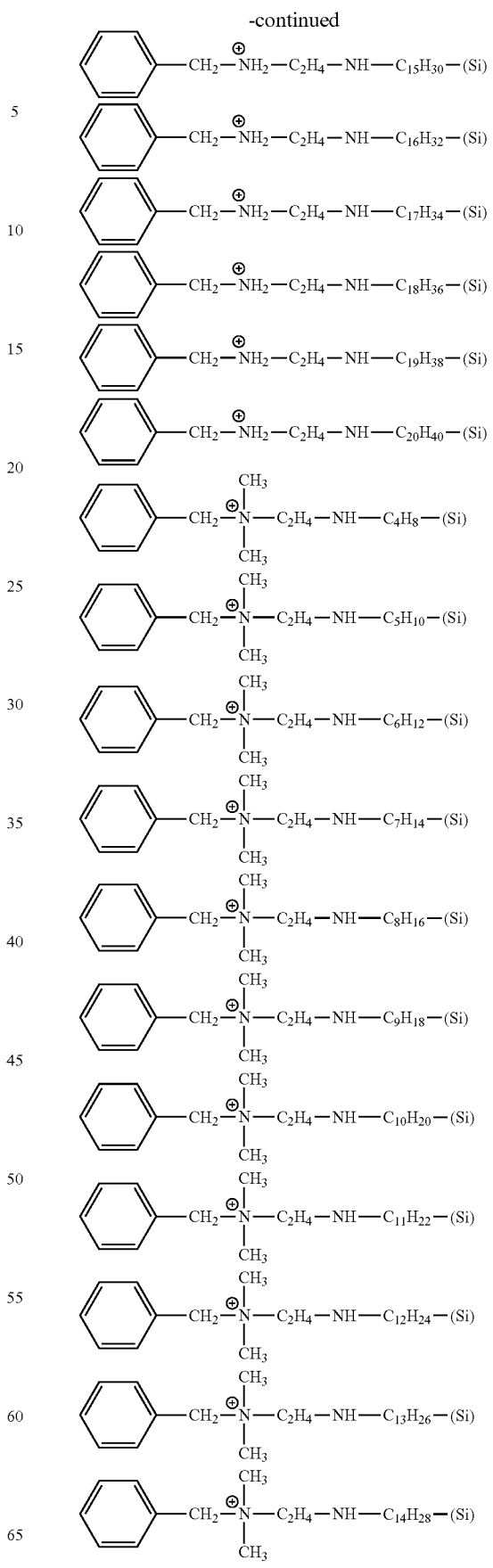

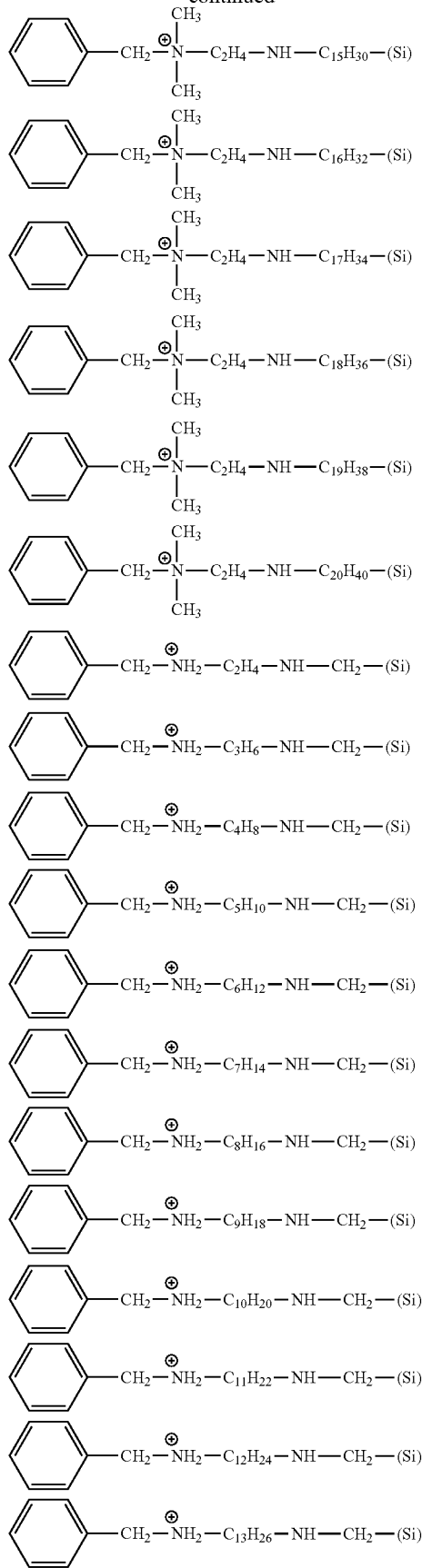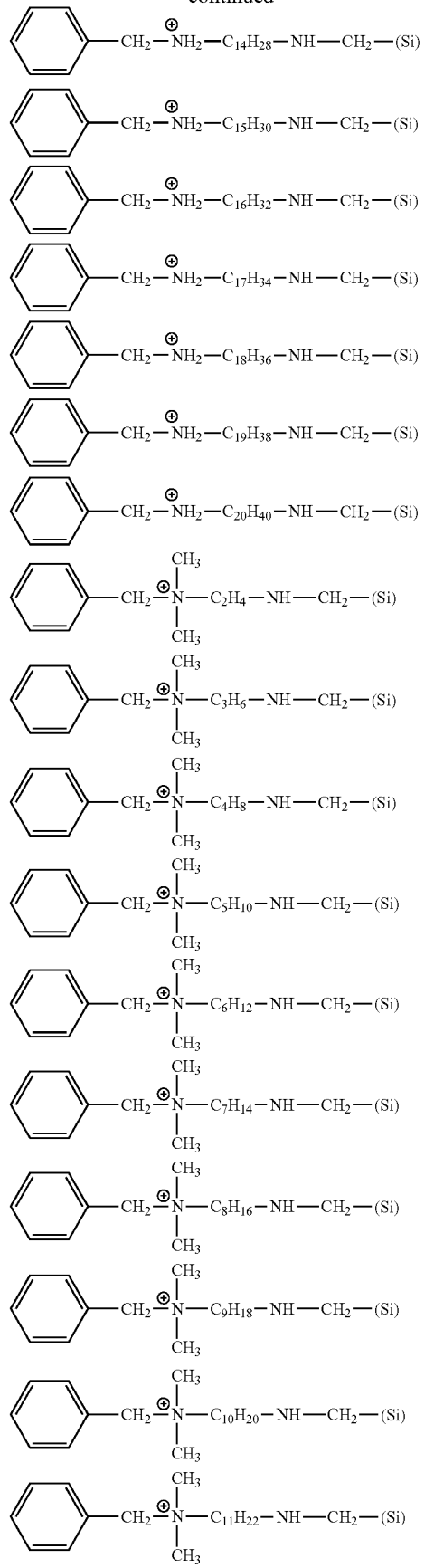

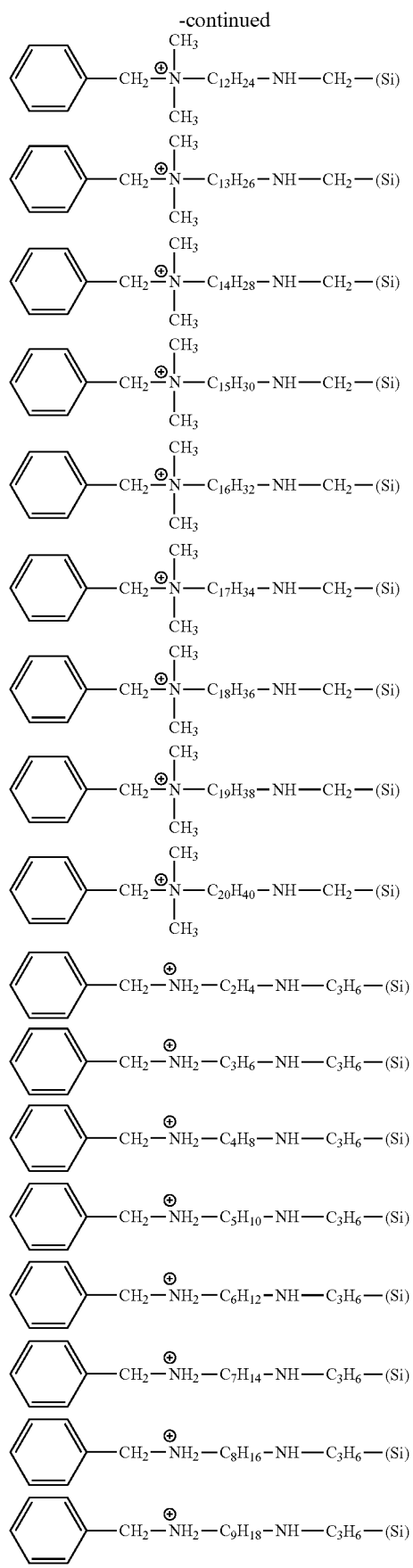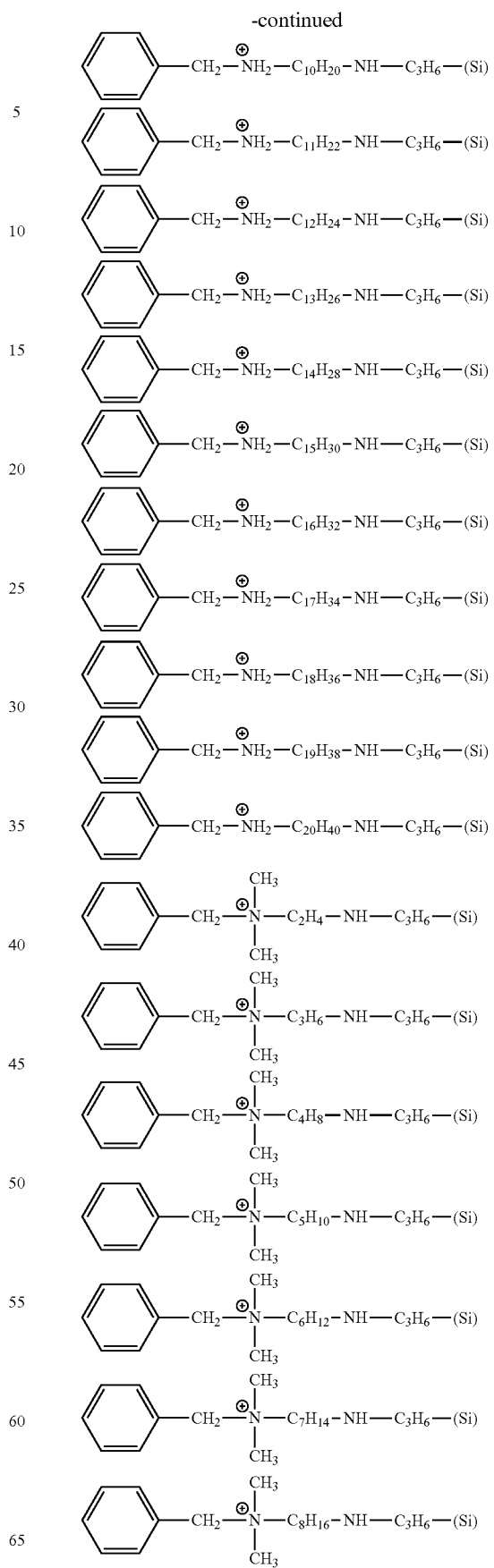

-continued

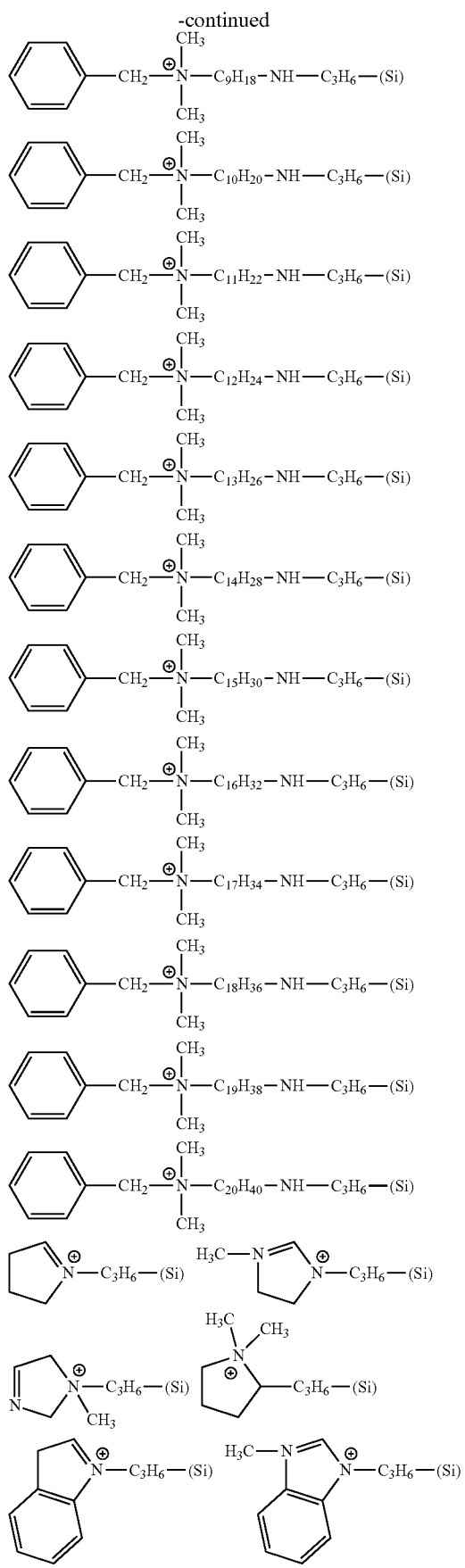

-continued

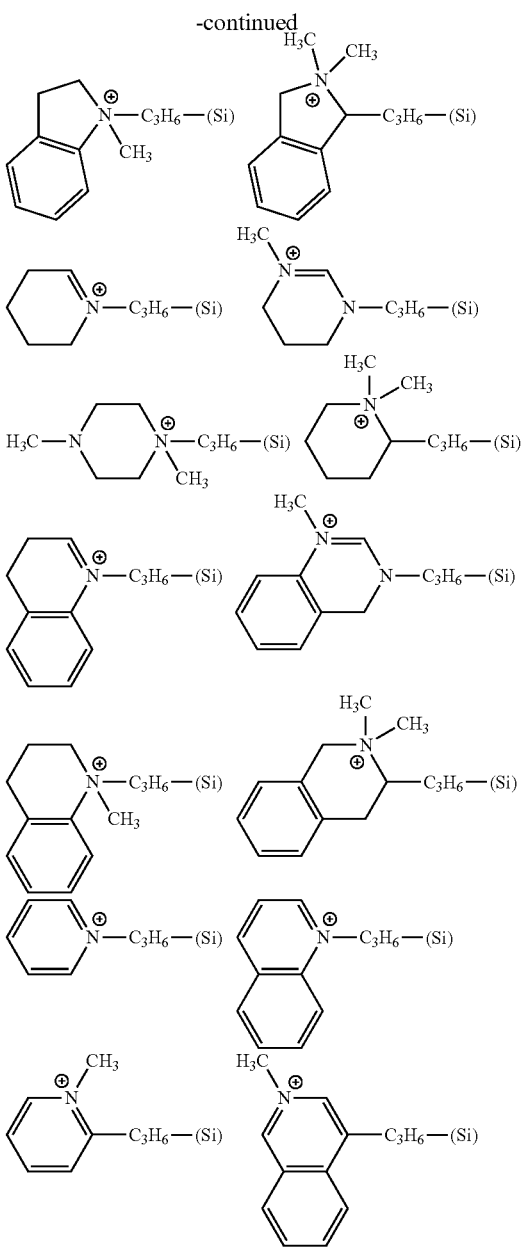

(Organic Solvent)

The inventive composition for forming a silicon-containing resist underlayer film contains a solvent. An alcohol-based solvent is preferable as the solvent, and more preferably monoalkyl ether derivatives of ethylene glycol, diethylene glycol, triethylene glycol, propylene glycol, dipropylene glycol, butanediol, or the like. Specifically, preferable examples thereof include butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, and the like.

When these solvents are used as the main component, a non-alcohol-based solvent can also be added as an auxiliary solvent. Examples of the auxiliary solvent include acetone, tetrahydrofuran, toluene, hexane, ethyl acetate, cyclohexanone, methyl amyl ketone, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, cyclopentyl methyl ether, and the like.

(Water)

Water may be added to the inventive composition for forming a silicon-containing resist underlayer film. When water is added, the polysiloxane compound in the composition is hydrated, so that the lithography performance is improved. The water content in the solvent component of the inventive composition for forming a silicon-containing resist underlayer film is preferably more than 0 mass % and less than 50 mass %, more preferably 0.3 to 30 mass %, further preferably 0.5 to 20 mass %. When the water content is less than 50 mass %, the uniformity of the silicon-containing resist underlayer film is favorable, and repelling does not occur.

(High-Boiling-Point Solvent)

Further, a high-boiling-point solvent having a boiling point of 180° C. or more can also be added to the inventive composition for forming a silicon-containing resist underlayer film as necessary. Examples of the high-boiling-point solvent include 1-octanol, 2-ethylhexanol, 1-nonanol, 1-decanol, 1-undecanol, ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, glycerin, gamma-butyrolactone, tripropylene glycol monomethyl ether, diacetone alcohol, n-nonyl acetate, ethylene glycol monoethyl ether acetate, 1,2-diacetoxyethane, 1-acetoxy-2-methoxyethane, 1,2-diacetoxypropane, diethylene glycol monomethyl ether acetate, diethylene glycol monoethyl ether acetate, diethylene glycol mono-n-butyl ether acetate, propylene glycol monomethyl ether acetate, propylene glycol monopropyl ether acetate, propylene glycol monobutyl ether acetate, dipropylene glycol monomethyl ether acetate, dipropylene glycol monoethyl ether acetate, and the like.

The solvent including water and the high-boiling-point solvent is used in a total amount of preferably 100 to 100,000 parts by mass, particularly preferably 200 to 50,000 parts by mass, based on 100 parts by mass of the thermosetting silicon-containing material (Sx).

[Other Components]

(Organic Acid)

To improve the stability of the inventive composition for forming a silicon-containing resist underlayer film, it is preferable to add a monovalent, divalent, or polyvalent organic acid having 1 to 30 carbon atoms. Examples of the acid added in this event include formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichloroacetic acid, oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, citric acid, and the like. Particularly, oxalic acid, maleic acid, formic acid, acetic acid, propionic acid, citric acid, and the like are preferable. Moreover, a mixture of two or more acids may be used to keep the stability. The amount of the acid to be added is preferably 0.001 to 25 parts by mass, more preferably 0.01 to 15 parts by mass, further preferably 0.1 to 5 parts by mass, based on 100 parts by mass of thermosetting silicon-containing material (Sx) contained in the composition.

Alternatively, the organic acid may be blended based on the pH of the composition so as to satisfy preferably $0 \leq pH \leq 7$, more preferably $0.3 \leq pH \leq 6.5$, further preferably $0.5 \leq pH \leq 6$.

(Photo-Acid Generator)

A photo-acid generator may be added to the inventive composition for forming a silicon-containing resist underlayer film. As the photo-acid generator used in the present invention, it is possible to add, specifically, the materials described in paragraphs (0160) to (0179) of JP 2009-126940 A.

(Stabilizer)

Further, a stabilizer can be added to the inventive composition for forming a silicon-containing resist underlayer film. As the stabilizer, a monohydric, dihydric, or polyhydric alcohol having cyclic ether substituent can be added. Particularly, adding stabilizers shown in paragraphs (0181) to (0182) of JP 2009-126940 A enables stability improvement of the composition for forming a silicon-containing resist underlayer film.

(Surfactant)

Further a surfactant can be blended into the inventive composition for forming a silicon-containing resist underlayer film as necessary. Specifically, the materials described in paragraph (0185) of JP 2009-126940 A can be added as the surfactant.

[Patterning Process]

The present invention can provide a patterning process (what is called "multilayer resist method") including the steps of: forming an organic underlayer film, by using a coating-type organic underlayer film material, on a body to be processed; forming a resist underlayer film on the organic underlayer film by using the composition for forming a silicon-containing resist underlayer film; forming a resist upper layer film on the silicon-containing resist underlayer film by using a composition for a resist upper layer film including a photoresist composition; forming a circuit pattern on the resist upper layer film; transferring the pattern to the resist underlayer film by etching using the resist upper layer film having the formed circuit pattern as a mask; transferring the pattern to the organic film by etching using the resist underlayer film having the transferred pattern as a mask; and transferring the pattern, by etching using the organic film having the transferred pattern as a mask, to the body to be processed.

In addition, the present invention can provide a patterning process (what is called "multilayer resist method") including the steps of: forming a hard mask including carbon as a main component by a CVD method on a body to be processed; forming a resist underlayer film on the hard mask by using the composition for forming a silicon-containing resist underlayer film; forming a resist upper layer film on the resist underlayer film by using a composition for a resist upper layer film including a photoresist composition; forming a circuit pattern on the resist upper layer film; transferring the pattern to the resist underlayer film by etching using the resist upper layer film having the formed circuit pattern as a mask; transferring the pattern to the hard mask by dry etching using the resist underlayer film having the transferred pattern as a mask; and transferring the pattern to the body to be processed by dry etching using the hard mask having the transferred pattern as a mask.

When a pattern is formed using the silicon-containing resist underlayer film of the present invention, the combination with the organic underlayer film or the CVD film is optimized as described above, so that the pattern formed in the photoresist can be formed onto the substrate without changing the size during the transfer.

In a positive-type patterning process, after resist upper layer film formation and heat treatment, exposure and alkaline development with alkaline developer are carried out to obtain a positive-type resist pattern. In addition, it is preferable to perform post exposure bake (PEB) after the exposure. As the alkaline developer, tetramethylammonium hydroxide (TMAH) can be used, for example.

The formation of the pattern on the resist upper layer film is preferably performed by a photolithography with a wavelength of 10 nm or more and 300 nm or less, direct lithography with electron beam, nanoimprinting, or a combination thereof.

The body to be processed is preferably a substrate for a semiconductor device, a metal film, a metal carbide film, a metal oxide film, a metal nitride film, a metal oxycarbide film, or a metal oxynitride film.

A metal of the body to be processed is preferably silicon, gallium, titanium, tungsten, hafnium, zirconium, chromium, germanium, copper, silver, gold, indium, arsenic, palladium, tantalum, iridium, aluminum, iron, molybdenum, cobalt, or an alloy thereof.

Examples of the photoresist composition include a resin shown by the following formula:

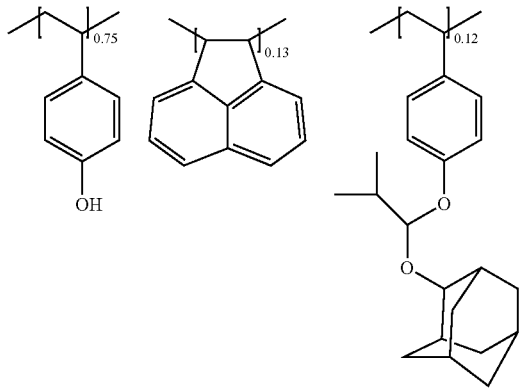

and a solution of an acid generator, shown by the following formula, in a propylene glycol methyl ether acetate (PGMEA):

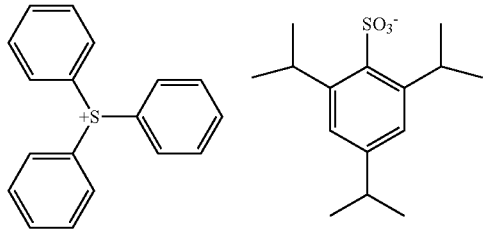

After applying the solution to the resist underlayer film, PGMEA is removed by heating to prepare a substrate on which a resist upper layer film with a film thickness of 40 nm is formed, the substrate is irradiated with a KrF excimer laser to decompose an acid generator, and thus, acid is generated, the substrate is treated at 150° C., the resin is made soluble in aqueous alkaline solution by the action of the acid in the resist upper layer film, and alkaline development is carried out using an alkaline developer, and thus, a positive-type resist pattern can be obtained. Should be noted that, in this event, the curing catalyst (Xc) contained in the inventive composition for forming a silicon-containing resist underlayer film has a distance of diffusion to the resist upper layer film of 5 nm or less, and therefore, the generated acid is neutralized by the curing catalyst (Xc), and the film thickness of the film of resin remaining on the resist underlayer film is 5 nm or less.

EXAMPLE

Hereinafter, the present invention will be specifically described with reference to Examples and Comparative Examples. However, the present invention is not limited to these descriptions. Should be noted that, in the following examples, % means mass %, and the molecular weight measurement was carried out by GPC.

Synthesis Example 1

To a mixture containing 120 g of methanol, 0.1 g of 10% nitric acid, and 60 g of deionized water, a mixture containing 30.6 g of Compound (101), 38.1 g of Compound (102), and 5.9 g of Compound (110) was added and maintained at 40° C. for 12 hours to perform hydrolysis condensation. After completion of the reaction, 600 g of propylene glycol monoethyl ether (PGEE) was added thereto. Then, the water used for the hydrolysis condensation and by-produced alcohol were distilled off under reduced pressure. Thus, 440 g of a solution of Polysiloxane Compound 1 in PGEE was obtained (compound concentration: 10%). The molecular weight thereof was measured in terms of polystyrene and found Mw=2,900.

Synthesis Examples 2 to 22 were carried out under the same conditions as in Synthesis Example 1 by using monomers shown in Table 1 to obtain the target products.

TABLE 1

| Synthesis Example | Raw materials for reaction | Mw |
|---|---|---|
| 1 | Compound (101): 30.6 g, Compound (102): 38.1 g, Compound (110): 5.9 g | 2900 |
| 2 | Compound (101): 30.6 g, Compound (102): 38.1 g, Compound (111): 6.4 g | 2300 |
| 3 | Compound (101): 30.6 g, Compound (102): 38.1 g, Compound (112): 7.0 g | 2900 |
| 4 | Compound (101): 30.6 g, Compound (102): 38.1 g, Compound (113): 6.6 g | 2900 |
| 5 | Compound (101): 30.6 g, Compound (102): 38.1 g, Compound (114): 7.3 g | 2100 |
| 6 | Compound (101): 30.6 g, Compound (102): 38.1 g, Compound (115): 6.2 g | 2700 |
| 7 | Compound (101): 30.6 g, Compound (102): 38.1 g, Compound (116): 5.1 g | 2000 |
| 8 | Compound (101): 30.6 g, Compound (102): 38.1 g, Compound (117): 6.8 g | 2300 |
| 9 | Compound (101): 30.6 g, Compound (102): 38.1 g, Compound (118): 8.9 g | 2600 |
| 10 | Compound (101): 30.6 g, Compound (102): 38.1 g, Compound (119): 8.0 g | 2300 |
| 11 | Compound (100): 5.0 g, Compound (101): 30.6 g, Compound (102): 38.1 g | 2500 |
| 12 | Compound (101): 13.6 g, Compound (102): 53.3 g, Compound (110): 11.8 g | 2100 |

TABLE 1-continued

| Synthesis Example | Raw materials for reaction | Mw |
|---|---|---|
| 13 | Compound (101): 13.6 g, Compound (102): 53.3 g, Compound (111): 12.7 g | 2800 |
| 14 | Compound (101): 13.6 g, Compound (102): 53.3 g, Compound (112): 13.9 g | 2500 |
| 15 | Compound (101): 13.6 g, Compound (102): 53.3 g, Compound (113): 13.2 g | 2400 |
| 16 | Compound (101): 13.6 g, Compound (102): 53.3 g, Compound (114): 14.5 g | 2600 |
| 17 | Compound (101): 13.6 g, Compound (102): 53.3 g, Compound (115): 12.3 g | 2300 |
| 18 | Compound (101): 13.6 g, Compound (102): 53.3 g, Compound (116): 10.2 g | 2600 |
| 19 | Compound (101): 13.6 g, Compound (102): 53.3 g, Compound (117): 13.5 g | 2500 |
| 20 | Compound (101): 13.6 g, Compound (102): 53.3 g, Compound (118): 17.7 g | 2700 |
| 21 | Compound (101): 13.6 g, Compound (102): 53.3 g, Compound (119): 16.0 g | 3000 |
| 22 | Compound (100): 5.0 g, Compound (101): 17.0 g, Compound (102): 53.3 g | 2800 |

PhSi (OCH$_3$)$_3$ • • • Compound (100)
CH$_3$Si (OCH$_3$)$_3$ • • • Compound (101)
Si (OCH$_3$) • • • Compound (102)

Compound (110)

Compound (111)

Compound (112)

Compound (113)

Compound (114)

Compound (115)

Compound (116)

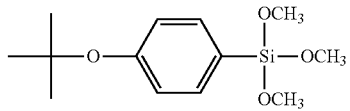

Compound (117)

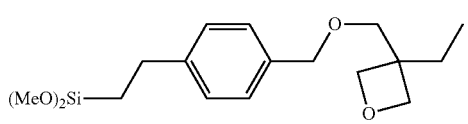

Compound (118)

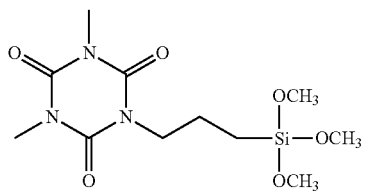

Compound (119)

Compositions of a silicon-containing film containing the compounds shown in Table 1 are shown in Table 2 below.

TABLE 2

| Thermosetting silicon-containing material No. | Polysiloxane (parts by mass) | Curing catalyst (parts by mass) | Acid (parts by mass) | Solvent (parts by mass) | Water (parts by mass) |
|---|---|---|---|---|---|
| Soln. 1 | Synthesis Example 1 (1) | QBA-NO3 (0.05) | maleic acid (0.01) | PGEE (90) | water (10) |
| Soln. 2 | Synthesis Example 2 (1) | QBA-NO3 (0.05) | maleic acid (0.01) | PGEE (90) | water (10) |
| Soln. 3 | Synthesis Example 3 (1) | QBA-NO3 (0.05) | maleic acid (0.01) | PGEE (90) | water (10) |
| Soln. 4 | Synthesis Example 4 (1) | QBA-NO3 (0.05) | maleic acid (0.01) | PGEE (90) | water (10) |
| Soln. 5 | Synthesis Example 5 (1) | QBA-NO3 (0.05) | maleic acid (0.01) | PGEE (90) | water (10) |
| Soln. 6 | Synthesis Example 6 (1) | QBA-NO3 (0.05) | maleic acid (0.01) | PGEE (90) | water (10) |
| Soln. 7 | Synthesis Example 7 (1) | QBA-NO3 (0.05) | maleic acid (0.01) | PGEE (90) | water (10) |
| Soln. 8 | Synthesis Example 8 (1) | QBA-NO3 (0.05) | maleic acid (0.01) | PGEE (90) | water (10) |
| Soln. 9 | Synthesis Example 9 (1) | QBA-NO3 (0.05) | maleic acid (0.01) | PGEE (90) | water (10) |
| Soln. 10 | Synthesis Example 10 (1) | QBA-NO3 (0.05) | maleic acid (0.01) | PGEE (90) | water (10) |
| Soln. 11 | Synthesis Example 11 (1) | QBA-NO3 (0.05) | maleic acid (0.01) | PGEE (90) | water (10) |
| Soln. 12 | Synthesis Example 12 (1) | QBA-NO3 (0.05) | maleic acid (0.01) | PGEE (90) | water (10) |
| Soln. 13 | Synthesis Example 13 (1) | QBA-NO3 (0.05) | maleic acid (0.01) | PGEE (90) | water (10) |
| Soln. 14 | Synthesis Example 14 (1) | QBA-NO3 (0.05) | maleic acid (0.01) | PGEE (90) | water (10) |
| Soln. 15 | Synthesis Example 15 (1) | QBA-NO3 (0.05) | maleic acid (0.01) | PGEE (90) | water (10) |
| Soln. 16 | Synthesis Example 16 (1) | QBA-NO3 (0.05) | maleic acid (0.01) | PGEE (90) | water (10) |
| Soln. 17 | Synthesis Example 17 (1) | QBA-NO3 (0.05) | maleic acid (0.01) | PGEE (90) | water (10) |
| Soln. 18 | Synthesis Example 18 (1) | QBA-NO3 (0.05) | maleic acid (0.01) | PGEE (90) | water (10) |
| Soln. 19 | Synthesis Example 19 (1) | QBA-NO3 (0.05) | maleic acid (0.01) | PGEE (90) | water (10) |
| Soln. 20 | Synthesis Example 20 (1) | QBA-NO3 (0.05) | maleic acid (0.01) | PGEE (90) | water (10) |
| Soln. 21 | Synthesis Example 21 (1) | QBA-NO3 (0.05) | maleic acid (0.01) | PGEE (90) | water (10) |
| Soln. 22 | Synthesis Example 22 (1) | QBA-NO3 (0.05) | maleic acid (0.01) | PGEE (90) | water (10) |

TABLE 2-continued

| Thermo-setting silicon-containing material No. | Polysiloxane (parts by mass) | Curing catalyst (parts by mass) | Acid (parts by mass) | Solvent (parts by mass) | Water (parts by mass) |
|---|---|---|---|---|---|
| Soln. 23 | Synthesis Example 1 (1) | QBA-TFA (0.05) | maleic acid (0.01) | PGEE (90) | water (10) |
| Soln. 24 | Synthesis Example 1 (1) | QPA-NO3 (0.05) | maleic acid (0.01) | PGEE (90) | water (10) |
| Soln. 25 | Synthesis Example 1 (1) | TPS-NO3 (0.05) | maleic acid (0.01) | PGEE (90) | water (10) |
| Soln. 26 | Synthesis Example 1 (1) | tBu3O-NO3 (0.05) | maleic acid (0.01) | PGEE (90) | water (10) |
| Soln. 27 | Synthesis Example 1 (1) | TPP-NO3 (0.05) | maleic acid (0.01) | PGEE (90) | water (10) |
| Soln. 28 | Synthesis Example 1 (1) | DPI-NO3 (0.05) | maleic acid (0.01) | PGEE (90) | water (10) |
| Soln. 29 | Synthesis Example 1 (1) | QMA-TFA (0.05) | maleic acid (0.01) | PGEE (90) | water (10) |
| Soln. 30 | Synthesis Example 1 (1) | QMA-NO3 (0.05) | maleic acid (0.01) | PGEE (90) | water (10) |
| Soln. 31 | Synthesis Example 1 (1) | QEA-NO3 (0.05) | maleic acid (0.01) | PGEE (90) | water (10) |

[Curing Catalyst]
QBA-NO3 tetrabutylammonium nitrate
QBA-TFA tetrabutylammonium trifluoroacetate
QPA-NO3 tetrapropylammonium nitrate
TPS-NO3 triphenylsulfonium nitrate
tBu3O-NO3 t-butyltriphenylsulfonium nitrate
TPP-NO3 tetraphenylphosphonium nitrate
DPI-NO3 diphenyliodonium nitrate
QMA-TFA tetramethylammonium trifluoroacetate
QMA-NO3 tetramethylammonium nitrate
QEA-NO3 tetraethylammonium nitrate

[Solvent]
PGEE propylene glycol monoethyl ether
PGMEA propylene glycol monomethyl ether acetate Table 3 shows the compositions of a resin (A) whose solubility in alkaline developer is increased by the action of an acid, and a solution (C-1) including a solvent and an acid generator which generates acid by a high energy beam or an electron beam.

TABLE 3

| Polymer (parts by mass) | Acid generator (parts by mass) | Solvent 1 (parts by mass) | Solvent 2 (parts by mass) |
|---|---|---|---|
| Resin (A) (80.0) | PAG1 (0.53) | PGMEA (2,930) | Ethyl Lactate (1,450) |

The structural formula of the resin (A) shown in Table 3 above is shown below.

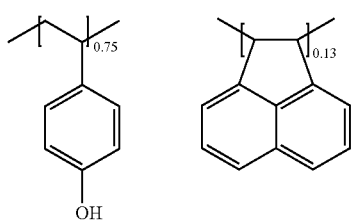

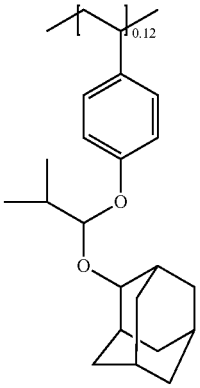

The structural formula of the acid generator PAG1 shown in Table 3 above is shown below.

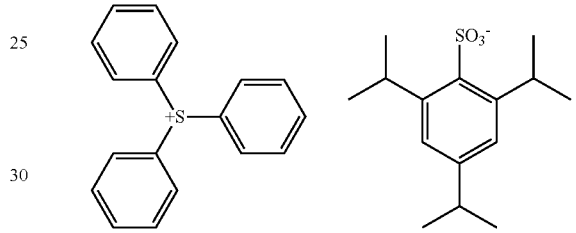

[Measurement of Distance of Diffusion (Measuring Method-1)]

Each of the compositions Solns. 1 to 31 for forming a silicon-containing resist underlayer film shown in Table 2 was applied onto a substrate and heated at 220° C. for 60 seconds to form each of polysiloxane film layers: Films 1 to 31 with a film thickness of 20 nm.

Subsequently, a prepared resin (A) and a solution (C-1) containing an acid generator and a solvent were applied onto the polysiloxane film and baked at 100° C. for 60 seconds to form a resist upper layer film which is a resin layer with a film thickness of 40 nm.

Next, these were subjected to open-frame exposure with an initial dosage of 3 mJ, the number of steps as 0.75 mJ using the KrF exposure apparatus (NSR-206D, manufactured by Nikon Corporation; NA: 0.82), and after heat-treating at 150° C. for 60 seconds, were baked (PEB) at 70° C. for 60 seconds, and developed in an aqueous solution (developer) with 2.38 mass % tetramethylammonium hydroxide (TMAH) for 30 seconds.

Next, the film thickness of the resin that was not dissolved in the developer and remained on the silicon-containing resist underlayer film was measured by an optical interference type film thickness measuring apparatus (VM-2200 manufactured by SCREEN Holdings Co., Ltd). The obtained film thickness was set as the distance of diffusion of the curing catalyst diffused from the resist underlayer film.

The film thickness of the remaining resin (distance of diffusion of the curing catalyst) calculated by the Measuring Method-1 is shown in Table 4 below.

TABLE 4

|  | Silicon-containing resist film | Film thickness of remaining resin (nm) |
|---|---|---|
| Example 1 | Film 1 | 3.6 |
| Example 2 | Film 2 | 3.5 |
| Example 3 | Film 3 | 3.6 |
| Example 4 | Film 4 | 3.6 |
| Example 5 | Film 5 | 3.6 |
| Example 6 | Film 6 | 3.5 |
| Example 7 | Film 7 | 3.5 |
| Example 8 | Film 8 | 3.6 |
| Example 9 | Film 9 | 3.6 |
| Example 10 | Film 10 | 3.5 |
| Example 11 | Film 11 | 3.3 |
| Example 12 | Film 12 | 3.6 |
| Example 13 | Film 13 | 3.5 |
| Example 14 | Film 14 | 3.6 |
| Example 15 | Film 15 | 3.6 |
| Example 16 | Film 16 | 3.4 |
| Example 17 | Film 17 | 3.4 |
| Example 18 | Film 18 | 3.5 |
| Example 19 | Film 19 | 3.6 |
| Example 20 | Film 20 | 3.6 |
| Example 21 | Film 21 | 3.6 |
| Example 22 | Film 22 | 3.6 |
| Example 23 | Film 23 | 3.3 |
| Example 24 | Film 24 | 2.7 |
| Example 25 | Film 25 | 1.4 |
| Example 26 | Film 26 | 1.5 |
| Example 27 | Film 27 | 1.4 |
| Example 28 | Film 28 | 1.5 |
| Comparative Example 1 | Film 29 | 12.1 |
| Comparative Example 2 | Film 30 | 11.7 |
| Comparative Example 3 | Film 31 | 7.5 |

As shown in Table 4, it has been made clear that the distance of diffusion of the curing catalyst contained in the composition for forming a silicon-containing resist underlayer film of each of Examples 1 to 28 from the resist underlayer film to the resist upper layer film was 5 nm or less. On the other hand, the distance of diffusion of the curing catalyst contained in the composition for forming a silicon-containing resist underlayer film of Comparative Examples 1 to 3 from the resist underlayer film to the resist upper layer film was 5 nm or more.

[EUV Patterning Test]

On a silicon wafer, the Si substrate was spin-coated with each of the compositions Solns. 1 to 31 for forming a silicon-containing resist underlayer film shown in Table 2 and heated at 220° C. for 60 seconds to prepare each of silicon-containing films: Films 1 to 31 with a film thickness of 20 nm.

Subsequently, the silicon-containing resist underlayer film was spin-coated with a resist material in which the following resin, quencher and sensitizer were dissolved at ratios shown in Table 5 in an organic solvent including PGMEA, cyclohexanone (CyHO) and PGME, and prebaked at 105° C. for 60 seconds using a hot plate to prepare a resist upper layer film having a film thickness of 60 nm. The resultant was exposed using an EUV scanner NXE3300 (manufactured by ASML, NA: 0.33, σ: 0.9/0.6, quadrupole illumination, with a mask having a hole pattern with a pitch of 46 nm and +20% bias (on-wafer size)), followed by PEB at 100° C. for 60 seconds on the hot plate and development with a 2.38 mass % TMAH aqueous solution for 30 seconds. Thus, a hole pattern with a dimension of 23 nm was obtained.

Using the critical dimension SEM (CG5000) manufactured by Hitachi High-Technologies Corporation, the dimensions of 50 holes at which a hole dimension of 23 nm was formed were measured, from which the dimensional variation (CDU, 3σ) was found. The results are shown in Table 6.

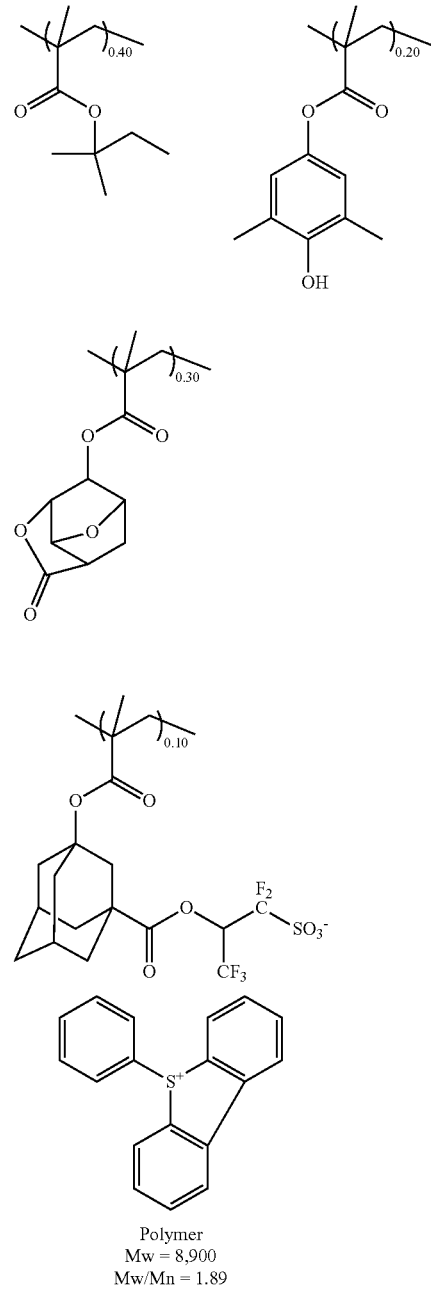

Polymer
Mw = 8,900
Mw/Mn = 1.89

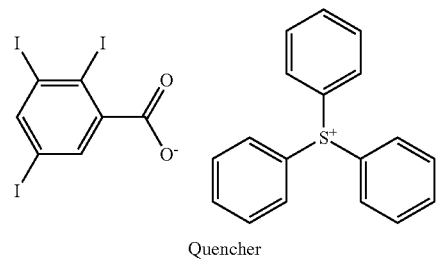

Quencher

-continued

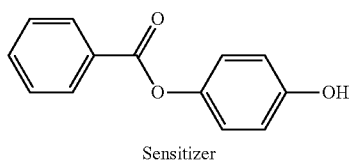

Sensitizer

Surfactant: FC-4430 manufactured by 3M Company

TABLE 5

|  | Polymer | Quencher | Sensitizer | Surfactant | Organic solvent |
|---|---|---|---|---|---|
| Composition (parts by mass) | (100) | (4.0) | (2.1) | (0.25) | PGMEA (400) CyHO (2000) PGME (100) |

TABLE 6

|  | Silicon-containing resist film | CDU (nm) |
|---|---|---|
| Example 29 | Film 1 | 2.4 |
| Example 30 | Film 2 | 2.4 |
| Example 31 | Film 3 | 2.3 |
| Example 32 | Film 4 | 2.3 |
| Example 33 | Film 5 | 2.4 |
| Example 34 | Film 6 | 2.3 |
| Example 35 | Film 7 | 2.3 |
| Example 36 | Film 8 | 2.4 |
| Example 37 | Film 9 | 2.4 |
| Example 38 | Film 10 | 2.3 |
| Example 39 | Film 11 | 2.3 |
| Example 40 | Film 12 | 2.3 |
| Example 41 | Film 13 | 2.3 |
| Example 42 | Film 14 | 2.4 |
| Example 43 | Film 15 | 2.3 |
| Example 44 | Film 16 | 2.3 |
| Example 45 | Film 17 | 2.3 |
| Example 46 | Film 18 | 2.3 |
| Example 47 | Film 19 | 2.3 |
| Example 48 | Film 20 | 2.4 |
| Example 49 | Film 21 | 2.3 |
| Example 50 | Film 22 | 2.3 |
| Example 51 | Film 23 | 2.3 |
| Example 52 | Film 24 | 2.3 |
| Example 53 | Film 25 | 2.3 |
| Example 54 | Film 26 | 2.4 |
| Example 55 | Film 27 | 2.3 |
| Example 56 | Film 28 | 2.3 |
| Comparative Example 4 | Film 29 | 3.1 |
| Comparative Example 5 | Film 30 | 3.0 |
| Comparative Example 6 | Film 31 | 3.1 |

As shown in Comparative Examples 4 to 6 in Table 6, the curing catalyst which has a distance of diffusion longer than 5 nm (the organic group constituting the cation moiety of the curing catalyst contained in the resist underlayer film has 8 or fewer carbon atoms) was diffused to the upper layer resist non-uniformly since the distance of diffusion was long, and caused degradation of CDU. On the other hand, it was found that the composition for forming a silicon-containing underlayer resist film to which the curing catalyst with a distance of diffusion of 5 nm or less in Examples 29 to 56 was applied showed favorable CDU.

[ArF Patterning Test]

On a silicon wafer, a spin-on carbon film ODL-102 (carbon content: 89 mass %) manufactured by Shin-Etsu Chemical CO., Ltd. was formed to have a film thickness of 200 nm. The spin-on carbon film was coated with one of the compositions Solns. 1 to 31 for forming a silicon-containing resist underlayer film thereon and heated at 220° C. for 60 seconds to form polysiloxane films: Films 1 to 31 with a film thickness of 20 nm.

Subsequently, the resist underlayer film was coated with an ArF resist solution (PR-1) for positive development containing the following ArF resist polymer 1, acid generator, quencher and surfactant in the composition shown in Table 7, and baked at 110° C. for 60 seconds to form a resist upper layer with a film thickness of 100 nm.

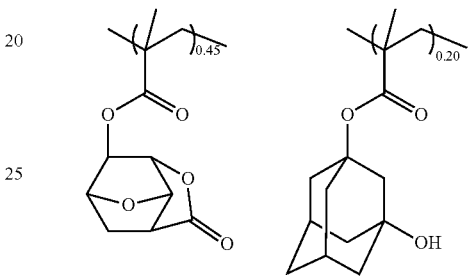

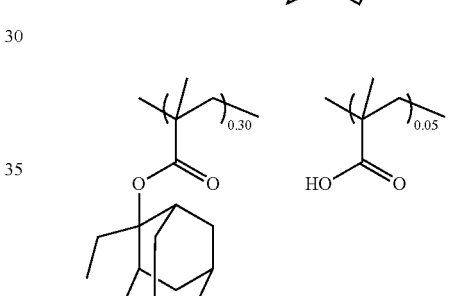

ArF resist polymer 1
Mw = 7,800
Mw/Mn = 1.78

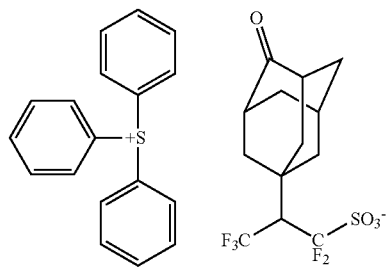

Acid generator: PGA-A

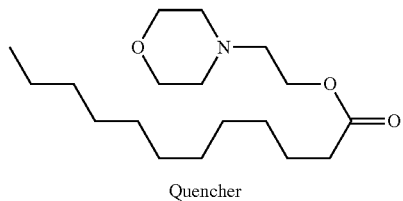

Quencher

Surfactant: FC-4430 manufactured by 3M Company

TABLE 7

|  | Polymer (parts by mass) | Acid generator (parts by mass) | Base (parts by mass) | Surfactant (parts by mass) | Solvent (parts by mass) |
|---|---|---|---|---|---|
| Composition | ArF resist polymer 1 (100) | PAG-A (7.0) | Quencher (1.0) | FC-4430 (0.2) | PGMEA (2,500) |

Further, the resist upper layer film was coated with a liquid immersion top coat (TC-1) having the composition shown in Table 8 containing the following top coat polymer, and baked at 90° C. for 60 seconds to form a top coat with a film thickness of 50 nm.

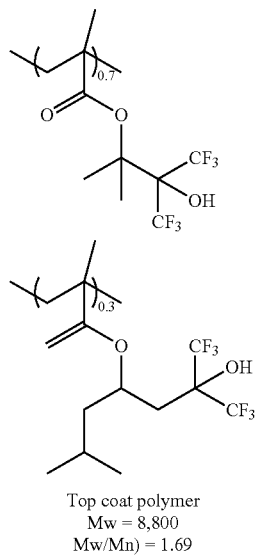

Top coat polymer
Mw = 8,800
Mw/Mn = 1.69

TABLE 8

| Polymer (parts by mass) | Organic solvent (parts by mass) |
|---|---|
| Top coat polymer (100) | diisoamyl ether (2700) 2-methyl-1-butanol (270) |

Next, these were exposed by using an ArF liquid immersion exposure apparatus (manufactured by ASML; XT-1900i, NA: 1.35, σ: 0.97/0.77, 35° polarized dipole illumination), followed by baking (PEB) at 100° C. for 60 seconds, and development with a 2.38 mass % tetramethylammonium hydroxide (TMAH) aqueous solution for 30 seconds. In this way, 40-nm 1:1 positive-type line-and-space patterns were obtained. Each dimension was observed with an electron microscope (CG5000) manufactured by Hitachi High-Technologies Corporation to check LWR, and the sectional profile was observed with an electron microscope (S-9380) manufactured by Hitachi, Ltd. The results are shown in Table 9.

TABLE 9

|  | Silicon-containing resist film | Pattern sectional profile after development | LWR (nm) |
|---|---|---|---|
| Example 57 | Film 1 | vertical profile | 2.4 |
| Example 58 | Film 2 | vertical profile | 2.4 |
| Example 59 | Film 3 | vertical profile | 2.3 |
| Example 60 | Film 4 | vertical profile | 2.3 |
| Example 61 | Film 5 | vertical profile | 2.4 |
| Example 62 | Film 6 | vertical profile | 2.3 |
| Example 63 | Film 7 | vertical profile | 2.3 |
| Example 64 | Film 8 | vertical profile | 2.4 |
| Example 65 | Film 9 | vertical profile | 2.4 |
| Example 66 | Film 10 | vertical profile | 2.3 |
| Example 67 | Film 11 | vertical profile | 2.3 |
| Example 68 | Film 12 | vertical profile | 2.3 |
| Example 69 | Film 13 | vertical profile | 2.3 |
| Example 70 | Film 14 | vertical profile | 2.4 |
| Example 71 | Film 15 | vertical profile | 2.3 |
| Example 72 | Film 16 | vertical profile | 2.3 |
| Example 73 | Film 17 | vertical profile | 2.3 |
| Example 74 | Film 18 | vertical profile | 2.3 |
| Example 75 | Film 19 | vertical profile | 2.3 |
| Example 76 | Film 20 | vertical profile | 2.4 |
| Example 77 | Film 21 | vertical profile | 2.3 |
| Example 78 | Film 22 | vertical profile | 2.3 |
| Example 79 | Film 23 | vertical profile | 2.3 |
| Example 80 | Film 24 | vertical profile | 2.3 |
| Example 81 | Film 25 | vertical profile | 2.2 |
| Example 82 | Film 26 | vertical profile | 2.2 |
| Example 83 | Film 27 | vertical profile | 2.2 |
| Example 84 | Film 28 | vertical profile | 2.2 |
| Comparative Example 7 | Film 29 | trailing profile | 2.7 |
| Comparative Example 8 | Film 30 | trailing profile | 2.8 |
| Comparative Example 9 | Film 31 | trailing profile | 2.8 |

As shown in Comparative Examples 7 to 9 in Table 9, the curing catalyst which has a distance of diffusion longer than 5 nm was diffused to the upper layer resist non-uniformly since the distance of the diffusion was long, and caused degradation of LWR. On the other hand, it was found that the composition for forming a silicon-containing underlayer resist film to which the curing catalyst with a distance of diffusion of 5 nm or less in Examples 57 to 84 was applied showed favorable LWR.

As described above, the curing catalyst (Xc) having a short distance of diffusion contained in the silicon-containing resist underlayer film of the present invention is capable of suppressing diffusion to the resist upper layer film, and this makes it possible to select a curing catalyst (Xc) that does not affect LWR and CDU in EUV lithography and a composition for forming a silicon-containing resist underlayer film containing such a curing catalyst (Xc).

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:
1. A composition for forming a silicon-containing resist underlayer film, the composition comprising:
 a thermosetting silicon-containing material (Sx),
 a curing catalyst (Xc) selected from the group consisting of:
  a sulfonium salt (Xc-1) that is t-butyltriphenylsulfonium nitrate,
  an iodonium salt (Xc-2),
  a phosphonium salt (Xc-3), an ammonium salt (Xc-4) selected from tetrabutylammonium trifluoroacetate and tetrapropylammonium nitrate,
a polysiloxane (Xc-10) having a structure containing one of the salts (Xc-1), (Xc-2), (Xc-3), or (Xc-4) as a part, and
an alkaline metal salt, and
a solvent,
wherein a distance of diffusion of the curing catalyst (Xc) from a resist underlayer film formed from the composition for forming a silicon-containing resist underlayer film to a resist upper layer film to be formed on the resist underlayer film is 5 nm or less.

2. The composition for forming a silicon-containing resist underlayer film according to claim 1, wherein a total number of carbon atoms comprised in an organic group forming a cation moiety of the curing catalyst (Xc) is 9 or more.

3. A patterning process comprising the steps of:
forming an organic film by using a coating-type organic film material on a body to be processed;
forming a resist underlayer film on the organic film by using the composition for forming a silicon-containing resist underlayer film according to claim 1;
forming a resist upper layer film on the resist underlayer film by using a composition for a resist upper layer film comprising a photoresist composition;
forming a circuit pattern on the resist upper layer film;
transferring the pattern to the resist underlayer film by etching using the resist upper layer film having the formed circuit pattern as a mask;
transferring the pattern to the organic film by etching using the resist underlayer film having the transferred pattern as a mask; and
transferring the pattern to the body to be processed by etching using the organic film having the transferred pattern as a mask.

4. The patterning process according to claim 3, wherein the formation of the pattern on the resist upper layer film is performed by a photolithography with a wavelength of 10 nm or more and 300 nm or less, direct lithography with electron beam, nanoimprinting, or a combination thereof.

5. The patterning process according to claim 3, wherein the body to be processed is a substrate for a semiconductor device, a metal film, a metal carbide film, a metal oxide film, a metal nitride film, a metal oxycarbide film, or a metal oxynitride film.

6. The patterning process according to claim 3, wherein a metal of the body to be processed is silicon, gallium, titanium, tungsten, hafnium, zirconium, chromium, germanium, copper, silver, gold, indium, arsenic, palladium, tantalum, iridium, aluminum, iron, molybdenum, cobalt, or an alloy thereof.

7. A patterning process comprising the steps of:
forming an organic film by using a coating-type organic film material on a body to be processed;
forming a resist underlayer film on the organic film by using the composition for forming a silicon-containing resist underlayer film according to claim 2;
forming a resist upper layer film on the resist underlayer film by using a composition for a resist upper layer film comprising a photoresist composition;
forming a circuit pattern on the resist upper layer film;
transferring the pattern to the resist underlayer film by etching using the resist upper layer film having the formed circuit pattern as a mask;
transferring the pattern to the organic film by etching using the resist underlayer film having the transferred pattern as a mask; and
transferring the pattern to the body to be processed by etching using the organic film having the transferred pattern as a mask.

8. A patterning process comprising the steps of:
forming a hard mask comprising carbon as a main component by a CVD method on a body to be processed;
forming a resist underlayer film on the hard mask by using the composition for forming a silicon-containing resist underlayer film according to claim 1;
forming a resist upper layer film on the resist underlayer film by using a composition for a resist upper layer film comprising a photoresist composition;
forming a circuit pattern on the resist upper layer film;
transferring the pattern to the resist underlayer film by etching using the resist upper layer film having the formed circuit pattern as a mask;
transferring the pattern to the hard mask by dry etching using the resist underlayer film having the transferred pattern as a mask; and
transferring the pattern to the body to be processed by dry etching using the hard mask having the transferred pattern as a mask.

9. The patterning process according to claim 8, wherein the formation of the pattern on the resist upper layer film is performed by a photolithography with a wavelength of 10 nm or more and 300 nm or less, direct lithography with electron beam, nanoimprinting, or a combination thereof.

10. The patterning process according to claim 8, wherein the body to be processed is a substrate for a semiconductor device, a metal film, a metal carbide film, a metal oxide film, a metal nitride film, a metal oxycarbide film, or a metal oxynitride film.

11. The patterning process according to claim 8, wherein a metal of the body to be processed is silicon, gallium, titanium, tungsten, hafnium, zirconium, chromium, germanium, copper, silver, gold, indium, arsenic, palladium, tantalum, iridium, aluminum, iron, molybdenum, cobalt, or an alloy thereof.

12. A patterning process comprising the steps of:
forming a hard mask comprising carbon as a main component by a CVD method on a body to be processed;
forming a resist underlayer film on the hard mask by using the composition for forming a silicon-containing resist underlayer film according to claim 2;
forming a resist upper layer film on the resist underlayer film by using a composition for a resist upper layer film comprising a photoresist composition;
forming a circuit pattern on the resist upper layer film;
transferring the pattern to the resist underlayer film by etching using the resist upper layer film having the formed circuit pattern as a mask;
transferring the pattern to the hard mask by dry etching using the resist underlayer film having the transferred pattern as a mask; and
transferring the pattern to the body to be processed by dry etching using the hard mask having the transferred pattern as a mask.

* * * * *